(12) United States Patent
Ichikawa et al.

(10) Patent No.: US 8,916,330 B2
(45) Date of Patent: Dec. 23, 2014

(54) CHEMICALLY AMPLIFIED PHOTORESIST COMPOSITION AND METHOD FOR FORMING RESIST PATTERN

(75) Inventors: Koji Ichikawa, Toyonaka (JP); Takashi Hiraoka, Hannan (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 545 days.

(21) Appl. No.: 12/821,850

(22) Filed: Jun. 23, 2010

(65) Prior Publication Data

US 2010/0330497 A1    Dec. 30, 2010

(30) Foreign Application Priority Data

Jun. 24, 2009 (JP) ................. 2009-150360

(51) Int. Cl.
| | | |
|---|---|---|
| G03F 7/004 | (2006.01) | |
| G03F 7/40 | (2006.01) | |
| C07C 321/00 | (2006.01) | |
| C07D 407/00 | (2006.01) | |

(52) U.S. Cl.
USPC ........ 430/270.1; 430/913; 430/325; 430/326; 430/330; 430/331; 560/17; 560/149; 549/266; 549/269; 549/271; 549/300; 549/322; 549/459; 524/111; 524/113

(58) Field of Classification Search
USPC ............. 430/270.1, 281.1, 286.1, 288.1, 325, 430/326; 560/17, 149; 549/266, 269, 271, 549/300, 322, 459; 524/111, 113
See application file for complete search history.

(56) References Cited

U.S. PATENT DOCUMENTS

| | | | |
|---|---|---|---|
| 7,491,485 B2 | 2/2009 | Takeshita et al. | |
| 7,504,194 B2 | 3/2009 | Fukuhara et al. | |
| 7,592,123 B2 | 9/2009 | Hada et al. | |
| 7,695,892 B2 | 4/2010 | Kamimura et al. | |
| 7,790,351 B2 | 9/2010 | Fukuhara et al. | |
| 7,829,259 B2 | 11/2010 | Hada et al. | |
| 2006/0194982 A1 | 8/2006 | Harada et al. | |
| 2007/0065748 A1 | 3/2007 | Hada et al. | |
| 2007/0078269 A1* | 4/2007 | Harada et al. ............... | 549/266 |
| 2007/0134590 A1 | 6/2007 | Fukuhara et al. | |
| 2007/0172761 A1* | 7/2007 | Takahashi et al. ......... | 430/270.1 |
| 2007/0218401 A1* | 9/2007 | Ando et al. ................ | 430/270.1 |
| 2008/0063974 A1* | 3/2008 | Shimizu et al. ............ | 430/270.1 |
| 2008/0081293 A1* | 4/2008 | Harada et al. .............. | 430/287.1 |
| 2008/0081296 A1 | 4/2008 | Jung | |
| 2008/0241737 A1 | 10/2008 | Kamimura et al. | |
| 2008/0292988 A1 | 11/2008 | Takeshita et al. | |
| 2009/0068591 A1* | 3/2009 | Kawaue et al. ............. | 430/285.1 |
| 2009/0136870 A1 | 5/2009 | Fukuhara et al. | |
| 2009/0142700 A1* | 6/2009 | Hada et al. ................. | 430/286.1 |
| 2009/0214982 A1 | 8/2009 | Shimizu et al. | |
| 2010/0178609 A1 | 7/2010 | Dazai et al. | |
| 2010/0239981 A1 | 9/2010 | Ikeda et al. | |

FOREIGN PATENT DOCUMENTS

| | | |
|---|---|---|
| CN | 1841201 A | 10/2006 |
| CN | 1010211683 A | 8/2007 |
| CN | 101408728 A | 4/2009 |
| JP | 11-52575 A | 2/1999 |
| JP | 2005-105260 A | 4/2005 |
| JP | 2005-234119 A | 9/2005 |
| JP | 2005-250211 A | 9/2005 |
| JP | 2006-227608 A | 8/2006 |
| JP | 2006-257078 A | 9/2006 |
| JP | 2006-276851 A | 10/2006 |
| JP | 2006-349911 A | 12/2006 |
| JP | 2007-212797 A | 8/2007 |
| JP | 2007-279664 A | 10/2007 |
| JP | 2008-88077 A | 4/2008 |
| JP | 2008-262059 A | 10/2008 |
| JP | 2008-268484 A | 11/2008 |
| JP | 2008-268922 A | 11/2008 |
| JP | 2009-3160 A | 1/2009 |
| JP | 2009-75429 A | 4/2009 |
| JP | 2009-223300 A | 10/2009 |
| JP | 2010-164712 A | 7/2010 |
| JP | 2010-224522 A | 10/2010 |
| JP | 2010-254960 A | 11/2010 |

OTHER PUBLICATIONS

First Office Action for corresponding Chinese Patent Application No. 201010212624.1, dated Nov. 27, 2012.
Japanese Notice of Reasons for Refusal, dated Feb. 25, 2014, for Japanese Application No. 2010-132377 with an English translation.
The Office Action (including an English translation), dated Jul. 8, 2014, issued in the corresponding Taiwanese Patent Application No. 099120664.
The Office Action (including an English translation), dated Oct. 14, 2014, issued in the corresponding Japanese Patent Application No. 2010-132377.

* cited by examiner

*Primary Examiner* — Amanda C. Walke
(74) *Attorney, Agent, or Firm* — Birch, Stewart, Kolasch & Birch, LLP

(57) ABSTRACT

The present invention provides a resist composition giving a resist pattern excellent in CD uniformity and focus margin. A chemically amplified photoresist composition comprises a resin (A) and an acid generator (B), and the resin (A) contains, as a part or an entirety thereof, a copolymer (A1) which is obtained by polymerizing at least: a (meth)acrylic monomer (a1) having $C_{5-20}$ alicyclic hydrocarbon group which becomes soluble in an aqueous alkali solution by the action of an acid; a (meth)acrylic monomer (a2) having a hydroxy group-containing adamantyl group; and a (meth)acrylic monomer (a3) having a lactone ring, and the copolymer (A1) has a weight-average molecular weight of 2500 or more and 5000 or less, and a content of the copolymer (A1) is not less than 50 parts by mass with respect to 100 parts by mass of the resin (A).

11 Claims, No Drawings

CHEMICALLY AMPLIFIED PHOTORESIST COMPOSITION AND METHOD FOR FORMING RESIST PATTERN

FIELD OF THE INVENTION

The present invention relates to a chemically amplified photoresist composition (hereinafter, may be simply referred to as "resist composition") which is useful for forming a resist pattern for use in semiconductor microfabrication, production of a liquid crystal display, and a circuit substrate for a thermal head and the like, and other photofabrication processes. Further, the present invention relates to a method for forming a resist pattern by using the photoresist composition.

BACKGROUND ART

In semiconductor microfabrication, a resist pattern is formed by a method including: (1) a step of forming a resist film by coating a resist composition on a substrate, and removing a solvent therefrom; (2) a step of pre-baking the resist film; (3) a step of exposing the pre-baked resist film; (4) a step of subjecting the exposed resist film to post-exposure-baking; and (5) a step of developing, by using a liquid developer, the resist film having been subjected to the post-exposure-baking, to form a resist pattern. For example, in Examples of Japanese Laid-Open Patent Publication No. 2006-257078, a chemically amplified photoresist composition comprising a copolymer having a weight-average molecular weight of about 9,200 is described. Hereinafter, "weight-average molecular weight" may be simply referred to as "Mw".

SUMMARY OF THE INVENTION

The present invention relates to the followings:

[1] A chemically amplified photoresist composition comprises;
a resin (A), and an acid generator (B), wherein
the resin (A) contains a copolymer (A1) obtained by polymerizing at least:
a (meth)acrylic monomer (a1) having a $C_{5-20}$ alicyclic hydrocarbon group, which becomes soluble in an aqueous alkali solution by the action of an acid;
a (meth)acrylic monomer (a2) having a hydroxyl group-containing adamantyl group; and
a (meth)acrylic monomer (a3) having a lactone ring,
the copolymer (A1) has a weight-average molecular weight of 2,500 or more and 5,000 or less, and
a content of the copolymer (A1) is not less than 50 parts by mass with respect to 100 parts by mass of the resin (A).

[2] The chemically amplified photoresist composition according to [1], wherein the resin (A) contains the copolymer (A1) and an another polymer (A2), and the weight-average molecular weight of the another polymer (A2) is more than 5,000 and 20,000 or less.

[3] The chemically amplified photoresist composition according to [1] or [2], wherein the monomer (a1) is at least one selected from the group consisting of compounds represented by formulae (a1-1) and (a1-2):

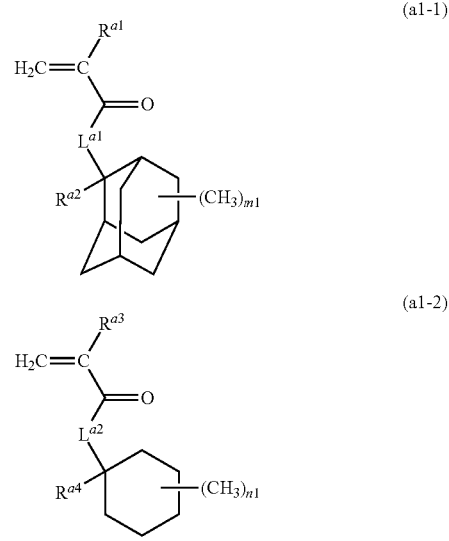

wherein, $L^{a1}$ and $L^{a2}$ each independently represent an oxygen atom (—O—), a carbonyl group (—CO—), a linear or branched $C_{1-17}$ alkanediyl group, or a combination thereof, $R^{a1}$ and $R^{a3}$ each independently represent a hydrogen atom or a methyl group, $R^{a2}$ and $R^{a4}$ each independently represent a linear or branched $C_{1-8}$ aliphatic hydrocarbon group, or a $C_{3-10}$ alicyclic hydrocarbon group, m1 represents an integer ranging from 0 to 14, and n1 represents an integer ranging from 0 to 10. When m1 or n1 is 0, it means that a methyl group, respectively, is absent.

[4] The chemically amplified photoresist composition according to [3], wherein the (meth)acrylic monomer (a1) is at least one selected from the group consisting of 2-methyl-2-adamantyl(meth)acrylate, 2-ethyl-2-adamantyl(meth)acrylate, 2-isopropyl-2-adamantyl(meth)acrylate, and 1-ethyl-1-cyclohexyl(meth)acrylate.

[5] The chemically amplified photoresist composition according to anyone of [1] to [4], wherein the (meth)acrylic monomer (a2) is at least one selected from the group consisting of 3-hydroxy-1-adamantyl(meth)acrylate and 3,5-dihydroxy-1-adamantyl(meth)acrylate.

[6] The chemically amplified photoresist composition according to anyone of [1] to [5], wherein the (meth)acrylic monomer (a3) is at least one selected from the group consisting of compounds represented by formulae (a3-1) and (a3-2):

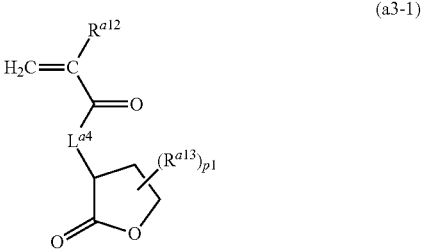

-continued

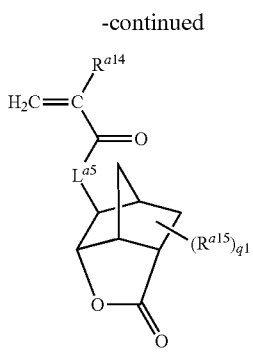
(a3-2)

wherein $L^{a4}$ and $L^{a5}$ each independently represent an oxygen atom (—O—), a carbonyl group (—CO—), a linear or branched $C_{1-17}$ alkanediyl group, or a combination thereof, $R^{a12}$ and $R^{a14}$ each independently represent a hydrogen atom or a methyl group, $R^{a13}$ each independently represents a $C_{1-4}$ aliphatic hydrocarbon group, p1 represents an integer ranging from 0 to 5, $R^{a15}$ each independently represents a carboxyl group, a cyano group, or a $C_{1-4}$ aliphatic hydrocarbon group, q1 represents an integer ranging from 0 to 3, and when p1 represents 0, it means that $R^{a13}$ is absent, and when q1 represents 0, it means that $R^{a15}$ is absent, and when p1 is 2 or more, a plurality of $R^{a13}$ is the same or different from each other, and when q1 is 2 or more, a plurality of $R^{a15}$ is the same or different from each other.

[7] The chemically amplified photoresist composition according to any one of [1] to [6], wherein the acid generator (B) is a salt represented by formula (B1):

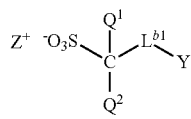
(B1)

wherein $Q^1$ and $Q^2$ each independently represent a fluorine atom or a $C_{1-6}$ perfluoroalkyl group, $L^{b1}$ represents a single bond, an oxygen atom (—O—), a carbonyl group (—CO—), a linear or branched $C_{1-17}$ alkanediyl group, or a combination of at least two selected from the group consisting of an oxygen atom, a carbonyl group, and a linear or branched $C_{1-17}$ alkanediyl group, Y represents a $C_{3-36}$ alicyclic hydrocarbon group having one or more substituent or not, or one or more methylene groups contained in the $C_{3-36}$ alicyclic hydrocarbon group can be replaced by an oxygen atom or a carbonyl group, and $Z^+$ represents an organic cation.

[8] The chemically amplified photoresist composition according to [7], wherein $Z^+$ is a arylsulfonium cation.

[9] The chemically amplified photoresist composition according to [7] or [8], wherein Y in the formula (B1) is an adamantyl group having a substituent or not, or an oxoadamantyl group having a substituent or not.

[10] The chemically amplified photoresist composition according to any one of [1] to [9], wherein a content of the acid generator (B) is 1 to 20 parts by mass with respect to 100 parts by mass of the resin (A).

[11] The chemically amplified photoresist composition according to any one of [1] to [10], wherein the photoresist composition may further comprise a nitrogen-containing basic compound (C).

[12] The chemically amplified photoresist composition according to any one of [1] to [11], wherein the nitrogen-containing basic compound (C) is diisopropylaniline.

[13] A method for producing a resist pattern, which comprises:

forming a resist film by applying the chemically amplified photoresist composition according to any one of [1] to [12] to a substrate;

pre-baking the resist film;

exposing the pre-baked resist film;

subjecting the exposed resist film to a post-exposure-baking; and developing the resist film having been subjected to the post-exposure-baking to form a resist pattern, by using an alkaline developer.

[14] The method for producing a resist pattern according to [13], the exposure is performed through a mask for forming a contact hole.

"Becoming soluble in an aqueous alkali solution by the action of an acid" means "being insoluble or poorly soluble in an aqueous alkali solution before contact with an acid, but becoming soluble in an aqueous alkali solution after contact with the acid".

Hereinafter, the above-described three monomers may be simply referred to as "a monomer (a1)", "a monomer (a2)" and "a monomer (a3)", respectively. In the description of the present invention, a "(meth)acrylic monomer" is a generic term for monomers having a structure of "$CH_2$=CH—CO—" or "$CH_2$=$C(CH_3)$—CO—". Similarly, "(meth)acrylate" is a generic term for "acrylates and methacrylates", and "(meth)acrylic acid" is a generic term for "acrylic acids and methacrylic acids".

In the following description, for example, the compound represented by formula (a1-1) may be simply referred to as a "compound (a1-1)" or a "monomer (a1-1)". A compound represented by another chemical formula may be abbreviated in a similar manner. Further, in the description of the present invention, a compound represented by a chemical formula includes a stereoisomer thereof.

In the description of the present invention, "$C_{x-y}$" indicates that the number of carbon atoms may be any number ranging from x to y.

The use of the photoresist composition of the present invention enables to give a resist pattern having an excellent CDU (Critical Dimension Uniformity) and focus margin.

DETAILED DESCRIPTION OF THE PRESENT INVENTION

A photoresist composition of the present invention comprises a resin (A) and an acid generator (B). One kind of member or two or more kinds of members may be used for each of the resin (A) and the acid generator (B) of the photoresist composition. Each component of the photoresist composition will be described below.

<Resin (A)>

The photoresist composition contains the resin (A) in an amount of 80 parts or more by mass with respect to 100 parts by mass of the solid content of the photoresist composition. Here, "the solid content" means the total amount of the photoresist composition except the solvent, which are described below. The amount of the solid content of the photoresist composition and the content ratio of the resin (A) relative to the photoresist composition are determined by the conventionally-known analytical tools such as liquid chromatography or gas chromatography.

The resin (A) is a resin which contains a copolymer (A1) obtained by polymerizing: a (meth)acrylic monomer (a1) having $C_{5-20}$ alicyclic hydrocarbon group which becomes an alkali soluble by the action of an acid; a (meth)acrylic monomer (a2) having a hydroxyl group-containing adamantyl group; and a (meth)acrylic monomer (a3) having a lactone ring, and the copolymer (A1) has a weight-average molecular weight of 2,500 or more and 5,000 or less. The amount of the copolymer (A1) is 50 parts by mass or more, and is preferably 70 parts by mass or more, per 100 parts by mass of the resin (A). More preferably, the resin (A) is formed of the copolymer (A1) only.

The inventors of the present invention have found that the use of the copolymer (A1) enables to provide a resist pattern excellent in CDU and focus margin. The effect of the present invention is thought to be achieved because, when a copolymer has a reduced molecular weight, mechanical strength of a resist film is not greatly increased at pre-baking as compared to in the conventional art, and diffusion of active species ($H^+$) and acid catalytic reaction are promoted at post-exposure-baking, and solubility of a resin, which becomes base-soluble due to an effect of an acid, in a liquid developer (basic aqueous solution) is enhanced. On the other hand, the copolymer (A1) having an excessively low Mw causes deterioration of the CDU and DOF. Therefore, in the present invention, the Mw of the copolymer (A1) is defined as ranging from 2,500 to 5,000. The Mw thereof is preferably 2,900 or more (more preferably 3,000 or more), and is preferably 4,900 or less (more preferably 4,800 or less).

The photoresist composition of the present invention may contain another polymer (A2) different from the copolymer (A1), and the amount of the other polymer (A2) is 50 parts by mass or less (preferably 30 parts by mass or less), per 100 parts by mass of the resin (A). The other polymer (A2) different from the copolymer (A1) may be a homopolymer or a copolymer. Examples of the other polymer (A2) different from the copolymer (A1) include a copolymer which does not contain any structural unit derived from each of the monomer (a1), the monomer (a2), and the monomer (a3); a copolymer which does not contain all of the structural units; and a homopolymer. Further, examples of the other polymer (A2) different from the copolymer (A1) also include a copolymer that contains a structural unit derived from each of the monomer (a1), the monomer (a2), and the monomer (a3), and that has a Mw which is not included in the Mw range of copolymer (A1).

The Mw of the other polymer (A2) different from the copolymer (A1) is preferably greater than 5,000 (more preferably 8,000 or more), and is preferably not greater than 20,000 (more preferably not greater than 12,000).

The copolymer (A1) contains a structural unit derived from each of the monomer (a1), the monomer (a2), and the monomer (a3). The monomer (a1) becomes soluble in an aqueous alkali solution by the action of an acid. Therefore, the monomer (a1) is necessary in order to make a photoresist composition of the present invention to be a chemically amplified positive type photoresist. When the monomer (a2) having a hydroxyl group and the monomer (a3) having a lactone ring, respectively, are used together with the monomer (a1), the solubility in an alkaline developer is further enhanced, so that adhesion of a photoresist film to a substrate is improved. The monomer (a1), the monomer (a2), and the monomer (a3) will be described below in order, respectively.

<Monomer (a1)>

An alicyclic hydrocarbon group of the (a1) may be saturated or unsaturated, and may be monocyclic or polycyclic. Examples of the alicyclic hydrocarbon group which is monocyclic include cycloalkyl groups (e.g., a cyclopropyl group, a cyclobutyl group, a cyclopentyl group, a cyclohexyl group, a cycloheptyl group, a cyclooctyl group, a cyclononyl group, and a cyclodecyl group), and cycloalkenyl groups (e.g., a cyclopentenyl group, a cyclohexenyl group, a cycloheptenyl group, and a cyclooctenyl group). Examples of the alicyclic hydrocarbon group which is polycyclic include groups obtained by hydrogenating a condensed aromatic hydrocarbon group (e.g., a hydronaphthyl group); and bridged cyclic hydrocarbon groups. Examples of the bridged cyclic hydrocarbon groups include a 1-adamantyl group, a 2-adamantyl group, an isobornyl group, a 1-norbornyl group, and a 2-norbornyl group. The bridged cyclic hydrocarbon group may have an unsaturated bond as in norbornenyl groups (e.g., a norborn-5-ene-2-yl group). Further, as indicated below, examples of the alicyclic hydrocarbon group also include groups obtained by condensation of a bridged ring (e.g., a norbornane ring) with a single ring (e.g., a cycloheptane ring and a cyclohexane ring) or a multi-ring (e.g., a decahydronaphthalene ring); and groups obtained by condensation of bridged rings with each other. Among them, a cyclohexyl group and a 2-adamantyl group are preferable.

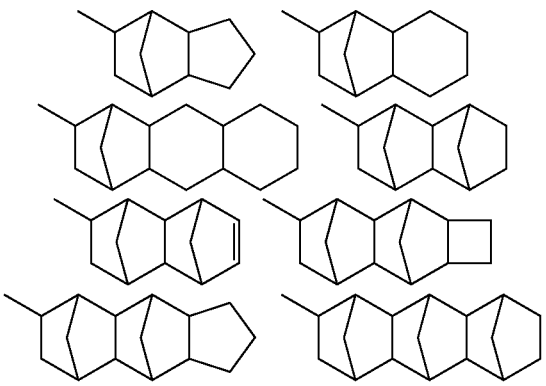

The monomer (a1) is preferably a monomer which has an alicyclic hydrocarbon group whose bonding position is a tertiary carbon atom (other than bridgehead carbon atoms of a bridged cyclic hydrocarbon group), and is more preferably a compound (a1-1) or a compound (a1-2) represented below;

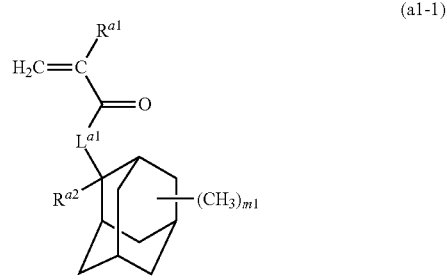

(a1-1)

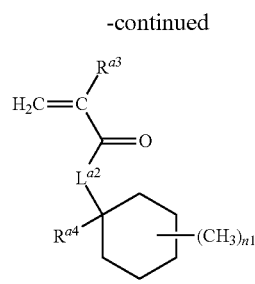

(a1-2)

One kind of, or two or more kinds of the compounds (a1-1) and (a1-2) may be used.

In the formulae (a1-1) and (a1-2), $L^{a1}$ and $L^{a2}$ each independently represent an oxygen atom (—O—), a carbonyl group (—CO—), a linear or branched $C_{1-17}$ alkanediyl group, or a combination thereof.

When $L^{a1}$ and $L^{a2}$ each independently represents a combination including an oxygen atom, a $C_{1-17}$ alkanediyl group, and/or the like, the number of atoms in a main chain thereof is preferably 17 or less. When an adamantyl group or a cyclohexyl group is represented as Ad in order to indicate a bonding direction, examples of $L^{a1}$ and $L^{a2}$ each of which represents a combination include —O—$C_{1-16}$ alkanediyl-Ad, —$C_{1-16}$ alkanediyl-O-Ad, —$C_{k1}$ alkanediyl-O—$C_{j1}$ alkanediyl-Ad (wherein $1 \leq k1$, $1 \leq j1$, and $k1+j1 \leq 16$, the same shall apply hereinafter);

—CO—$C_{1-16}$ alkanediyl-Ad, —$C_{1-16}$ alkanediyl-CO-Ad, —$C_{k1}$ alkanediyl-CO—$C_{j1}$ alkanediyl-Ad; —CO—O-Ad, —CO—O—$C_{1-15}$ alkanediyl-Ad, —$C_{1-15}$ alkanediyl-CO—O-Ad, —$C_{i1}$ alkanediyl-CO—O—$C_{h1}$ alkanediyl-Ad (wherein $1 \leq i1$, $1 \leq h1$, and $i1+h1 \leq 15$, the same shall apply hereinafter);

—O—CO-Ad, —O—CO—$C_{1-15}$ alkanediyl-Ad, —$C_{1-15}$ alkanediyl-O—CO-Ad, —$C_{i1}$ alkanediyl-O—CO—$C_{h1}$ alkanediyl-Ad; and —CO—O—$C_{1-14}$ alkanediyl-O-Ad, and —CO—O—$C_{1-13}$ alkanediyl-CO—O-Ad.

Preferably, $L^{a1}$ and $L^{a2}$ each independently is —O-Ad, —O— $(CH_2)_{g1}$—CO—O-Ad. When $L^{a1}$ and $L^{a2}$ as described above are used, the compound (a1-1) and the compound (a1-2) each independently correspond to an ester having a structure in which a tertiary carbon atom of the adamantyl group or the cyclohexyl group is bonded to an oxygen atom of a carbonyl-oxy group (–CO—O—), that is, to an ester having a tertiary alcohol residue. A copolymer which contains, as a structural unit, an ester having a tertiary alcohol residue easily cleaves by a catalytic action of an acid generated from the acid generator, and solubility of the copolymer in an alkaline developer (an aqueous alkali solution) is enhanced. Therefore, the copolymer which contains, as a structural unit, an ester having a tertiary alcohol residue is preferable.

$R^{a1}$ and $R^{a3}$ each independently represent a hydrogen atom or a methyl group, and are preferably a methyl group.

$R^{a2}$ and $R^{a4}$ each independently represent a linear or branched aliphatic hydrocarbon group, or an alicyclic hydrocarbon group, and are preferably a linear or branched aliphatic hydrocarbon group. The number of carbon atoms in the aliphatic hydrocarbon group of each of $R^{a2}$ and $R^{a4}$ is preferably 6 or less. The number of carbon atoms in the alicyclic hydrocarbon group of each of $R^{a2}$ and $R^{a4}$ is preferably 8 or less, and is more preferably 6 or less. Examples of the linear or branched aliphatic hydrocarbon group preferably include a methyl group, an ethyl group, a 1-methyl-ethyl group (an i-propyl group), a 1,1-dimethylethyl group (a t-butyl group), a 2,2-dimethylethyl group, a propyl group, a 1-methyl-propyl group, a 2,2-dimethylpropyl group, a 1-ethyl-propyl group, a butyl group, a 1-methyl-butyl group, a 2-methyl-butyl group, a 3-methyl-butyl group, a 1-propyl-butyl group, a pentyl group, a 1-methyl-pentyl group, a hexyl group, a 1,4-dimethylhexyl group, a heptyl group, a 1-methyl-heptyl group, and an octyl group. Examples of the alicyclic hydrocarbon group preferably include a cycloheptyl group, a methylcycloheptyl group, a cyclohexyl group, a methylcyclohexyl group, a dimethylcyclohexyl group, a norbornyl group, and a methylnorbornyl group.

"m1" represents an integer ranging from 0 to 14, and preferably is an integer ranging from 0 to 3, and more preferably is 0 or 1. "n1" represents an integer ranging from 0 to 10, and preferably is an integer ranging from 0 to 3, and more preferably is 0 or 1.

Examples of the monomer (a1-1) having an adamantane ring are as follows:

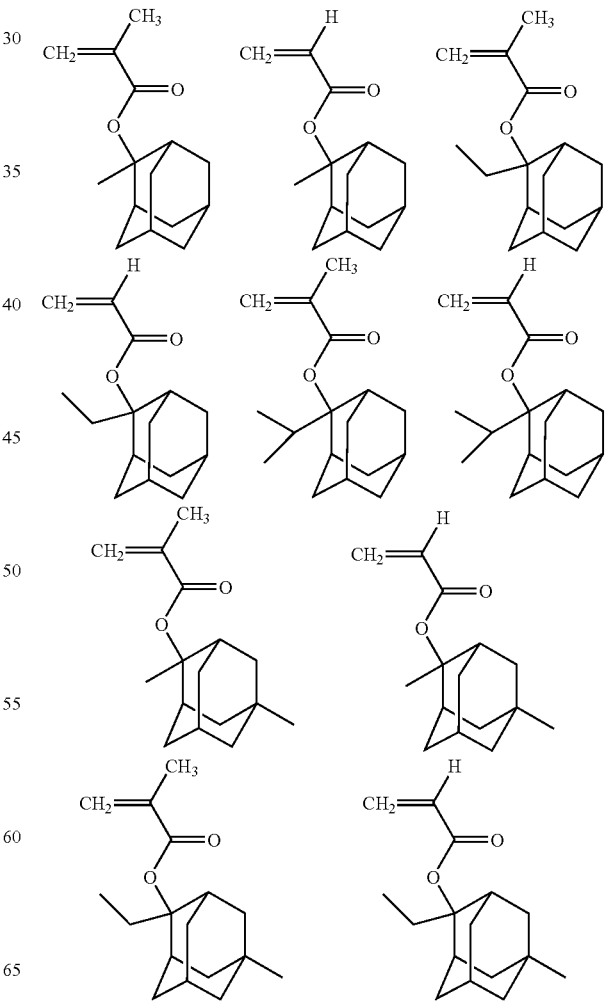

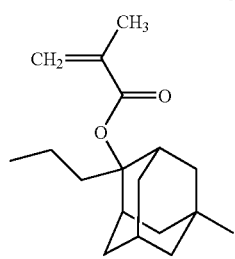
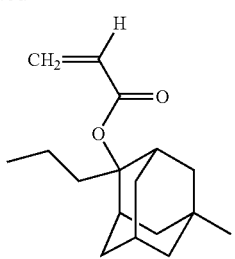
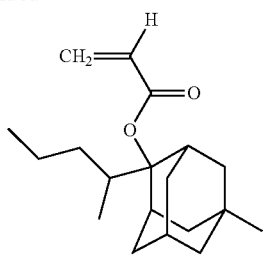
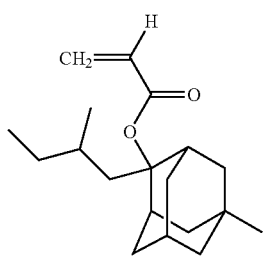
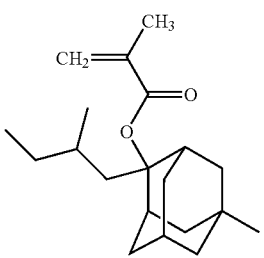
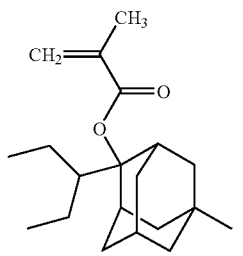
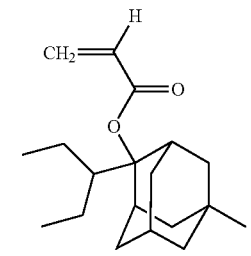
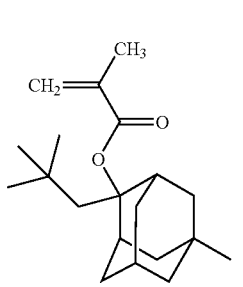
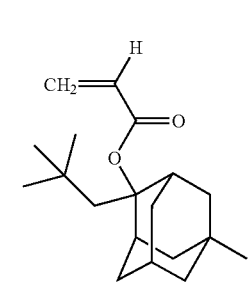
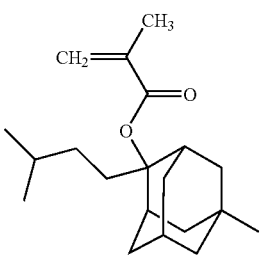
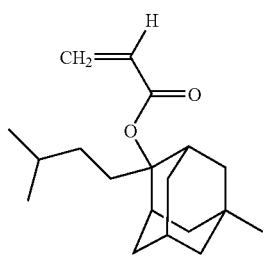
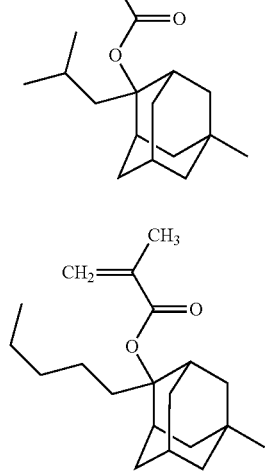

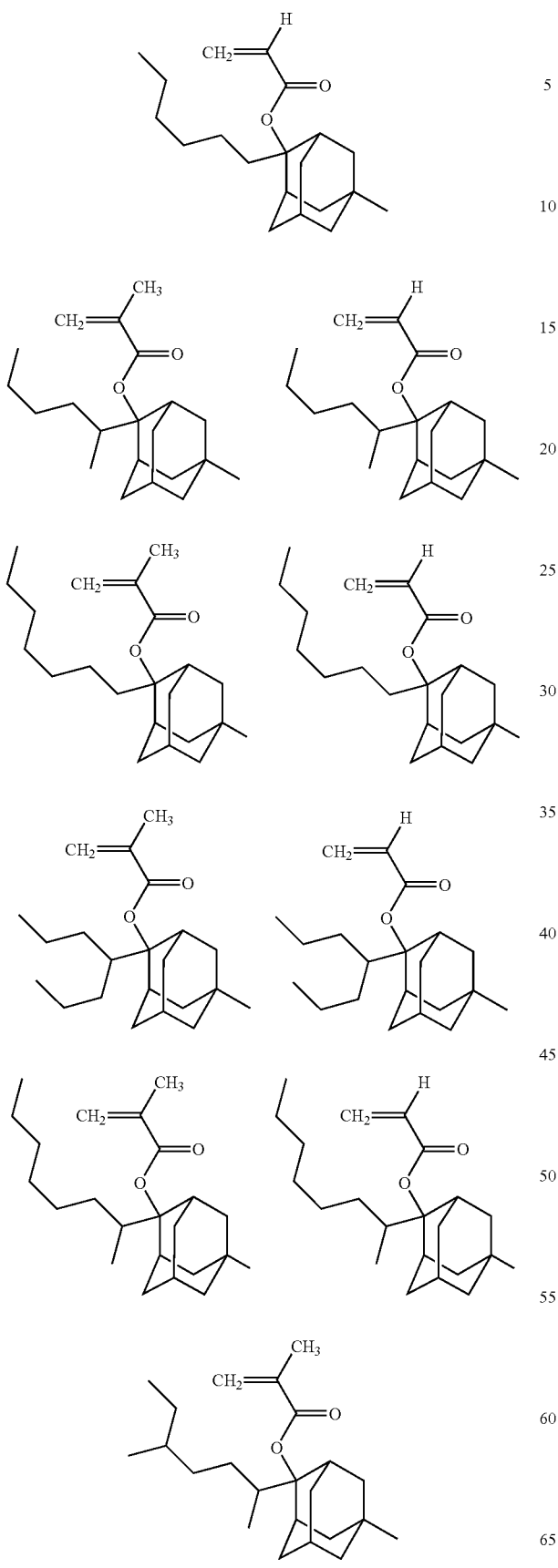

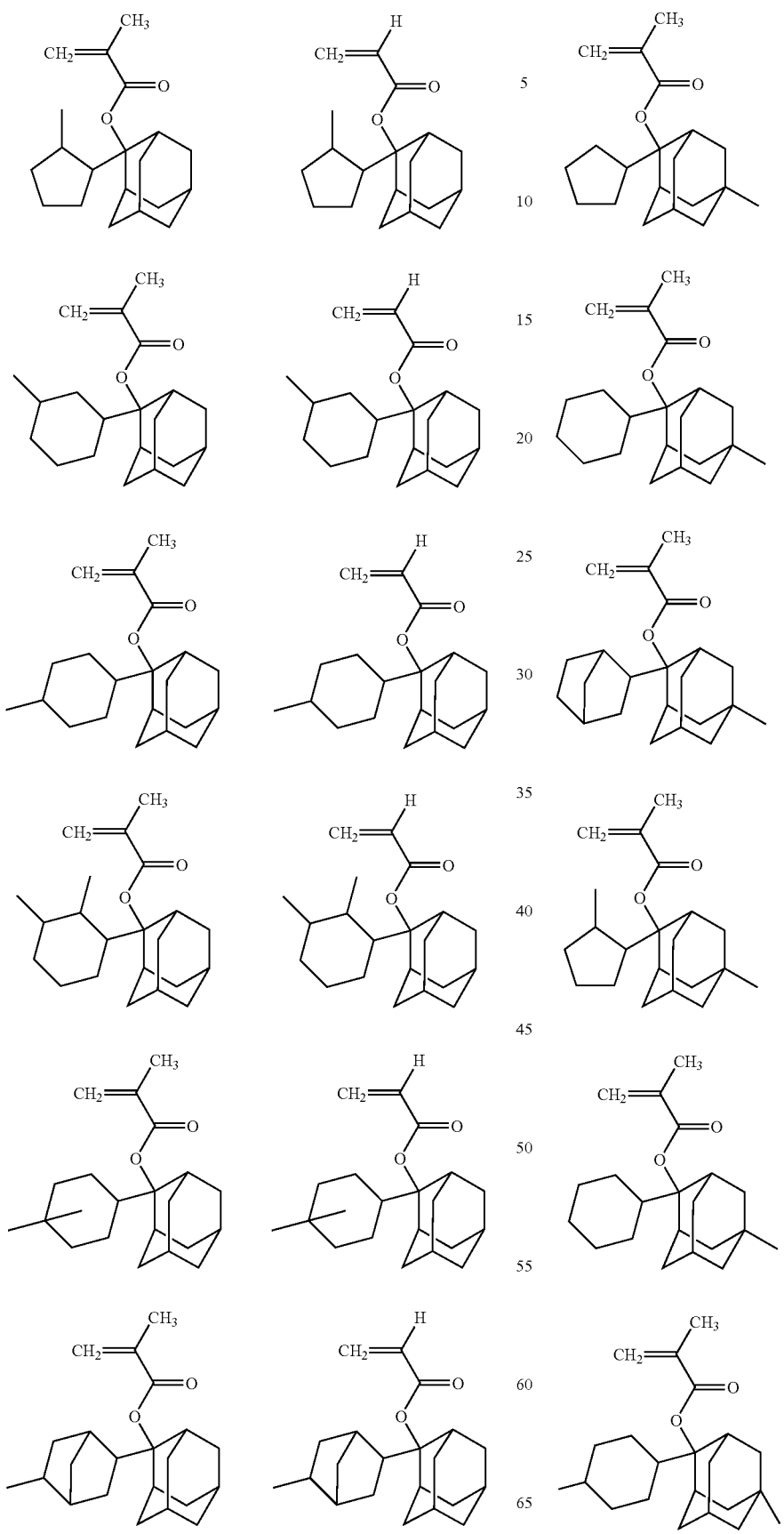

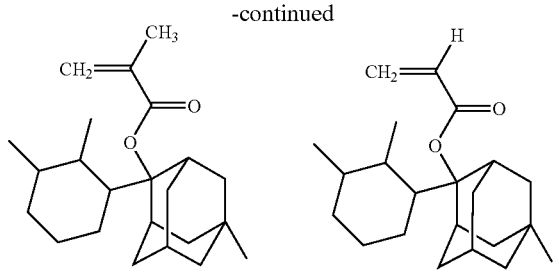
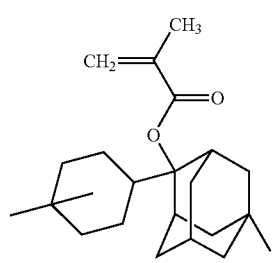
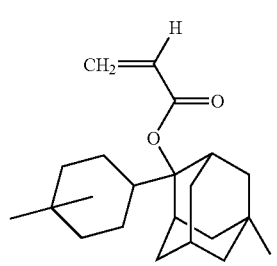
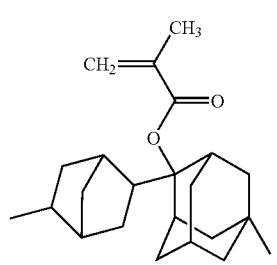
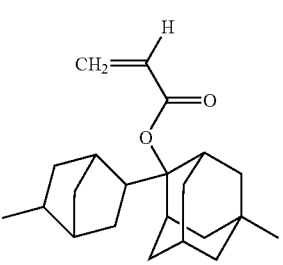
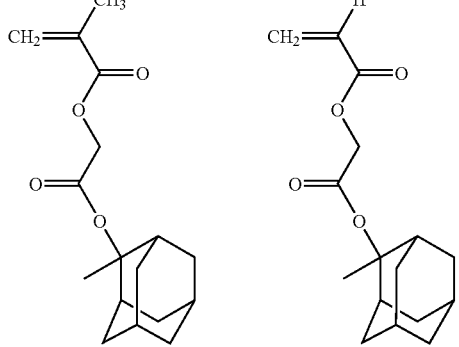
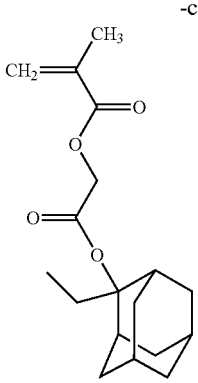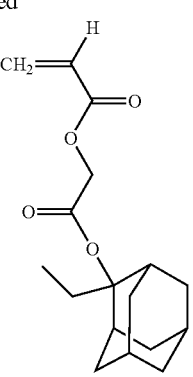
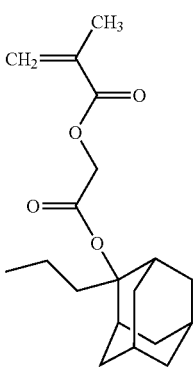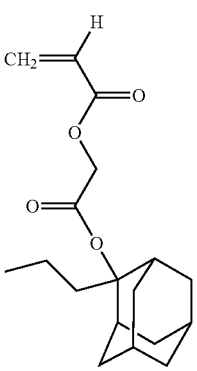
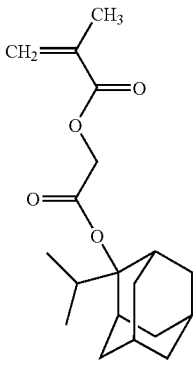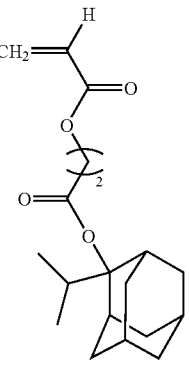
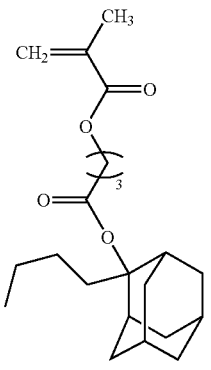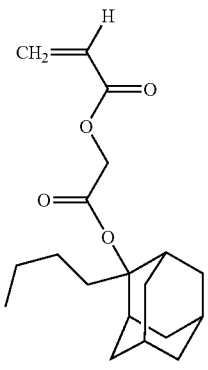

-continued
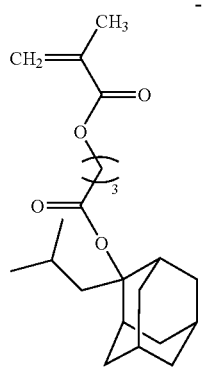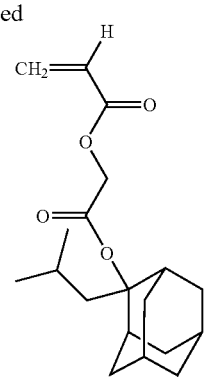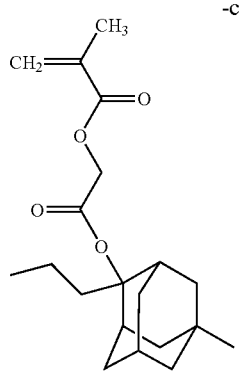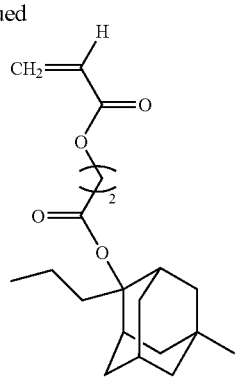
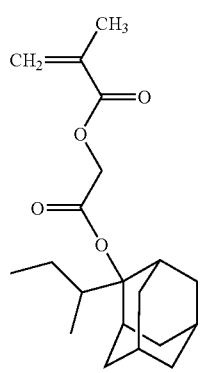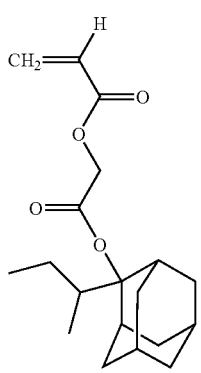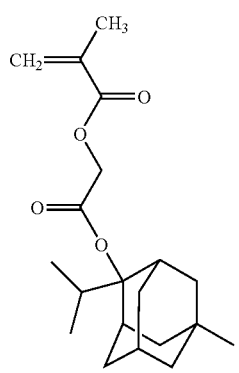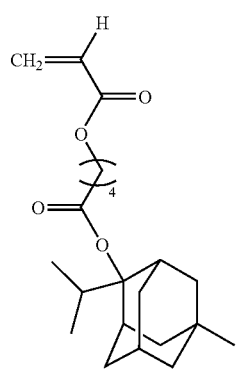
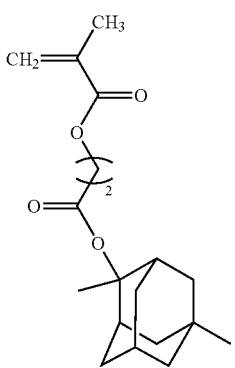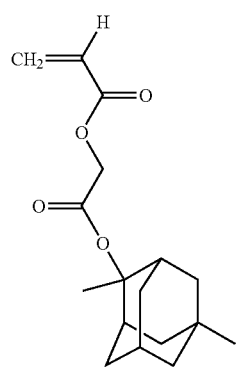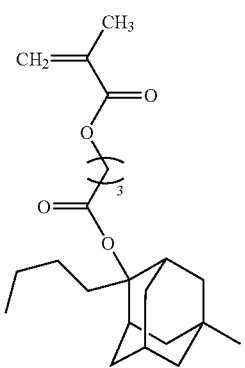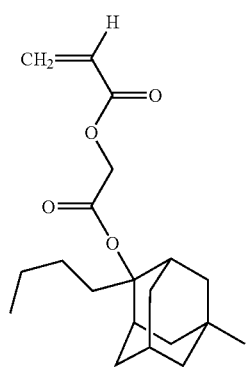
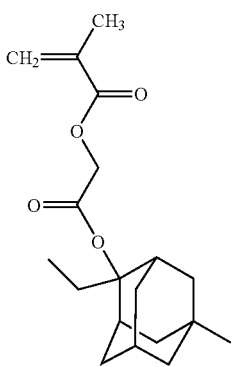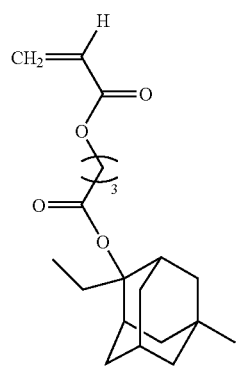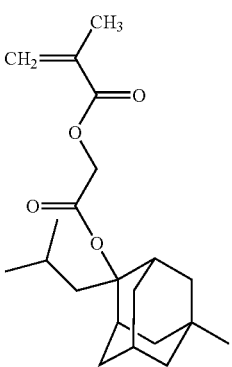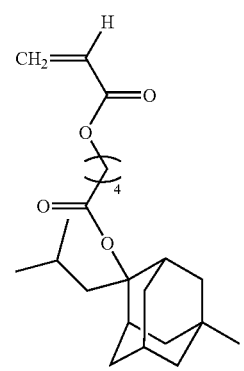

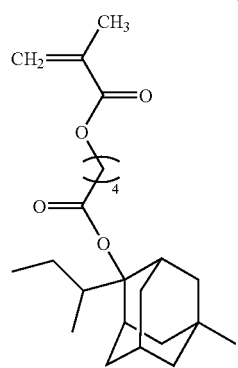 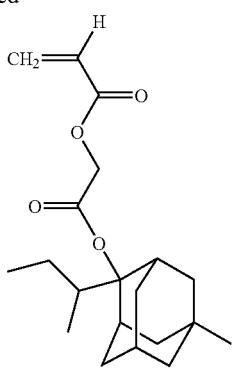 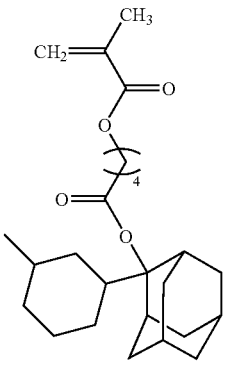 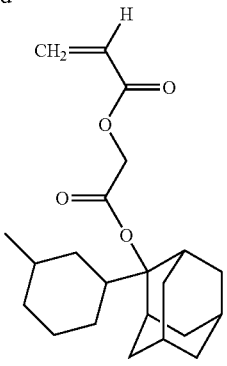
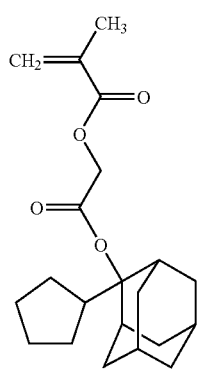 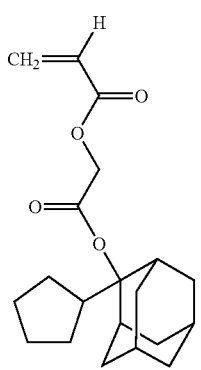 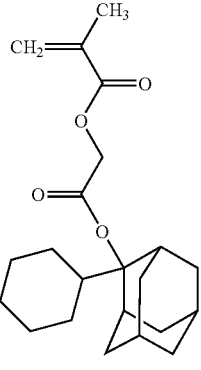 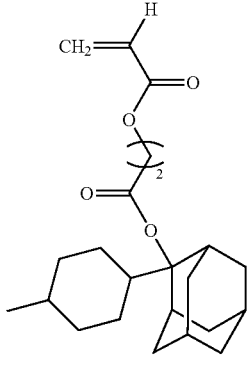
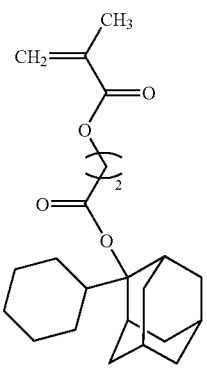 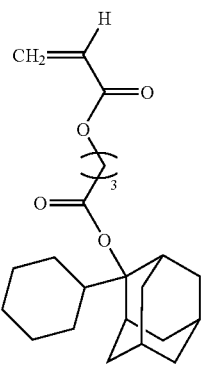 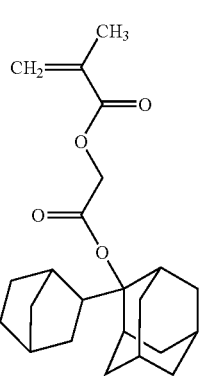 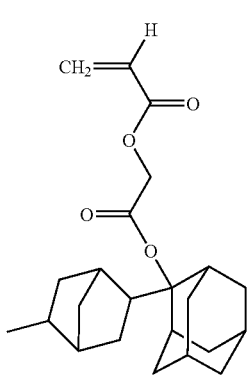
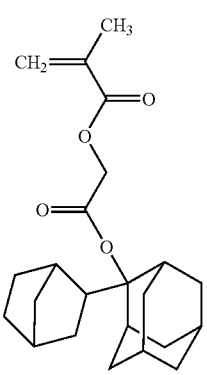 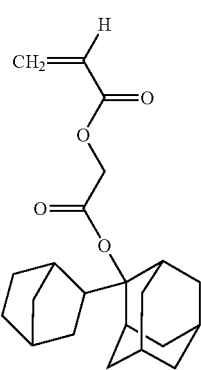 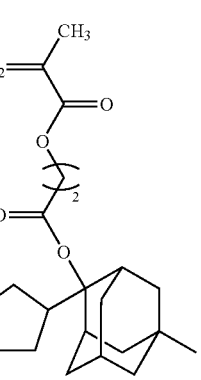 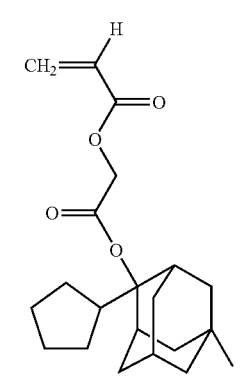

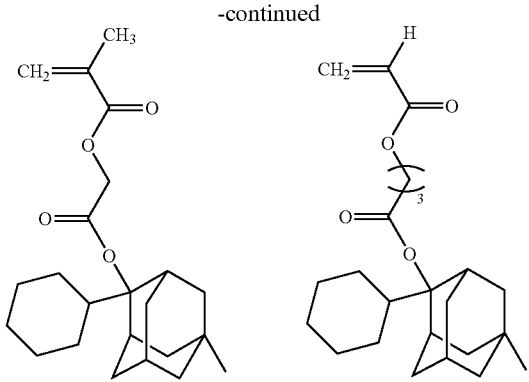
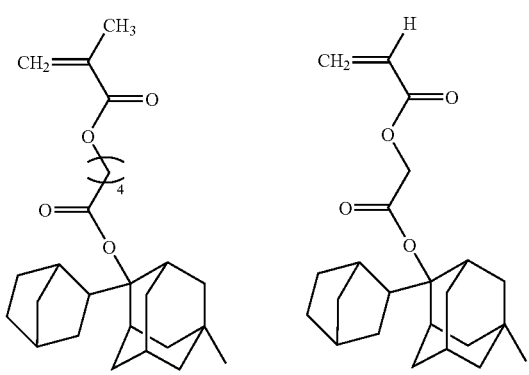
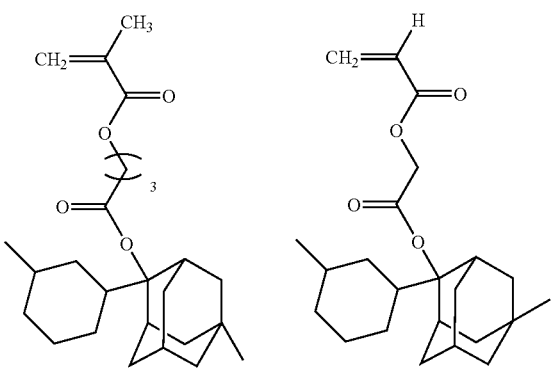
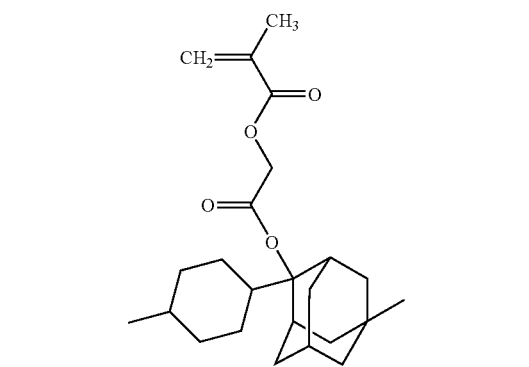
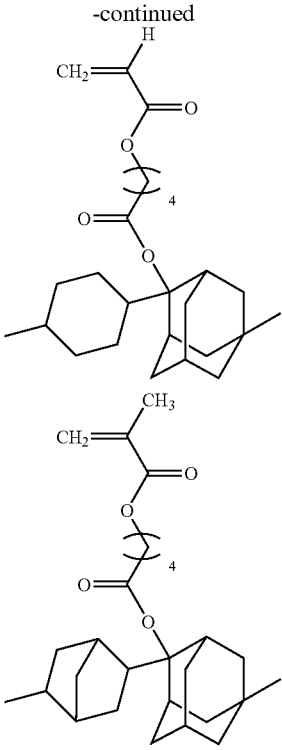
Among them, 2-methyl-2-adamantyl(meth)acrylate, 2-ethyl-2-adamantyl(meth)acrylate, and 2-isopropyl-2-adamantyl(meth)acrylate are preferable, and a methacrylate-type is more preferable.
Examples of the monomer (a1-2) having a cyclohexane ring are as follows:
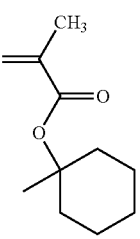
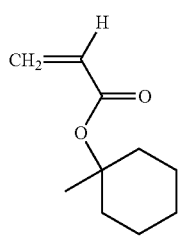
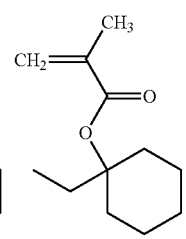

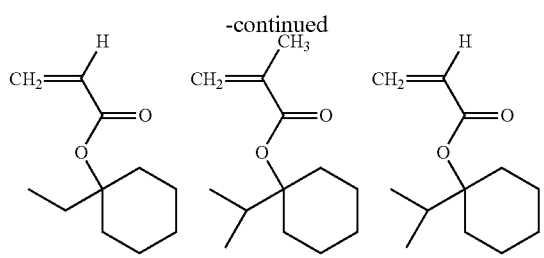

Examples of the monomer (a2-1) are as follows:

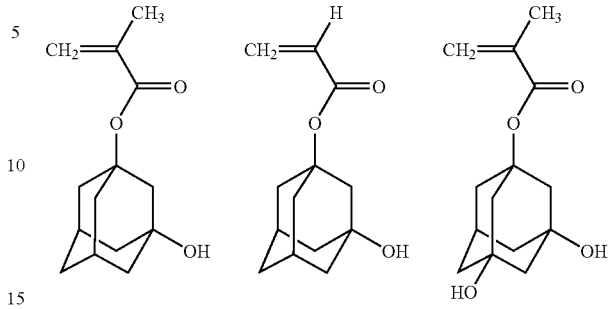

Among them, 1-ethyl-1-cyclohexyl(meth)acrylate is preferable, and 1-ethyl-1-cyclohexyl methacrylate is more preferable.

The content ratio of a structural unit derived from the monomer (a1) in the copolymer (A1) is usually 10 to 95 mole %, preferably 15 to 90 mole %, and more preferably 20 to 85 mole % based on the total structural unit of the copolymer (A1).

<Monomer (a2)>

Although the monomer (a2) may have, on an adamantane ring, a hydroxyl-containing substituent such as a hydroxymethyl group (—$CH_2OH$), the monomer (a2) preferably has, on an adamantane ring, a hydroxyl group (—OH). The number of the hydroxyl groups may be one or may be 2 or more.

The hydroxyadamantyl type monomer (a2) is preferably a compound (a2-1) represented as below, and one or more kinds of the compound (a2-1) may be used.

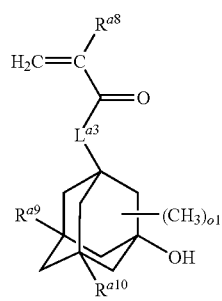

(a2-1)

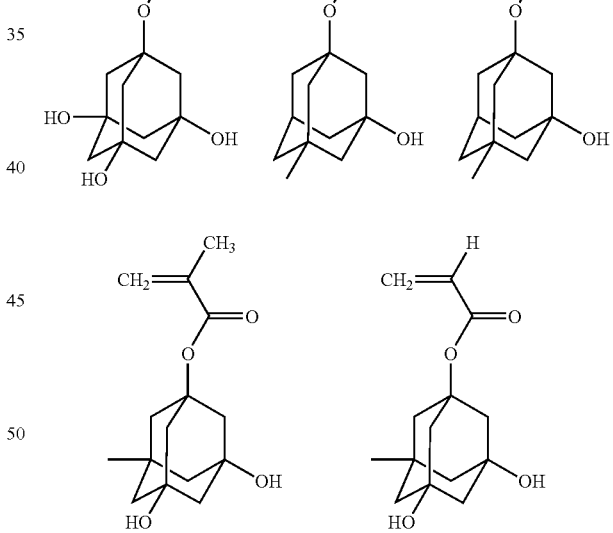

In Formula (a2-1), $L^{a3}$ represents an oxygen atom (—O—), a carbonyl group (—CO—), a linear or branched $C_{1-17}$ alkanediyl group, or a combination thereof. $R^{a8}$ represents a hydrogen atom or a methyl group. $R^{a9}$ and $R^{a10}$ each independently represent a hydrogen atom, a methyl group, or a hydroxyl group. "o1" represents an integer ranging from 0 to 10. When o1 is 0, it means that the corresponding methyl group is absent.

The examples of $L^{a3}$ are the same as those of $L^{a1}$ and $L^{a2}$. The examples of $R^{a8}$ are the same as those of $R^{a1}$. $R^{a9}$ is preferably a hydrogen atom. $R^{a10}$ is preferably a hydrogen atom or hydroxyl group. "o1" is preferably an integer ranging from 0 to 3, and more preferably represents 0 or 1.

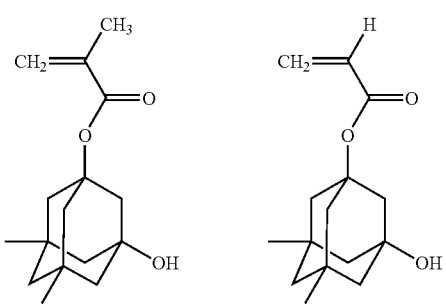

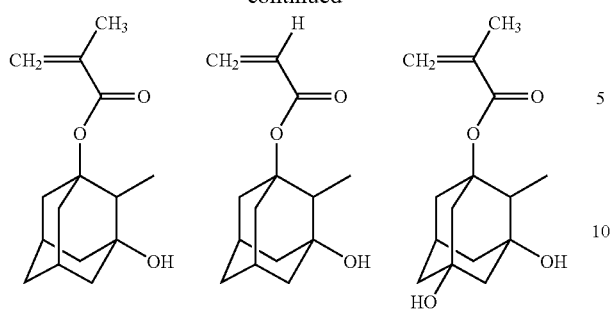
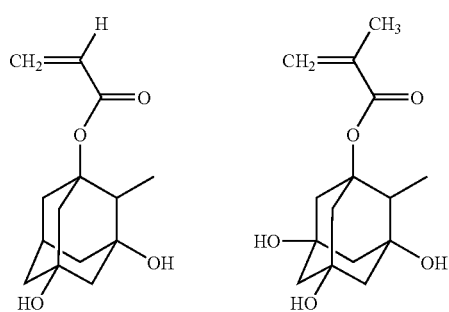
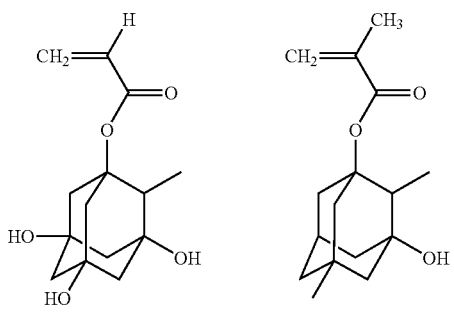
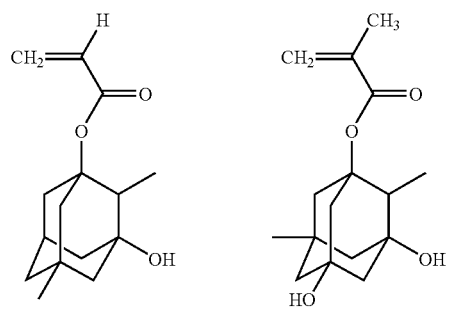
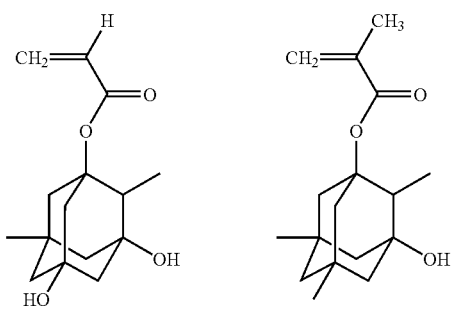
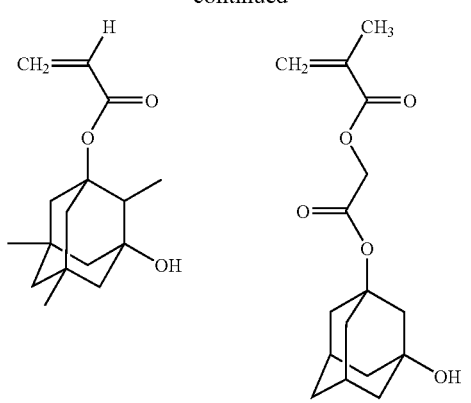
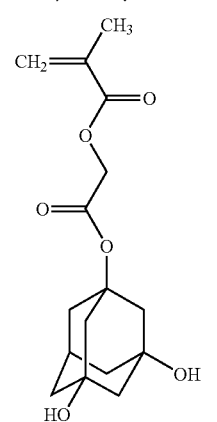
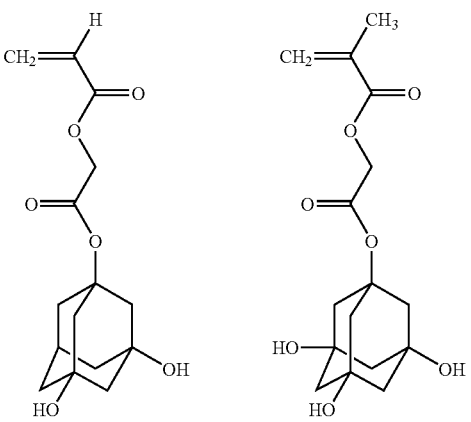
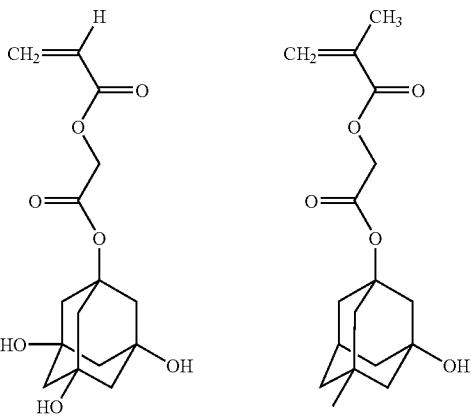

-continued

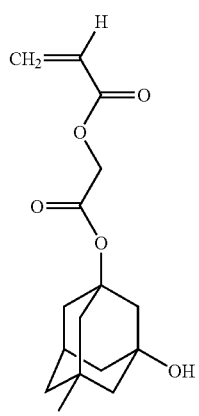
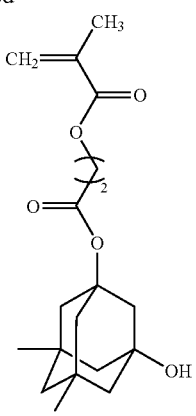
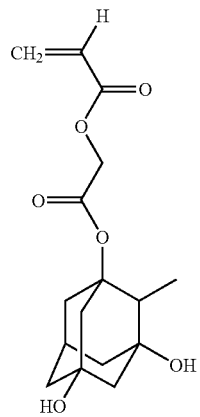
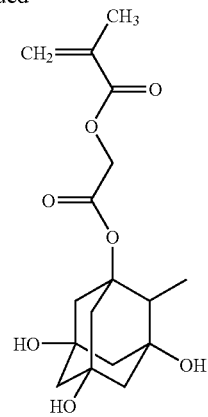

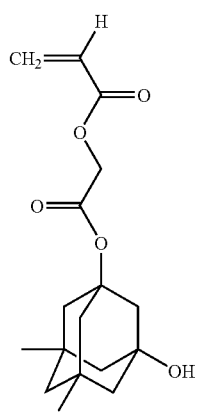
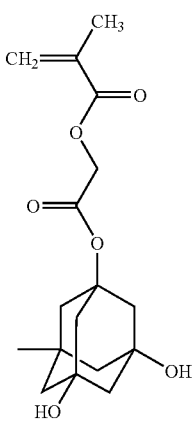
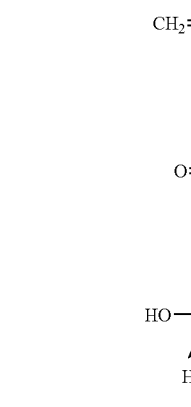

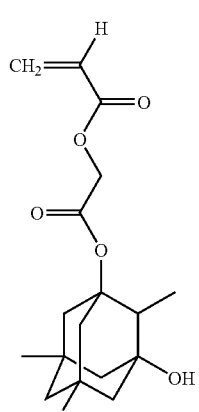
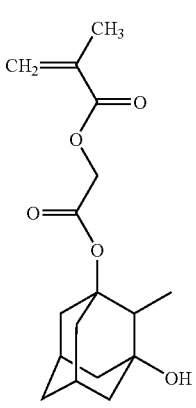

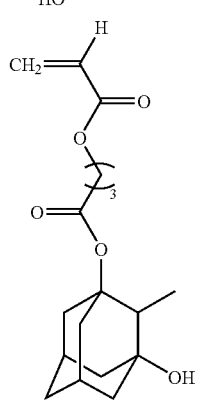
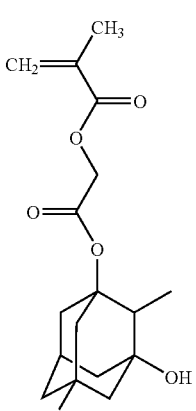

Among them, 3-hydroxy-1-adamantyl(meth)acrylate, 3,5-dihydroxy-1-adamantyl(meth)acrylate, and 1-(3,5-dihydroxy-1-adamantyloxycarbonyl)methyl(meth)acrylate are preferable, and 3-hydroxy-1-adamantyl(meth)acrylate and 3,5-dihydroxy-1-adamantyl(meth)acrylate are more preferable, and 3-hydroxy-1-adamantyl methacrylate, and 3,5-dihydroxy-1-adamantyl methacrylate are even more preferable.

The content ratio of a structural unit derived from the h monomer (a2) in the copolymer (A1) is usually 3 to 40 mole %, preferably 5 to 35 mole %, and more preferably 5 to 30 mole % based on the total structural unit of the copolymer (A1).

<Monomer (a3)>

Examples of a lactone ring contained in the monomer (a3) include single rings such as a β-propiolactone ring, a γ-butyrolactone ring, and a δ-valerolactone ring; and condensed rings which are obtained by condensation of a lactone ring that is a single ring, with another ring such as a cyclohexane ring. Preferred examples of the lactone ring include a γ-butyrolactone ring, and condensed rings which are obtained by condensation of a γ-butyrolactone ring with another ring as indicated below:

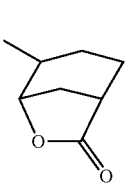
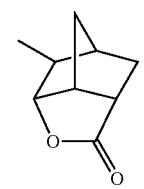

The monomer (a3) is preferably a compound (a3-1), a compound (a3-2), or a compound (a3-3) as represented below, and one or more kinds of the compound (a3-1), the compound (a3-2), and the compound (a3-3) may be used.

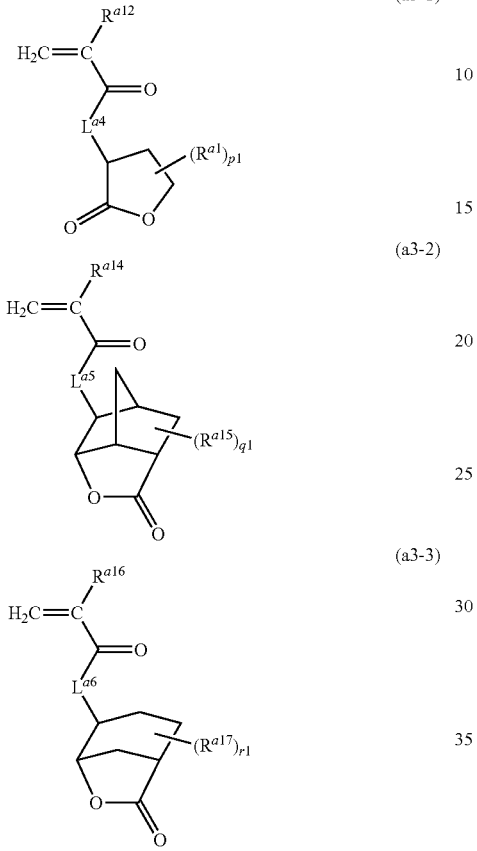

In Formulae (a3-1) to (a3-3), $L^{a4}$ to $L^{a6}$ each independently represent an oxygen atom (—O—), a carbonyl group (—CO—), a linear or branched $C_{1-17}$ alkanediyl group, or a combination thereof. $R^{a12}$, $R^{a14}$, and $R^{a16}$ each independently represent a hydrogen atom or a methyl group. $R^{a13}$ each independently represents a $C_{1-4}$ aliphatic hydrocarbon group. "p1" represents an integer ranging from 0 to 5. $R^{a15}$ and $R^{a17}$ each independently represent a carboxyl group, a cyano group, or a $C_{1-4}$ aliphatic hydrocarbon group. "q1" and "r1" each independently represent an integer ranging from 0 to 3. When p1, q1, or r1 is 0, it means that $R^{a13}$, $R^{a15}$, or $R^{a17}$, respectively, is absent. When p1, q1 or r1 is not less than 2, it means that a plurality of $R^{a13}$, $R^{a15}$, or $R^{a17}$, respectively, may be the same or different from each other.

The examples of $L^{a4}$, $L^{a5}$, and $L^{a6}$ are the same as those of $L^{a1}$ and $L^{a2}$. The examples of $R^{a12}$, $R^{a14}$, and $R^{a16}$ are the same as those of $R^{a1}$. $R^{a13}$ is preferably a methyl group. Preferably, $R^{a15}$ and $R^{a17}$ each independently are a carboxyl group, a cyano group, or a methyl group. Preferably, p1, q1 and r1 each independently represent 0 to 2. More preferably, p1, q1 and r1 each independently are 0 or 1.

Examples of the lactone type monomer (a3-1) which contains a γ-butyrolactone ring are as follows:

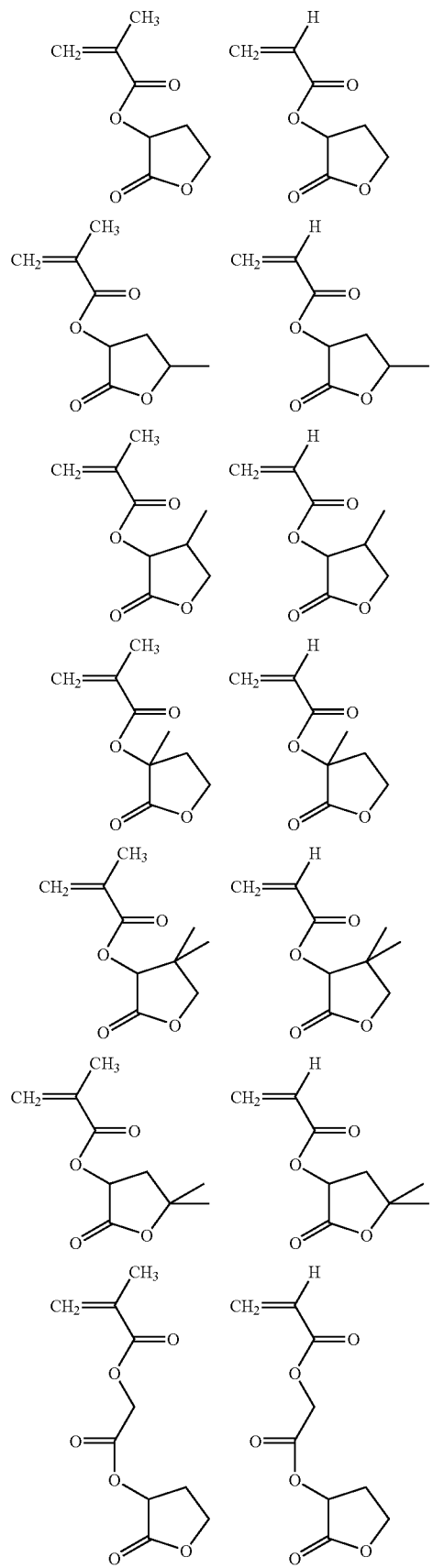

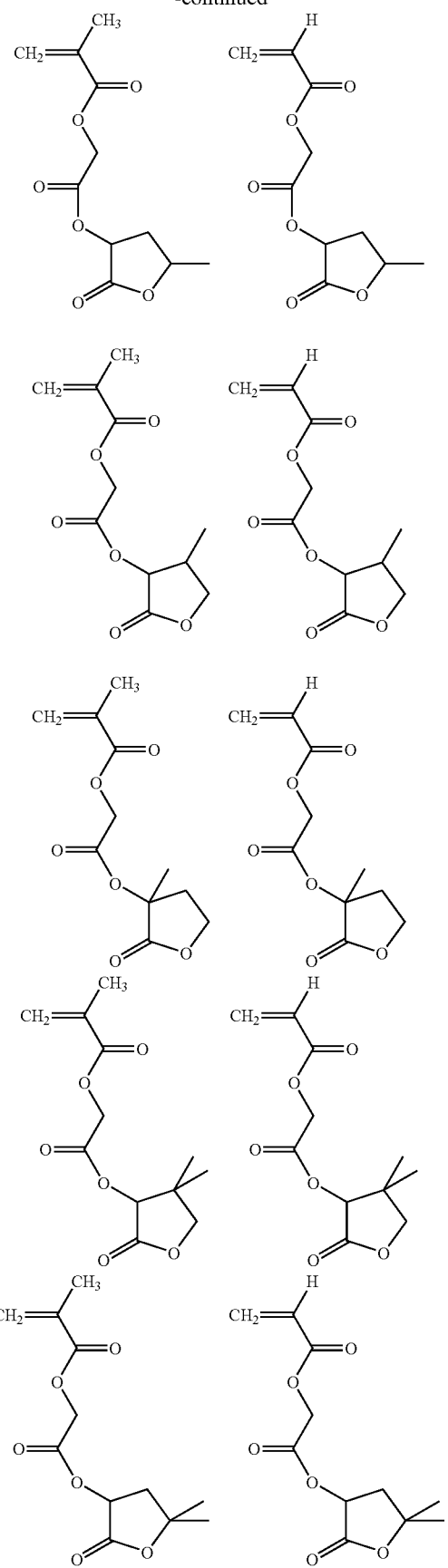
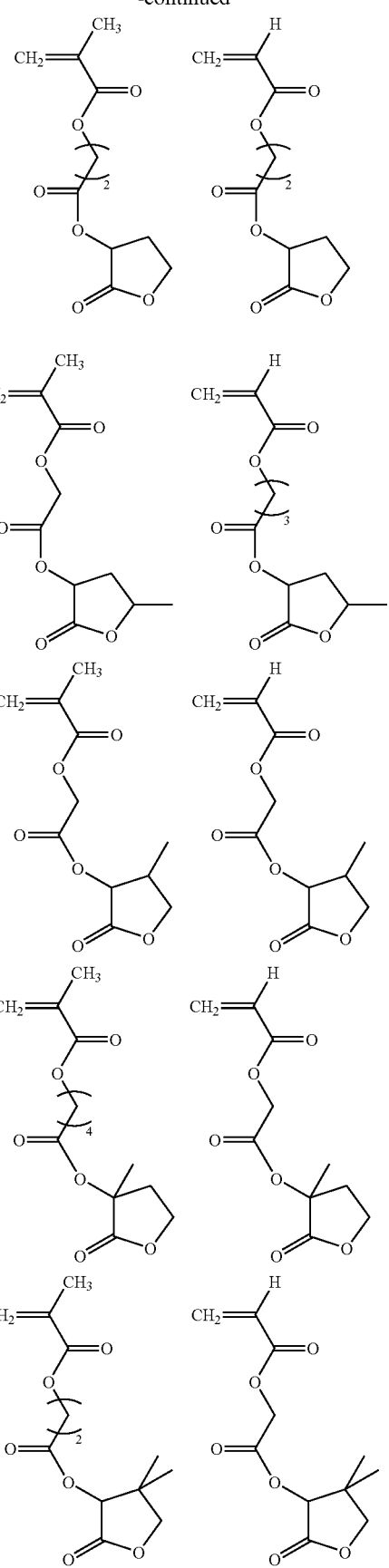

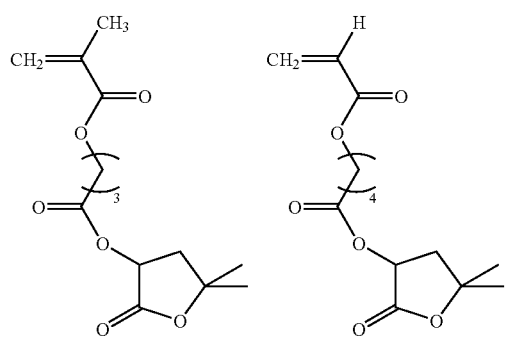
Examples of the monomer (a3-2) having a condensed ring obtained by condensation of a γ-butyrolactone ring with a norbornane ring are as follows:
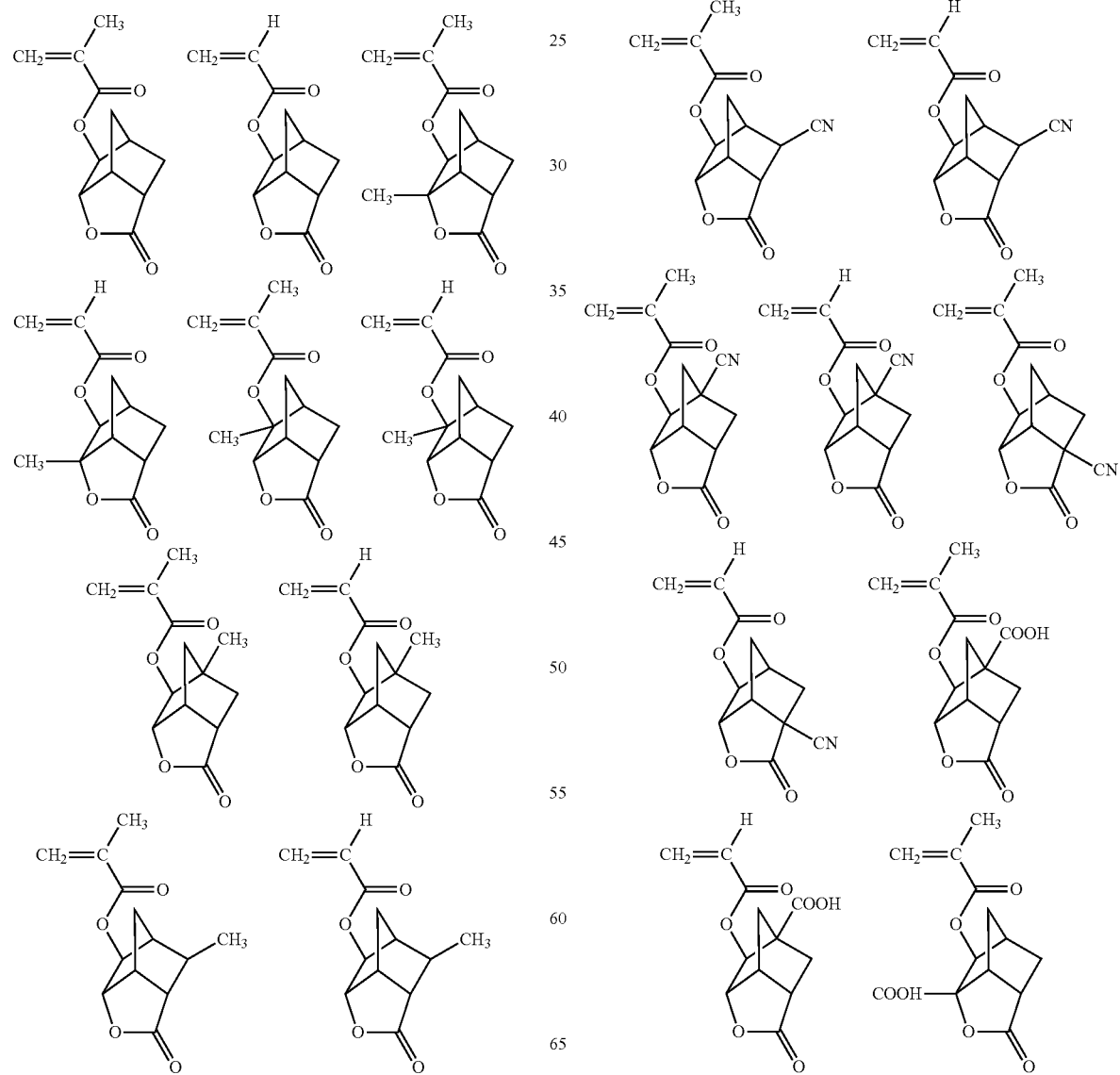

-continued
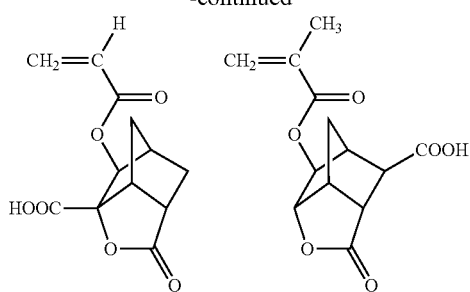
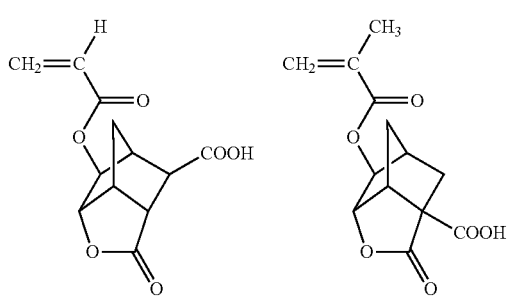
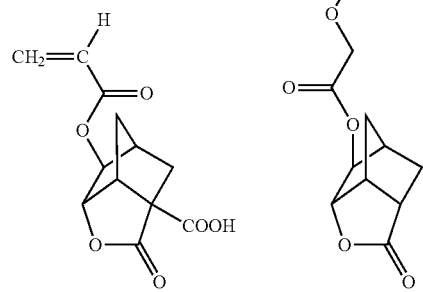
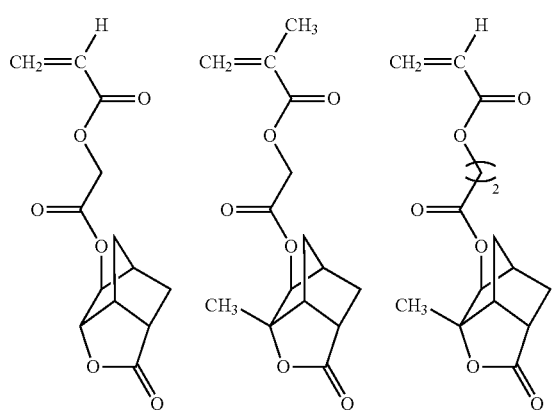
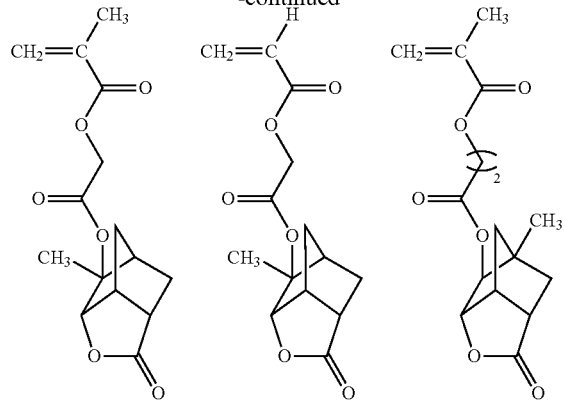
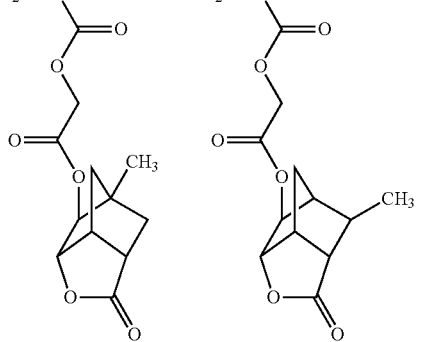
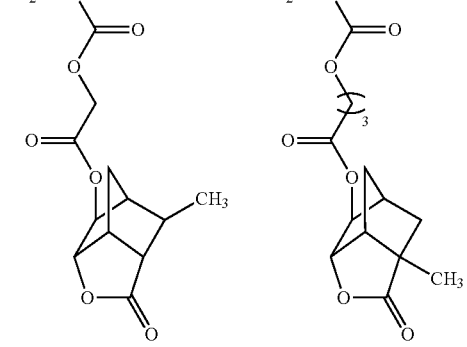
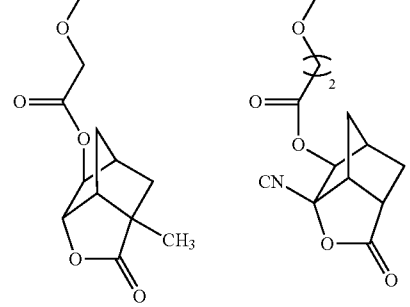

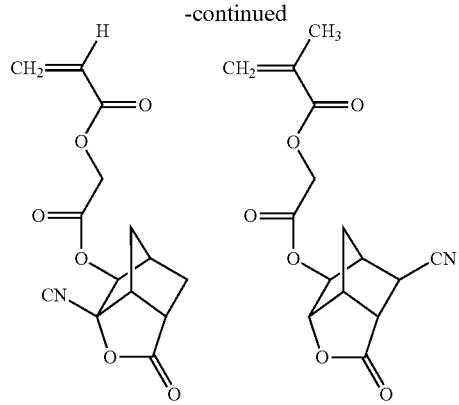
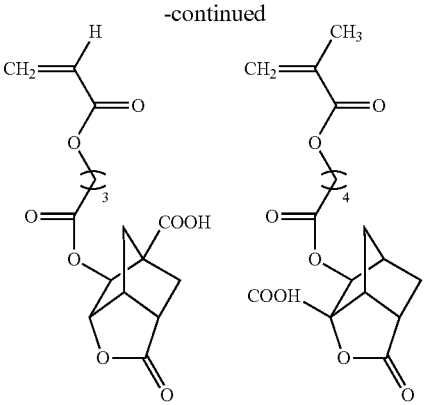
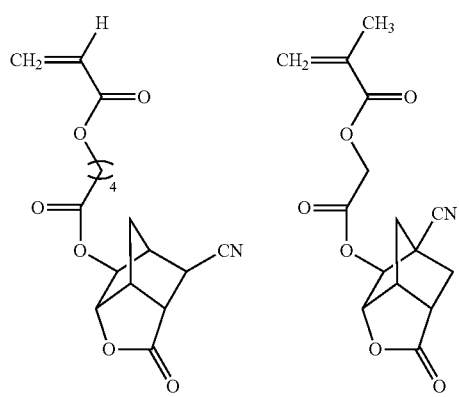
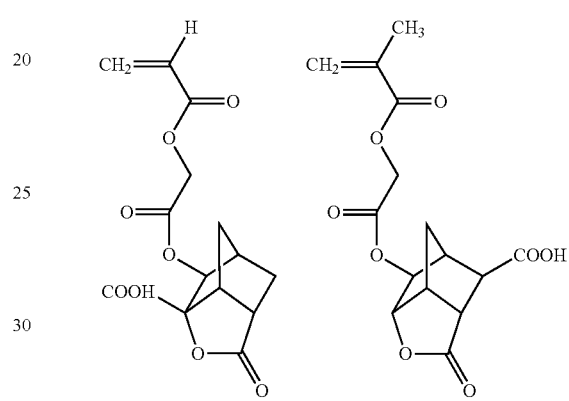
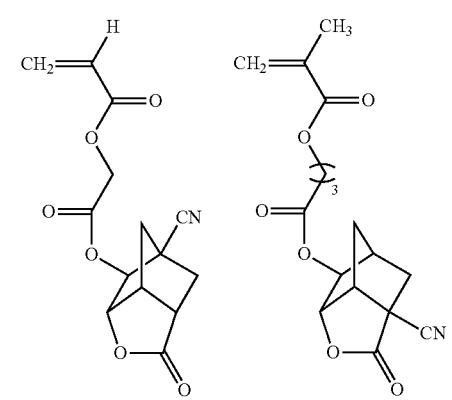
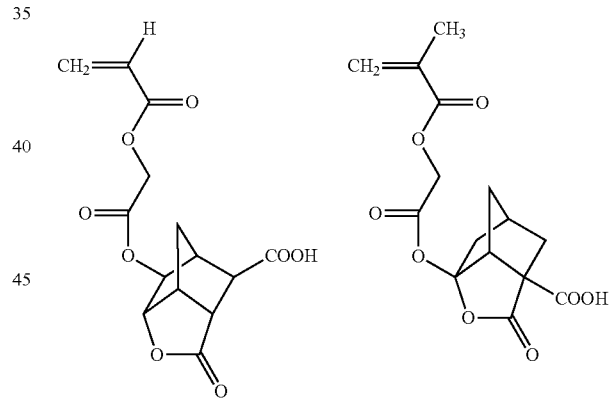
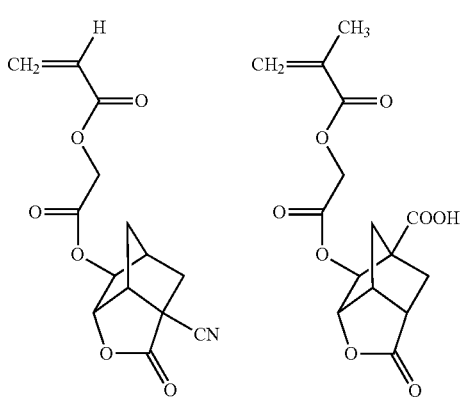
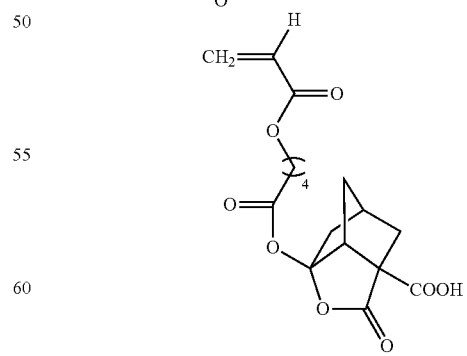
Examples of the monomer (a3-3) having a condensed ring obtained by condensation of a γ-butyrolactone ring with a cyclohexane ring are as follows:

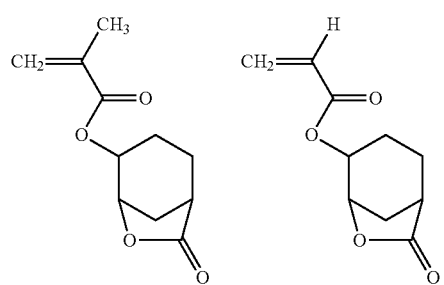
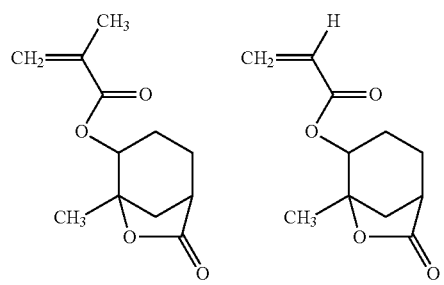
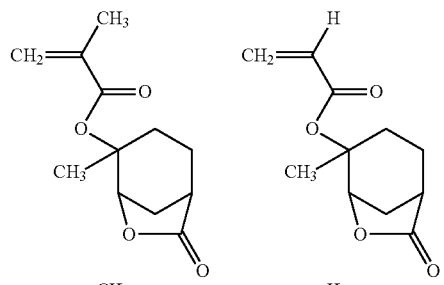
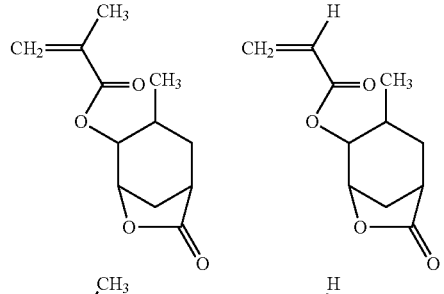
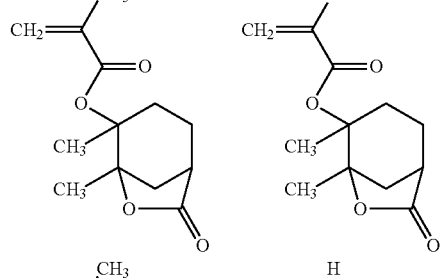
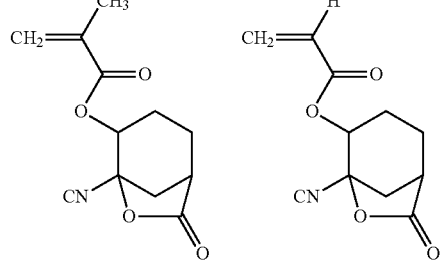
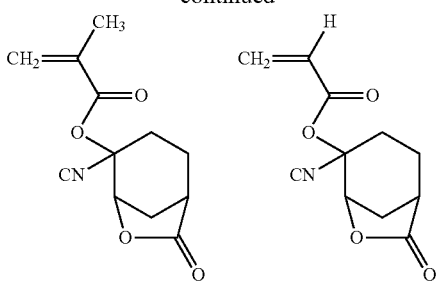
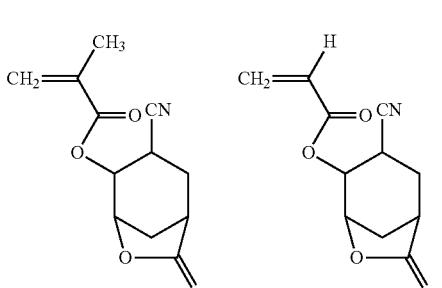
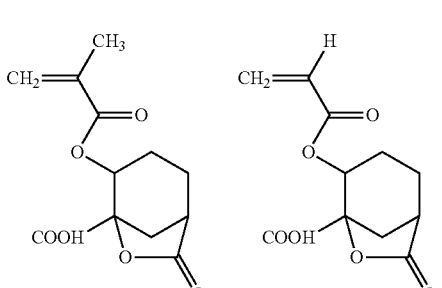
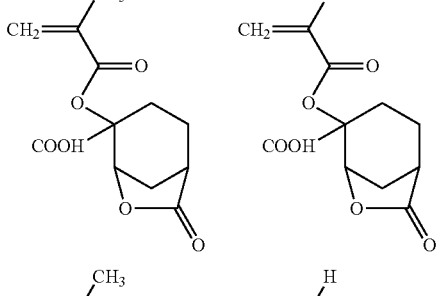
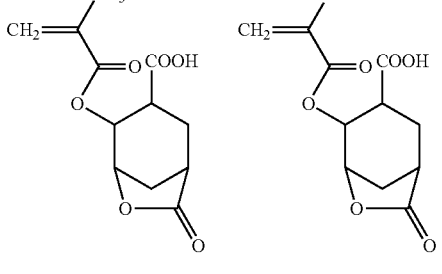

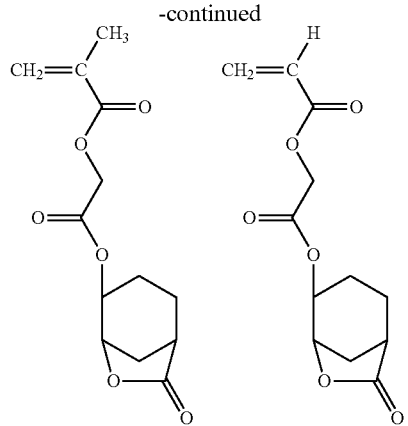
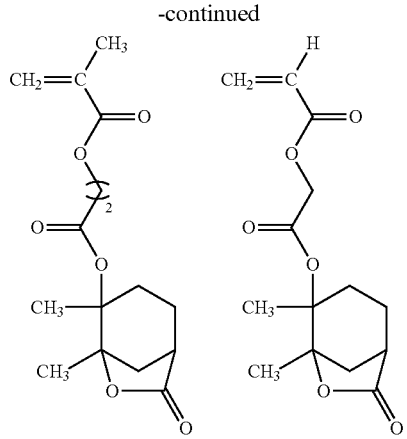
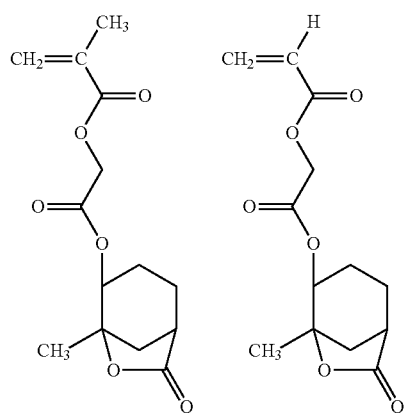
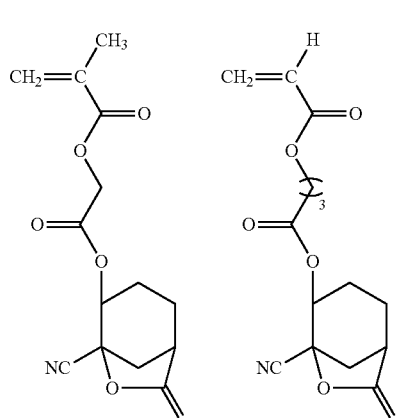
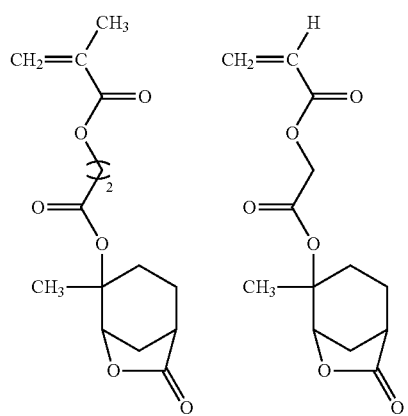
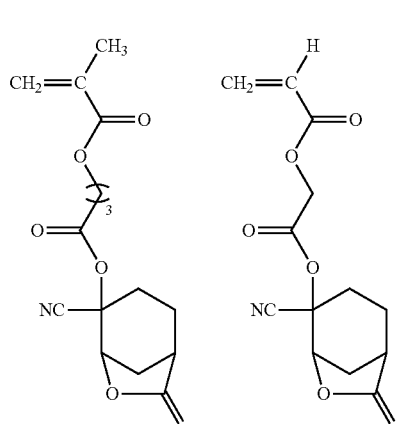
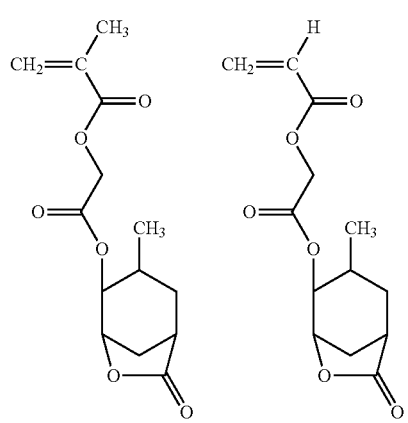
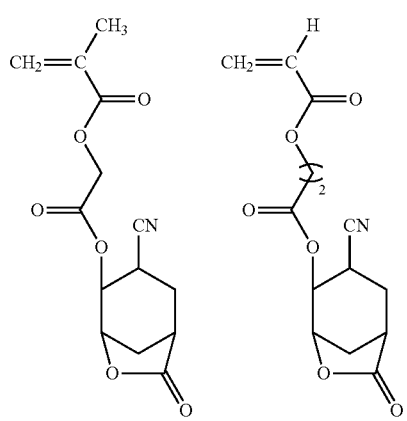

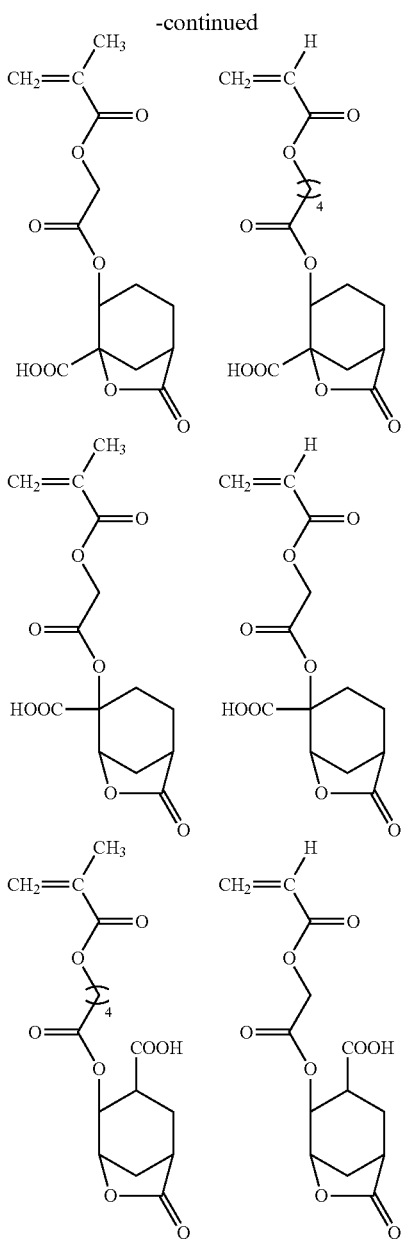

Among the lactone type monomer (a3) described above, (5-oxo-4-oxatricyclo[4.2.1.0$^{3,7}$]nonan-2-yl(meth)acrylate, tetrahydro-2-oxo-3-furyl(meth)acrylate, and 2-(5-oxo-4-oxatricyclo[4.2.1.0$^{3,7}$]nonan-2-yloxy)-2-oxoethyl(meth)acrylate are preferable, and a methacrylate type monomer is more preferable.

The content ratio of a structural unit derived from the monomer (a3) in the copolymer (A1) is usually 5 to 50 mole %, preferably 10 to 45 mole % and more preferably 15 to 40 mole % based on the total structural unit of the copolymer (A1).

<Other Monomers>

The copolymer (A1) may contain one or more structural unit derived from another monomer(s). Examples of the other monomer include a maleic anhydride as represented by formula (a4-1), an itaconic acid anhydride as represented by formula (a4-2), or a compound, such as a norbornene, which has a polymerizable double bond between carbons as represented by formula (a4-3). The compound having a polymerizable double bond can be incorporated into a copolymer through a radical polymerization.

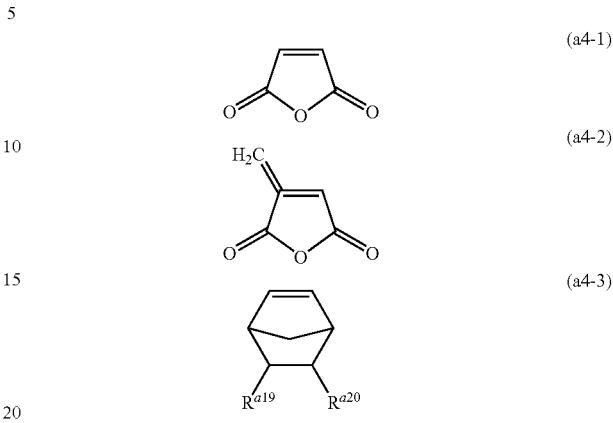

In formula (a4-3), $R^{a19}$ and $R^{a20}$ each independently represent a hydrogen atom, a $C_{1-3}$ aliphatic hydrocarbon group which may contain a substituent (e.g., a hydroxyl group), a cyano group, a carboxyl group, or an alkoxycarbonyl group (—COOR$^{a21}$). When each of $R^{a19}$ and $R^{a20}$ is a carboxyl group, $R^{a19}$ and $R^{a20}$ may be bonded to each other to form a carboxylic acid anhydride. $R^{a21}$ represents a linear or branched $C_{1-8}$ aliphatic hydrocarbon group or a $C_{4-36}$ alicyclic hydrocarbon group, and a methylene group of the alicyclic hydrocarbon group may be substituted with an oxygen atom or a carboxyl group.

Examples of each of $R^{a19}$ and $R^{a20}$ include a methyl group, an ethyl group, a propyl group, a hydroxymethyl group, a 2-hydroxyethyl group, and —COOR$^{a21}$. Examples of $R^{a21}$ include a methyl group, an ethyl group, a propyl group, a 2-oxo-oxolan-3-yl group, and a 2-oxo-oxolan-4-yl group.

Examples of the compound (a4-3) include 2-norbornene, 2-hydroxy-5-norbornene, 5-norbornene-2-carboxylic acid, methyl 5-norbornene-2-carboxylate, 2-hydroxy-1-ethyl 5-norbornene-2-carboxylate, 5-norbornene-2-methanol, and 5-norbornene-2,3-dicarboxylic acid anhydride.

Although the compound (a4-3) having an acid-labile group, such as an alkoxycarbonyl group —COOR$^{a21}$ containing an oxy group (—O—) bonded to a tertiary carbon atom (other than the bridgehead carbon atoms of the bridged cyclic hydrocarbon group) (that is, an ester having a tertiary alcohol residue), has a bulky norbornene ring structure, the compound (a4-3) easily cleaves due to an effect of an acid, and can improve solubility of a copolymer. Examples of the compound (a4-3) having an acid-labile group include t-butyl 5-norbornene-2-carboxylate, 1-cyclohexyl-1-methylethyl 5-norbornene-2-carboxylate, 1-methylcyclohexyl 5-norbornene-2-carboxylate, 2-methyl-2-adamantyl 5-norbornene-2-carboxylate, 2-ethyl-2-adamantyl 5-norbornene-2-carboxylate, 1-(4-methylcyclohexyl)-1-methylethyl 5-norbornene-2-carboxylate, 1-(4-hydroxycyclohexyl)-1-methylethyl 5-norbornene-2-carboxylate, 1-methyl-1-(4-oxocyclohexyl)ethyl 5-norbornene-2-carboxylate, and 1-(1-adamantyl)-1-methylethyl 5-norbornene-2-carboxylate.

The content ratio of a structural unit derived from the other monomers in the copolymer (A1) is usually 2 to 40 mole %, preferably 3 to 30 mole % and more preferably 5 to 20 mole % based on the total structural unit of the copolymer (A1).

<Acid Generator (B)>

The photoresist composition contains the acid generator (B) (preferably, a photoacid generator) in an amount which is preferably 1 part by mass or more (more preferably 3 parts by mass or more), with respect to 100 parts by mass of the resin (A), and is preferably 20 parts by mass or less (more preferably 15 parts by mass or less, and even more preferably 10 parts by mass or less), with respect to 100 parts by mass of the resin (A).

The acid generator is classified into nonionic acid generators (e.g., organohalides, sulfonic acid esters, and sulfones), and ionic acid generators, and ionic acid generators are preferably used. The ionic acid generator contains inorganic anions (e.g., $BF_4^-$, $PF_6^-$, $AsF_6^-$, and $SbF_6^-$), or organic anions (e.g., a sulfonate anion, and a bissulfonyl amine anion). Among them, the ionic acid generator which contains a sulfonate anion is preferable. The acid generator (B) is preferably a sulfonate represented by formula (B1):

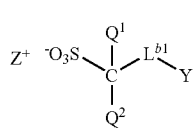

(B1)

In formula (B1), $Q^1$ and $Q^2$ each independently represent a fluorine atom or a $C_{1-6}$ perfluoroalkyl group. Examples of the $C_{1-6}$ perfluoroalkyl group include a perfluoromethyl group, a perfluoroethyl group, a perfluoro-n-propyl group, a perfluoroisopropyl group, a perfluorobutyl group, a perfluoro-sec-butyl group, a perfluoro-tert-butyl group, a perfluoropentyl group, and a perfluorohexyl group. Among them, a perfluoromethyl group and a fluorine atom are preferable, and a fluorine atom is more preferable.

In formula (B1), Y represents a $C_{3-36}$ alicyclic hydrocarbon group which may have one or more substituent. One or more methylene group contained in the alicyclic hydrocarbon group may be replaced by an oxygen atom or a carbonyl group. Examples of the alicyclic hydrocarbon group include the same as those of the monomer of the resin (A). Among them, an adamantyl group which may have one or more substituent, and an oxoadamantyl group which may have one or more substituent are preferable.

Examples of the substituent for Y include a halogen atom, a hydroxyl group, a linear or branched $C_{1-12}$ aliphatic hydrocarbon group, a $C_{3-12}$ alicyclic hydrocarbon group, a hydroxyl group-containing $C_{1-12}$ aliphatic hydrocarbon group, a $C_{1-12}$ alkoxy group, a $C_{6-20}$ aromatic hydrocarbon group, a $C_{7-21}$ aralkyl group, a $C_{2-4}$ acyl group, a glycidyloxy group, and $-(CH_2)_{m2}-O-CO-R^{b1}$ group (wherein $R^{b1}$ represents a linear or branched $C_{1-12}$ aliphatic hydrocarbon group, a $C_{3-16}$ alicyclic hydrocarbon group, or a $C_{6-20}$ aromatic hydrocarbon group, m2 represents an integer ranging from 0 to 4, and when m2 is 0, it means that no methylene group is contained). Examples of the halogen atom include a fluorine atom, a chlorine atom, a bromine atom, and an iodine atom. Examples of the linear or branched aliphatic hydrocarbon group and the alicyclic hydrocarbon group include the same as those of the resin (A). The hydroxyl group-containing aliphatic hydrocarbon group is, for example, a hydroxymethyl group. Examples of the alkoxy group include a methoxy group, an ethoxy group, a propoxy group, an isopropoxy group, and a butoxy group. Examples of the aromatic hydrocarbon group include a phenyl group, a naphthyl group, an anthranyl group, a p-methylphenyl group, a p-tert-butylphenyl group, and a p-adamantylphenyl group. Examples of the aralkyl group include a benzyl group, a phenethyl group, a phenylpropyl group, a trityl group, a naphthylmethyl group, and a naphthylethyl group. Examples of the acyl group include an acetyl group, a propionyl group, and a butyryl group. When a plurality of substituents are contained, the plurality of substituents may be the same or different from each other.

Examples of the alicyclic hydrocarbon group include alicyclic hydrocarbon groups represented by formulae (W1) to (W24):

(W1)

(W2)

(W3)

(W4)

(W5)

(W6)

(W7)

(W8)

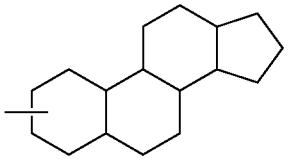

(W9)

(W10)

(W11)

(W12)

(W13) 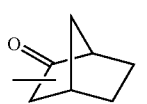

(W14) 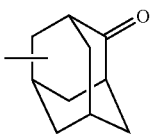

(W15) 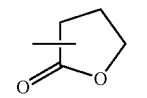

(W16) 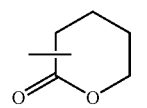

(W17) 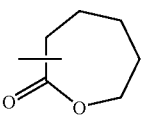

(W18) 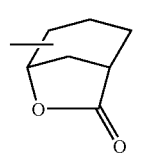

(W19) 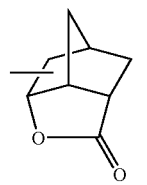

(W20) 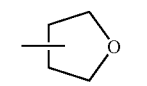

(W21) 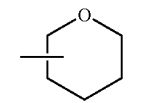

(W22) 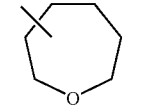

(W23) 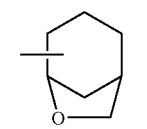

(W24) 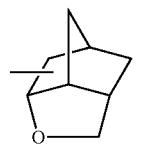

Among them, the alicyclic hydrocarbon groups represented by formula (W11) (which has an adamantane ring), formula (W14) (which has a 2-oxoadamantane ring), formula (W15) (which has a γ-butyrolactone ring), and formula (W19) (which has a condensed ring obtained by condensation of a γ-butyrolactone ring with a norbornane ring) are preferable, and the alicyclic hydrocarbon groups represented by formulae (W11) and (W14) are more preferable.

Examples of the alicyclic hydrocarbon group having an aliphatic hydrocarbon group are as follows:

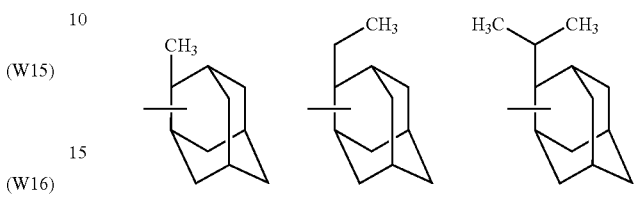

Examples of the alicyclic hydrocarbon group having an aromatic hydrocarbon group are as follows:

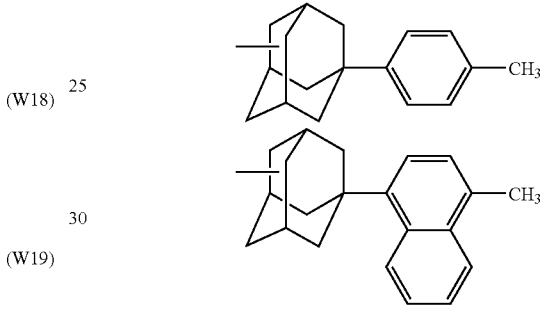

Examples of the alicyclic hydrocarbon group having —$(CH_2)_{m2}$—O—CO—$R^{b1}$ group are as follows:

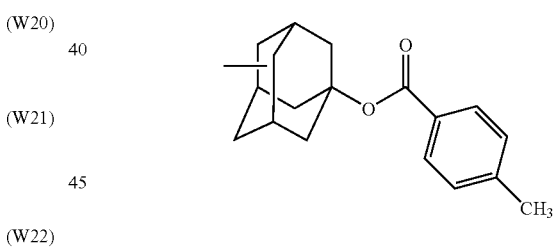

Examples of the alicyclic hydrocarbon group having hydroxyl group or a hydroxyl group-containing aliphatic hydrocarbon group are as follows:

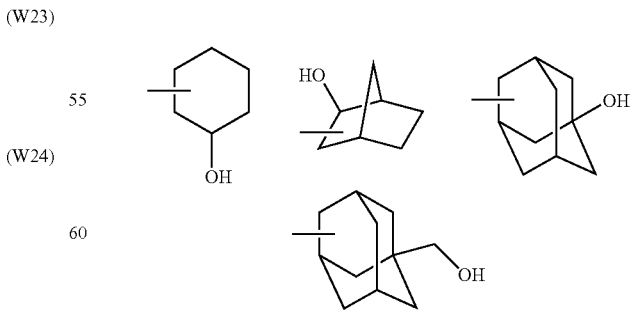

In formula (B1), $L^{b1}$ represents a single bond, an oxygen atom (—O—), a carbonyl group (—CO—), a linear or branched $C_{1-17}$ alkanediyl group (preferably, a linear or branched $C_{1-4}$ alkanediyl group), or a combination of two or more members selected from the group consisting of an oxygen atom, a carbonyl group, and a $C_{1-17}$ alkanediyl group.

Examples of the alkanediyl group for $L^{b1}$ include a methylene group, an ethylene group, a propane-1,3-diyl group, a propane-1,2-diyl group, a butane-1,4-diyl group, a butane-1,3-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group.

The alkanediyl group for $L^{b1}$ may contain, as a side chain thereof, a linear or branched aliphatic hydrocarbon group or an alicyclic hydrocarbon group (preferably, a linear or branched $C_{1-4}$ aliphatic hydrocarbon group). Examples of the side chain of the alkanediyl group include a methyl group, an ethyl group, a propyl group, an isopropyl group, a butyl group, a sec-butyl group, a tert-butyl group, a pentyl group, a hexyl group, a heptyl group, an octyl group, a 2-ethylhexyl group, a nonyl group, a decyl group, an undecyl group, and a dodecyl group.

$L^{b1}$ may be a combination of two or more members selected from the group consisting of an oxygen atom, a carbonyl group, and a $C_{1-17}$ alkanediyl group. Examples of the combination are the same as described for $L^{a1}$ and $L^{a2}$.

$L^{b1}$ is preferably any one of linking portions indicated as formulae (b1-1) to (b1-4) as follows. Formulae (b1-1) to (b1-4) each contain Y in order to indicate a bonding direction.

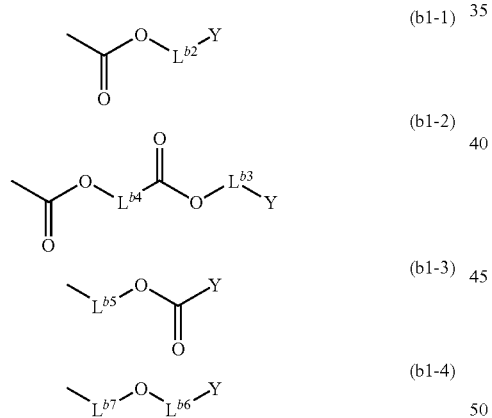

In formulae (b1-1) to (b1-4), $L^{b2}$ represents a single bond, or a linear or branched $C_{1-15}$ alkanediyl group, $L^{b3}$ represents a single bond, a linear or branched $C_{1-15}$ alkanediyl group, or a combination of an oxygen atom with a linear or branched $C_{1-15}$ alkanediyl group, and $L^{b4}$ to $L^{b7}$ each independently represent a linear or branched $C_{1-15}$ alkanediyl group. The number of carbon atoms in the alkanediyl group represented by each of $L^{b2}$ to $L^{b7}$ is preferably 1 to 6, and is more preferably 1 to 4, and is even more preferably 1 or 2. Among them, the linking portion (b1-1) is preferable, and the linking portion (b1-1) in which $L^{b2}$ is a single bond or a methylene group is more preferable.

Among the sulfonate anions each of which has the linking portion (b1-1), the anions represented by formulae (b1-1-1) to (b1-1-9) are preferable.

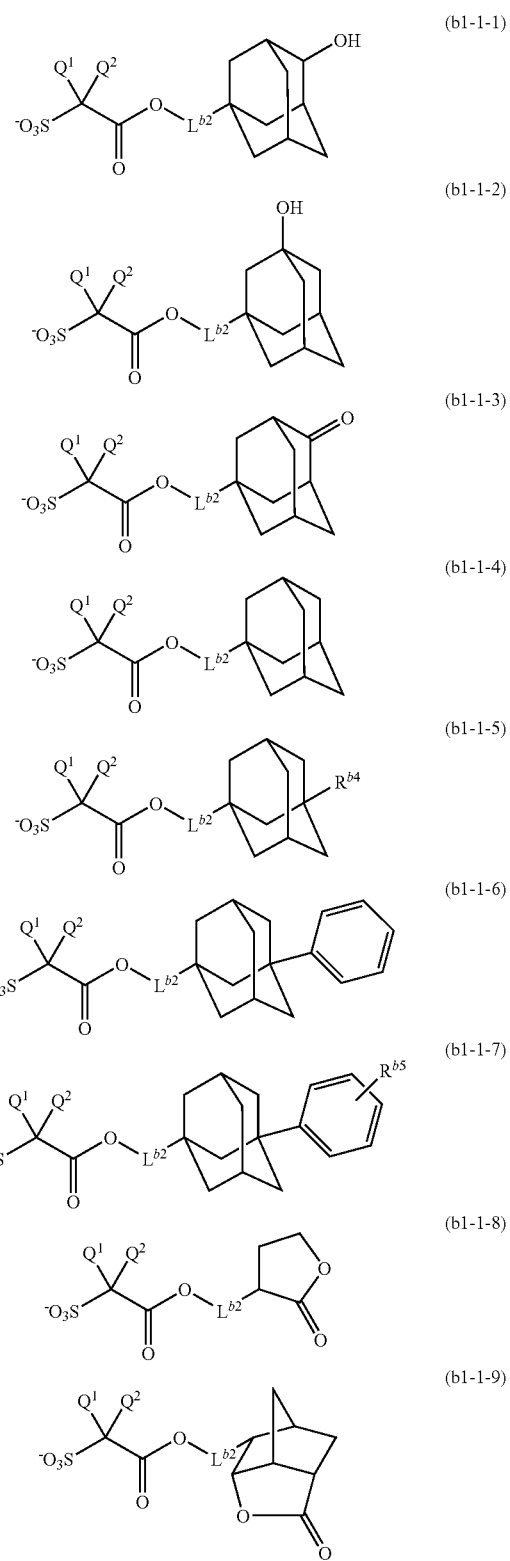

In formulae (b1-1-1) to (b1-1-9), $Q^1$, $Q^2$, and $L^{b2}$ are the same as described above. $R^{b4}$ and $R^{b5}$ each independently represent a $C_{1-4}$ aliphatic hydrocarbon group (preferably, a methyl group).

Next, specific examples of a sulfonate anion will be described. Firstly, examples of a sulfonate anion which contains the linking portion (b1-1) and an alicyclic hydrocarbon group having no substituent, and examples of a sulfonate anion which contains the linking portion (b1-1) and an alicyclic hydrocarbon group having an aliphatic hydrocarbon group as a substituent, are indicated below:
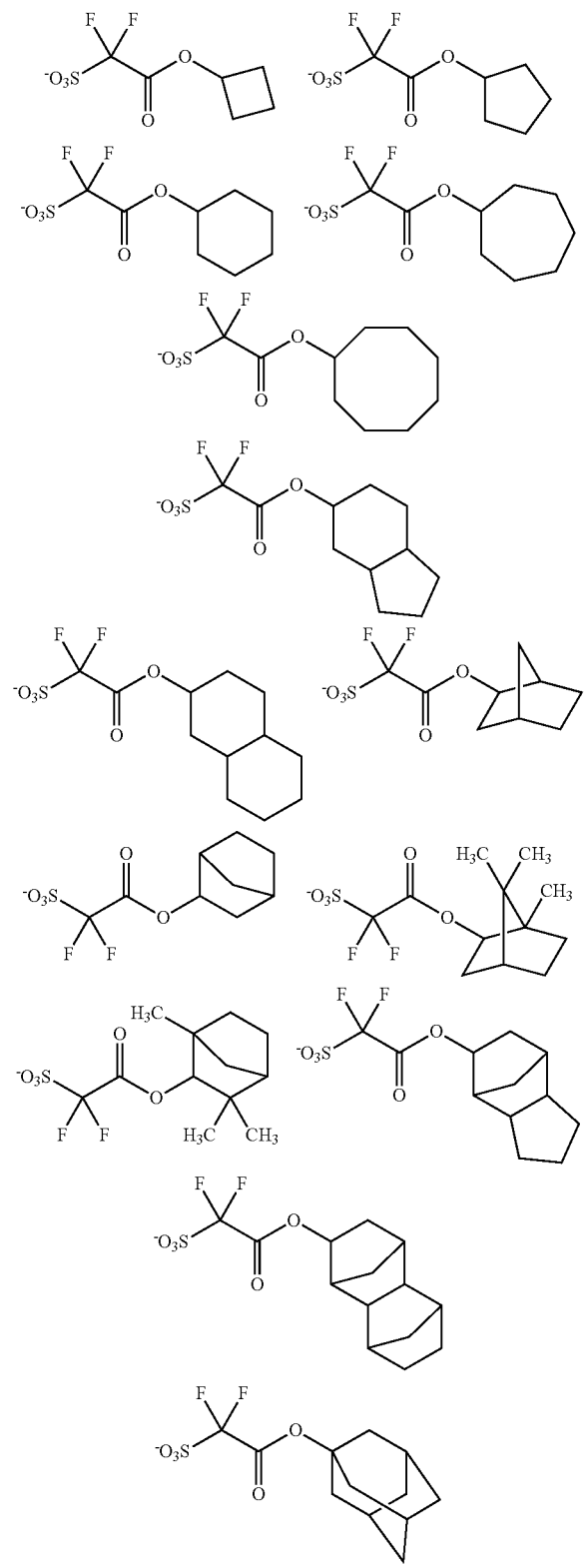
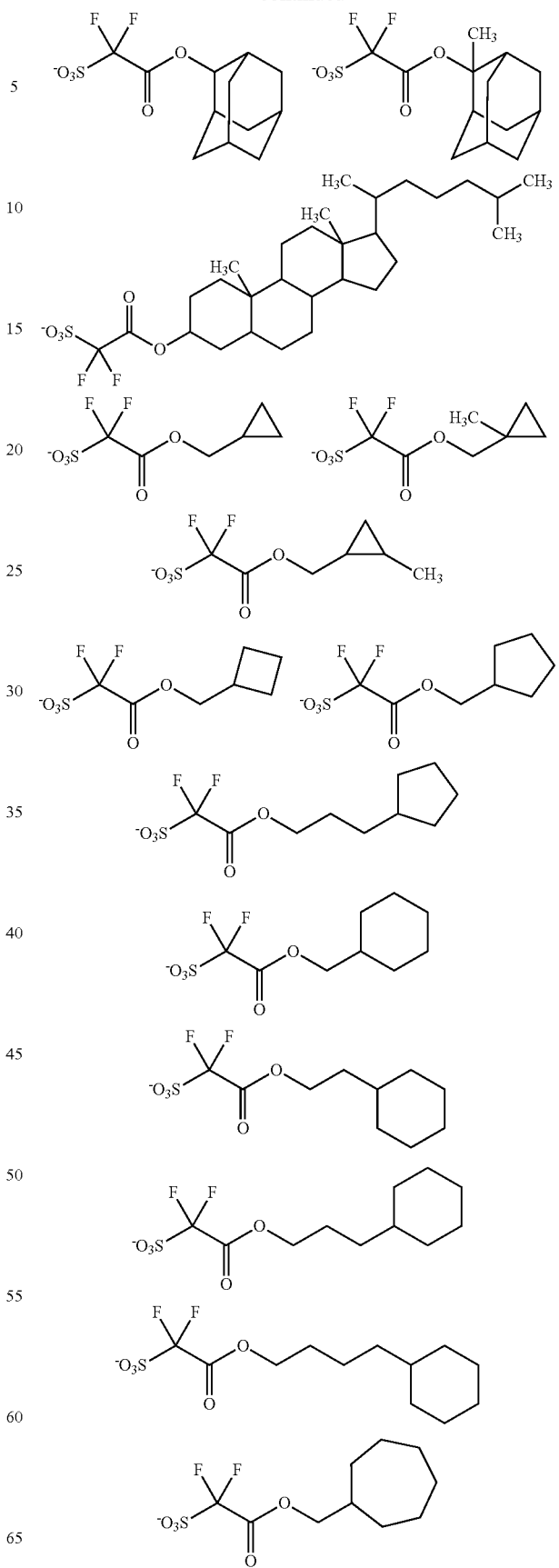

-continued
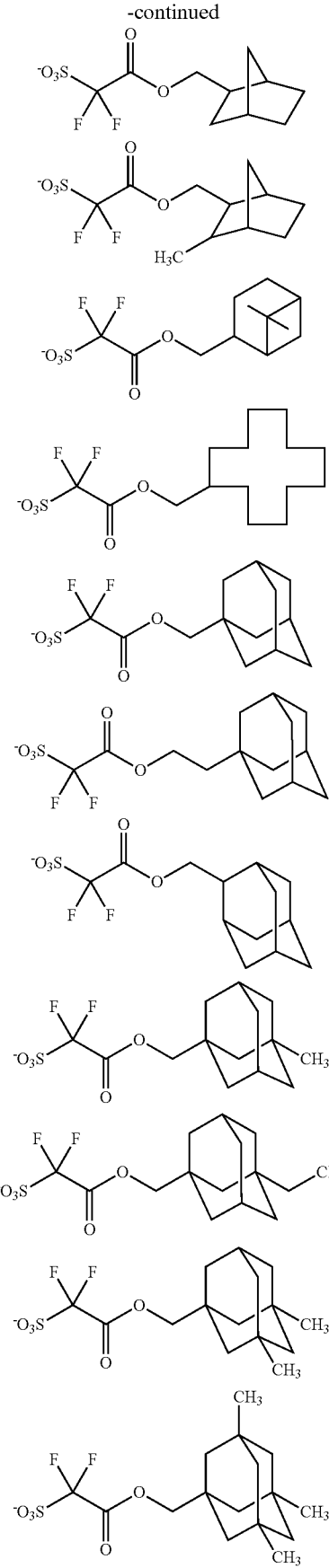
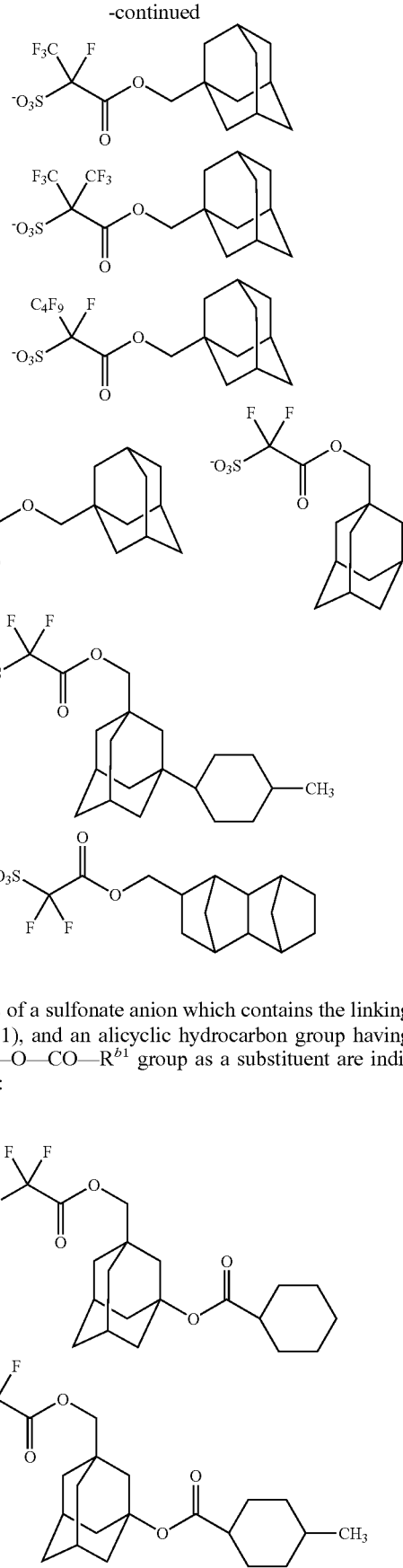
Examples of a sulfonate anion which contains the linking portion (b1-1), and an alicyclic hydrocarbon group having —$(CH_2)_{m2}$—O—CO—$R^{b1}$ group as a substituent are indicated below:

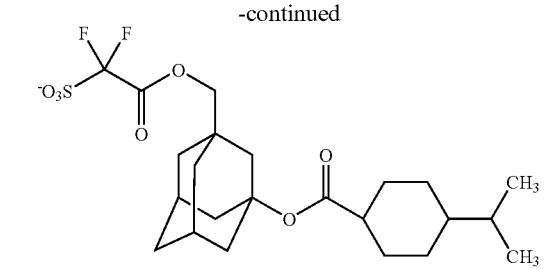
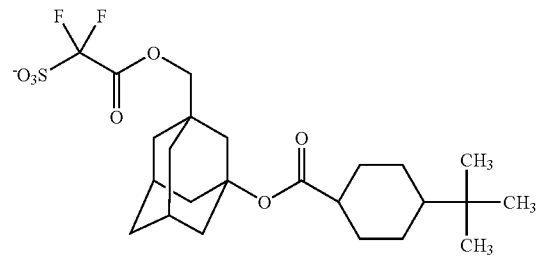
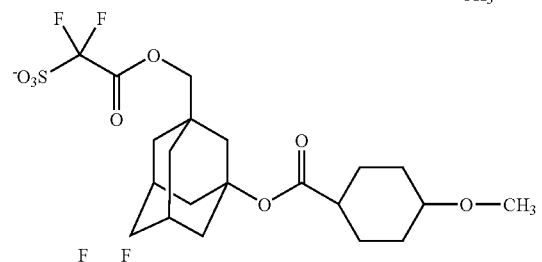
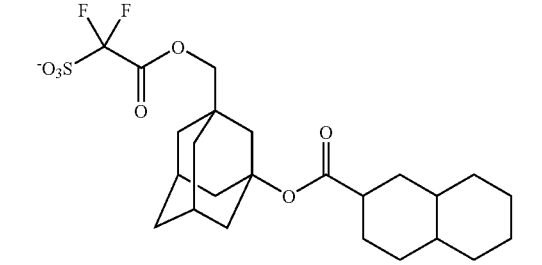
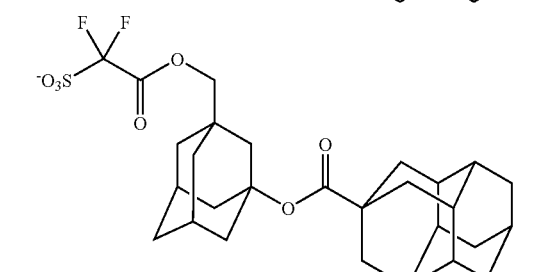
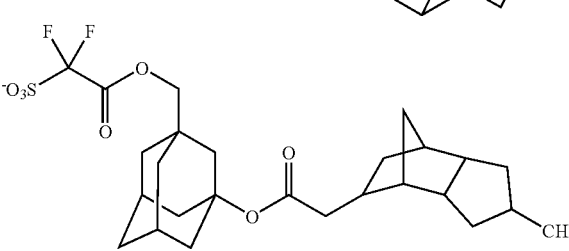
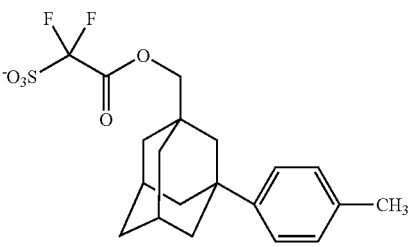
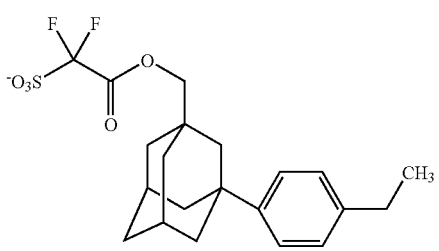
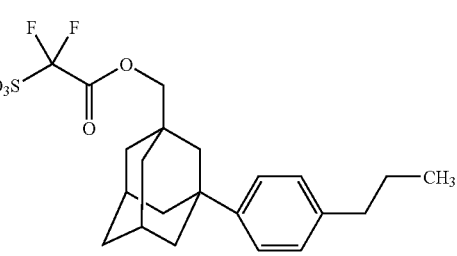
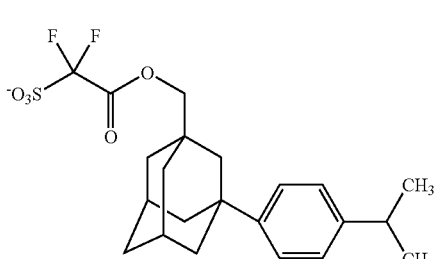
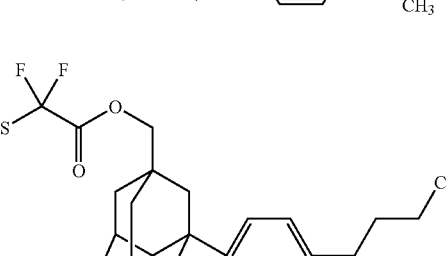
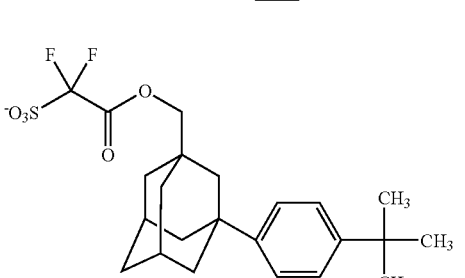
Examples of a sulfonate anion which contains the linking portion (b1-1), and an alicyclic hydrocarbon group having, as a substituent, an aromatic hydrocarbon group or an aralkyl group, are as follows:

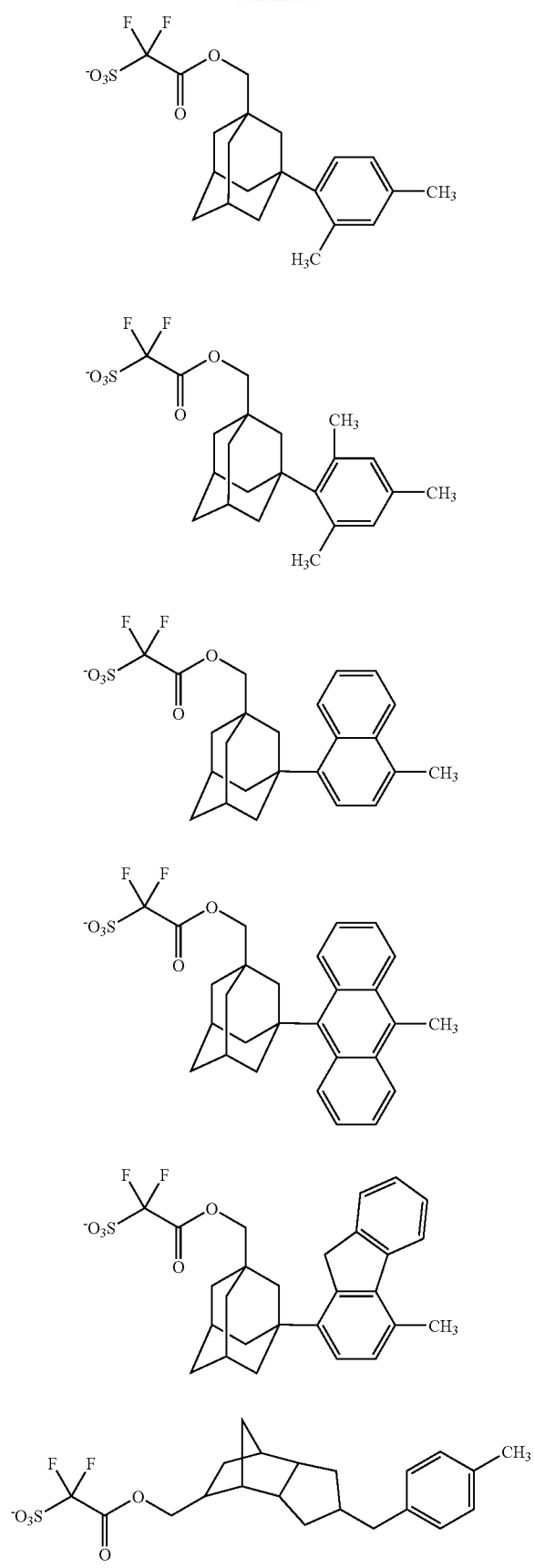
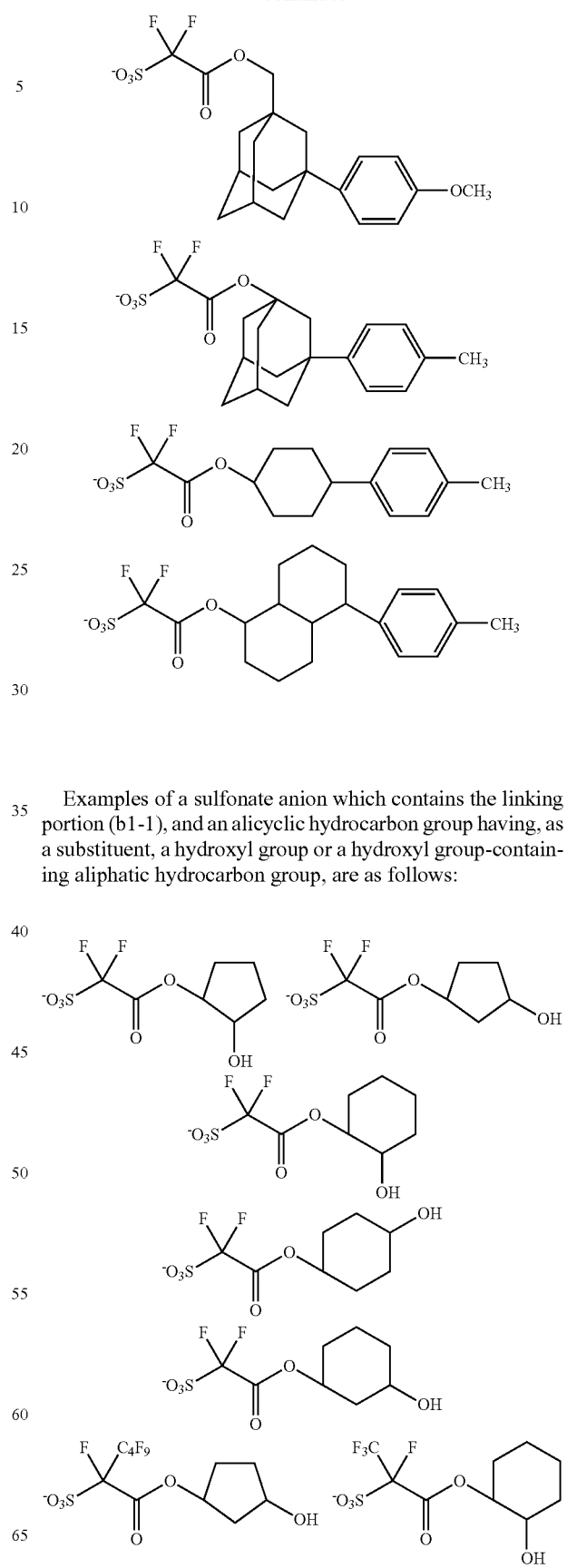
Examples of a sulfonate anion which contains the linking portion (b1-1), and an alicyclic hydrocarbon group having, as a substituent, a hydroxyl group or a hydroxyl group-containing aliphatic hydrocarbon group, are as follows:

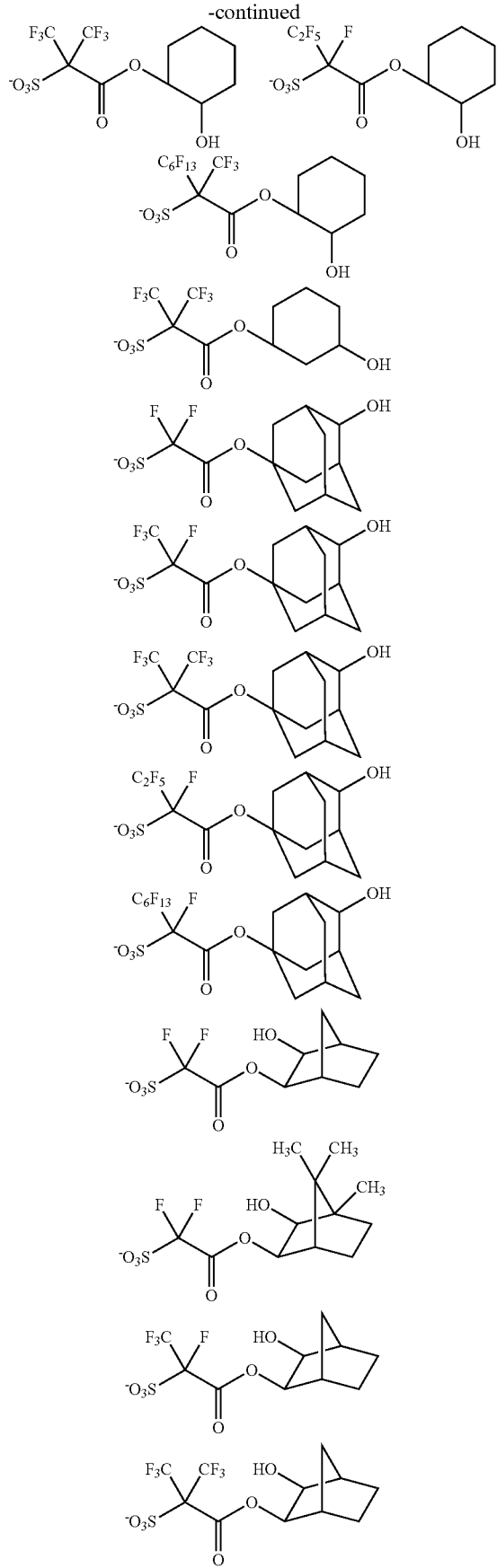
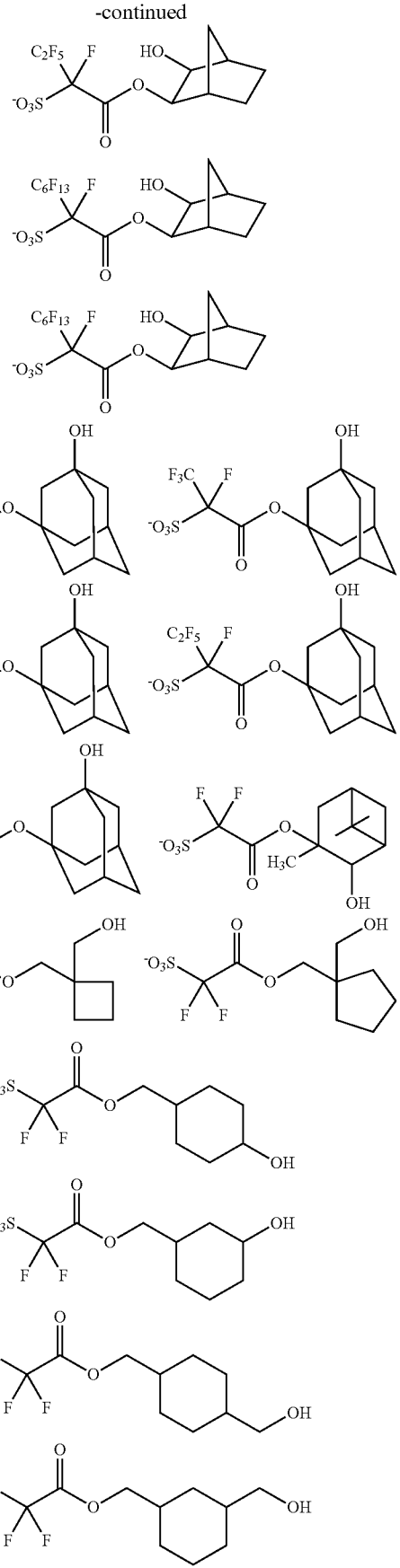

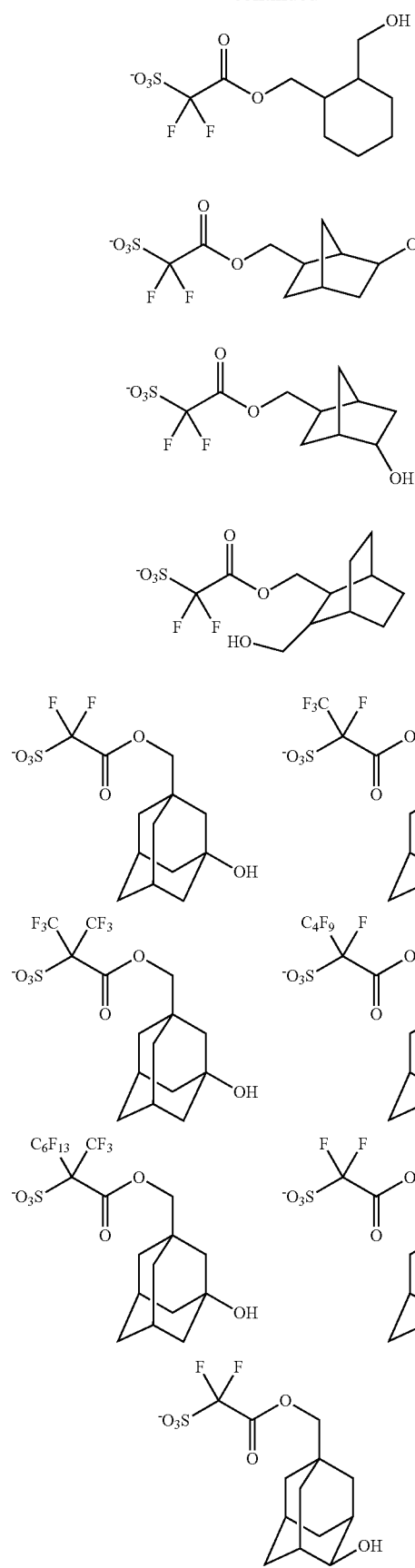
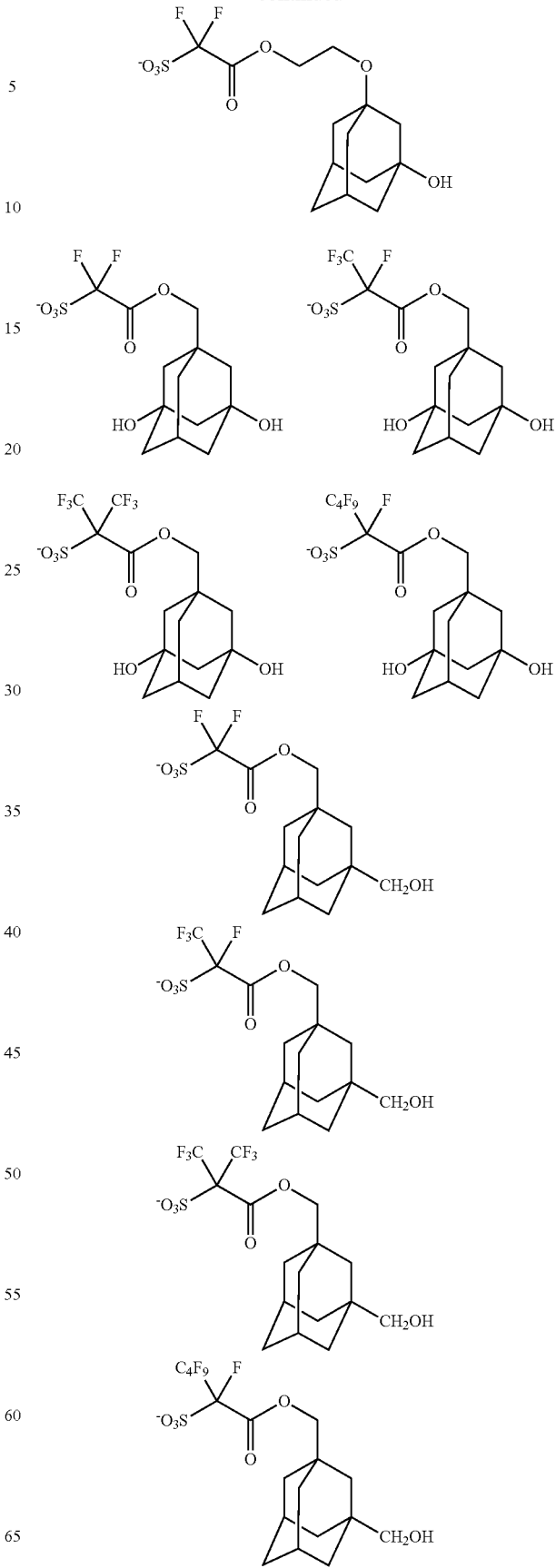

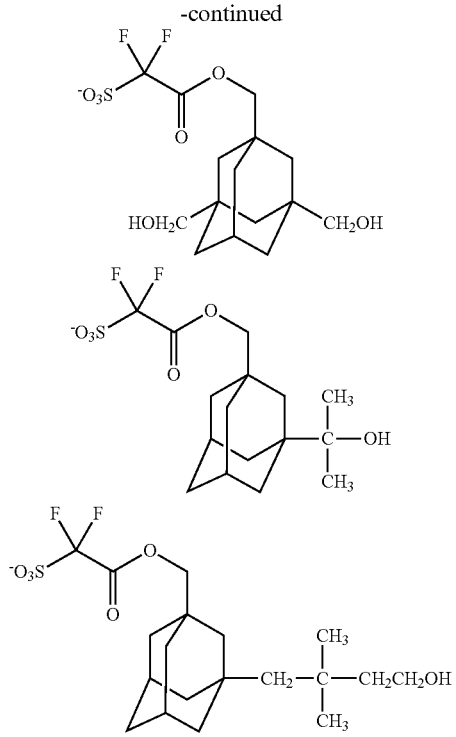
Examples of a sulfonate anion which contains the linking portion (b1-1) and a cyclic ether part are as follows:
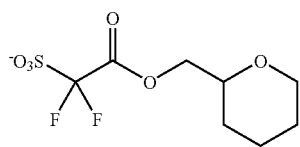
Examples of a sulfonate anion which contains the linking portion (b1-1) and a lactone ring will be indicated below.
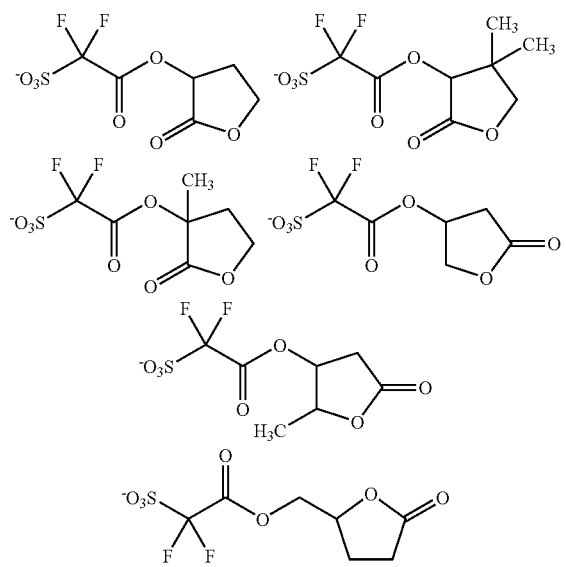
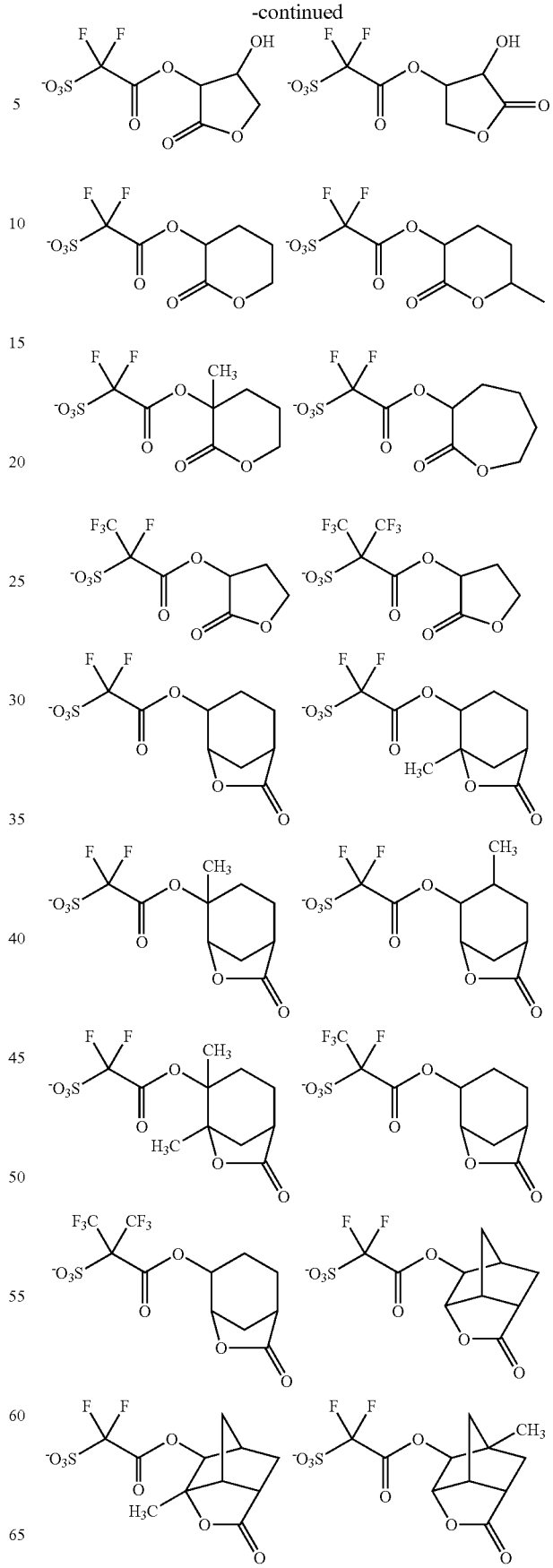

-continued
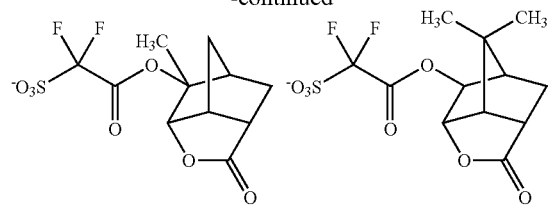
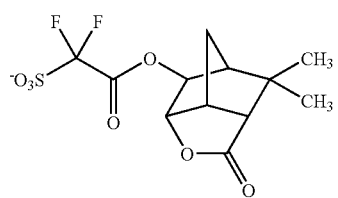
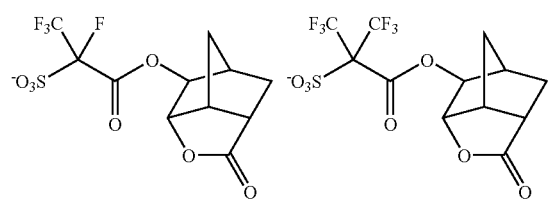
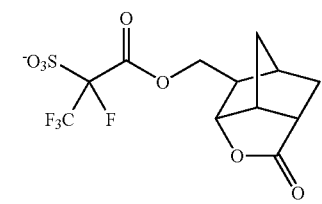
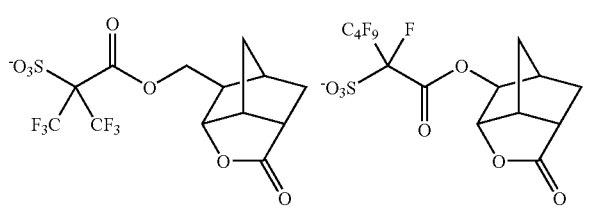
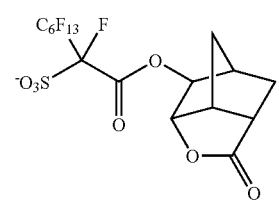
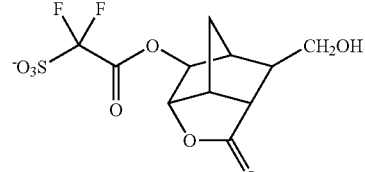
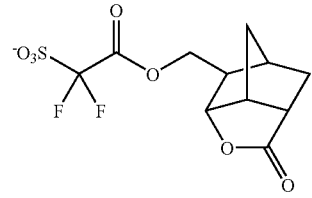
-continued
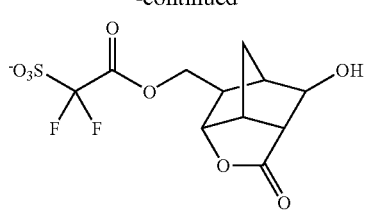
Examples of a sulfonate anion which contains the linking portion (b1-1) and an alicyclic hydrocarbon group having an oxo group are as follows:
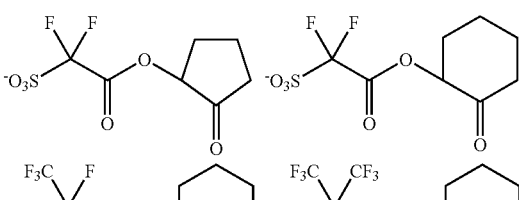
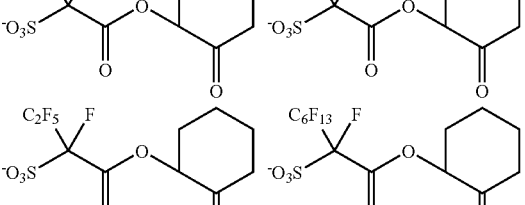
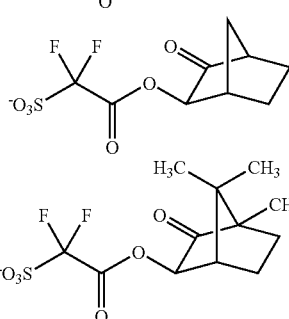
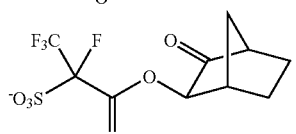
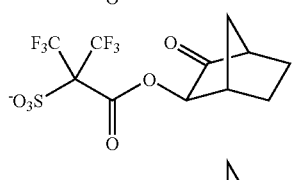
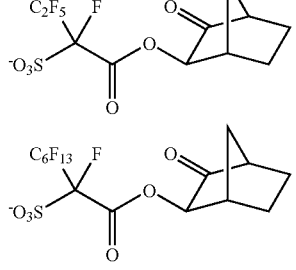

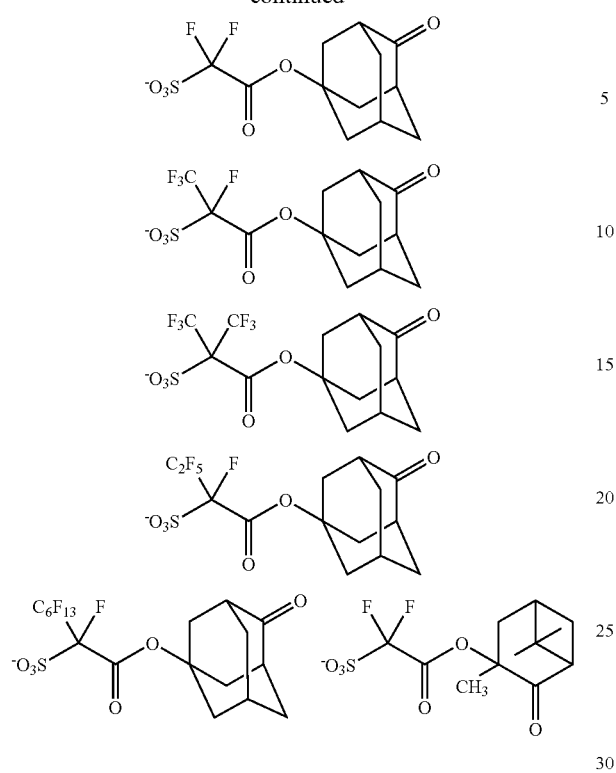
Examples of a sulfonate anion which contains the linking portion (b1-2) and an alicyclic hydrocarbon group having no substituent, and examples of a sulfonate anion which contains the linking portion (b1-2), and an alicyclic hydrocarbon group having an aliphatic hydrocarbon group as a substituent, are as follows:
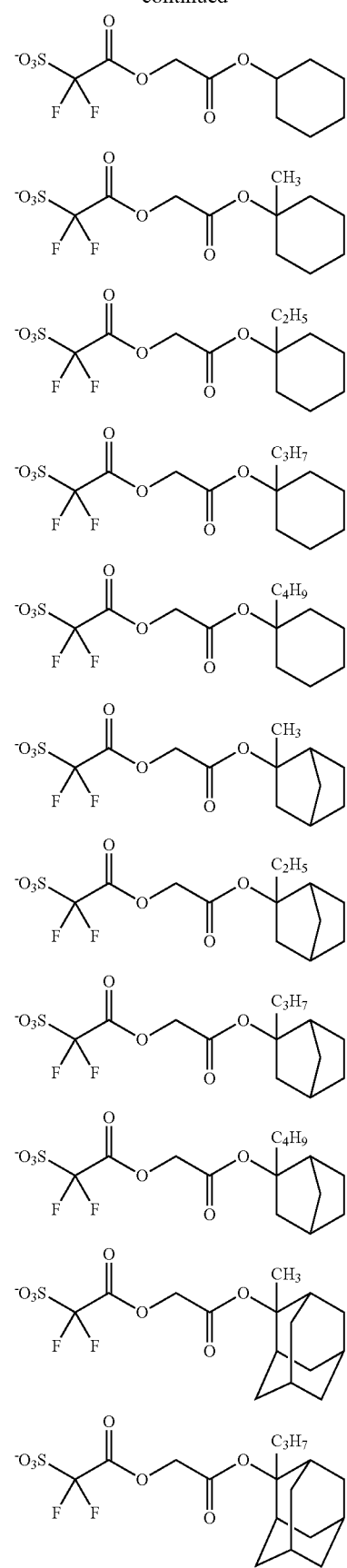

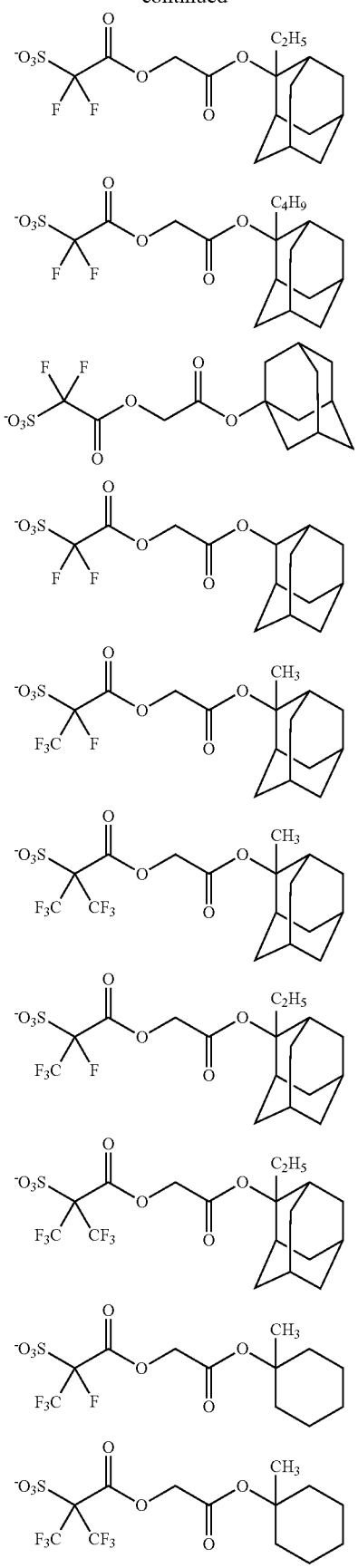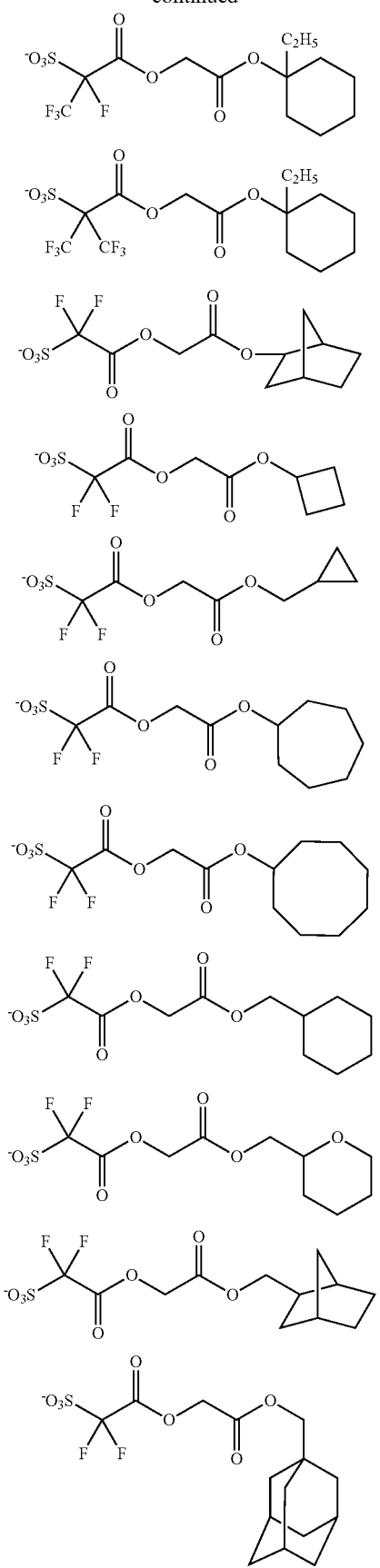

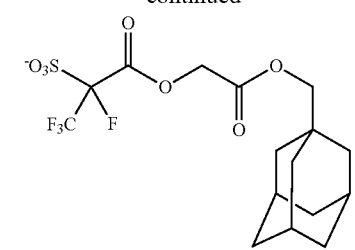
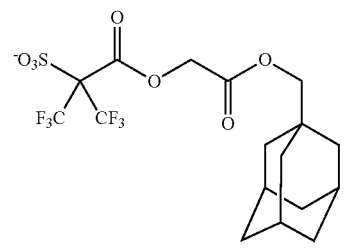
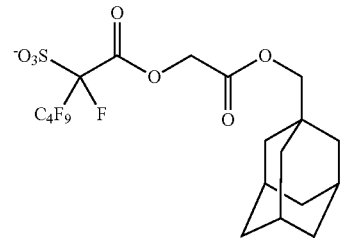
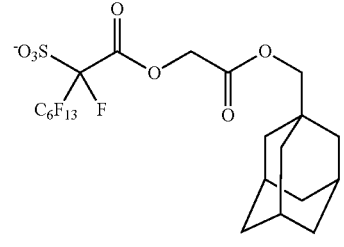
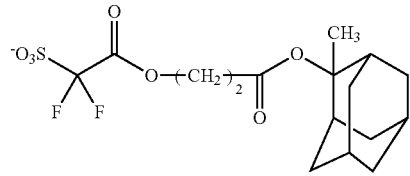
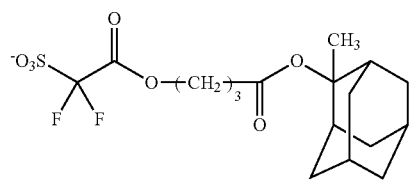
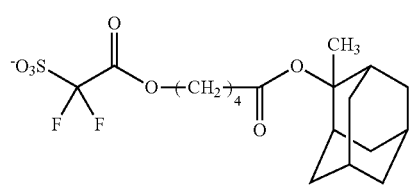
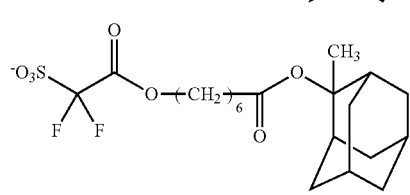

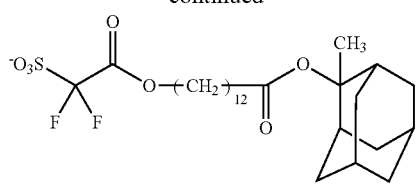
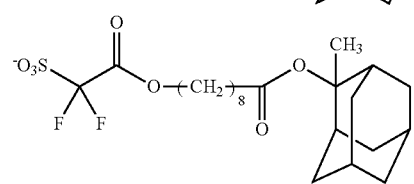
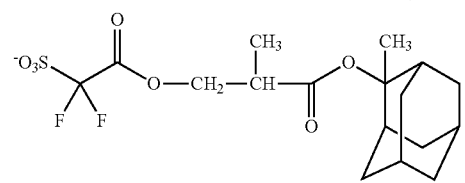
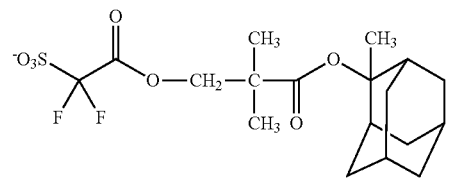

Examples of a sulfonate anion which contains the linking portion (b1-2) and an alicyclic hydrocarbon group having —$(CH_2)_{m2}$—O—CO—$R^{b1}$ group as a substituent are as follows:

Examples of a sulfonate anion which contains the linking portion (b1-2) and an alicyclic hydrocarbon group having, as a substituent, a hydroxyl group or a hydroxyl group-containing aliphatic hydrocarbon group are as follows:

73
-continued
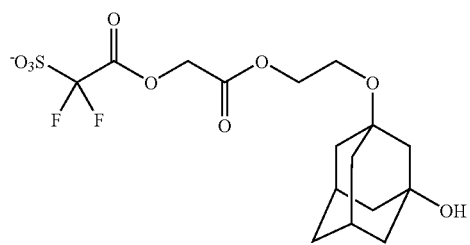
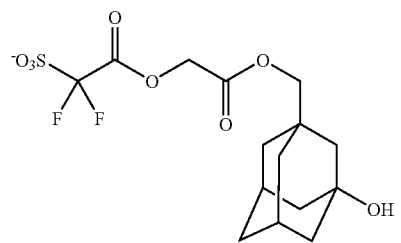
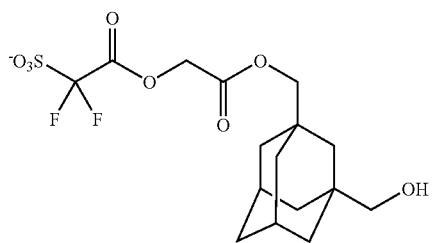
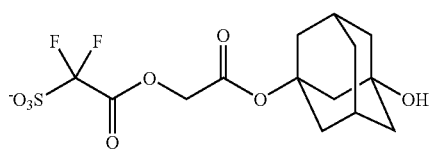
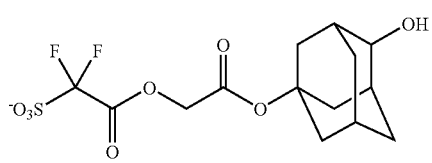
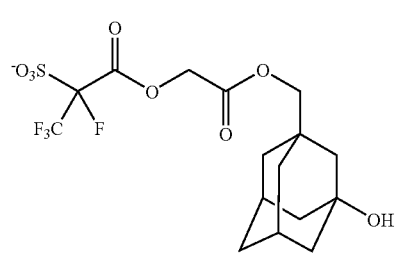
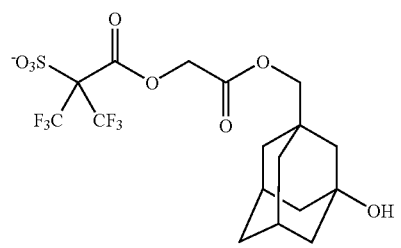
74
-continued
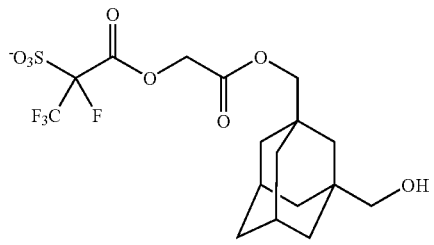
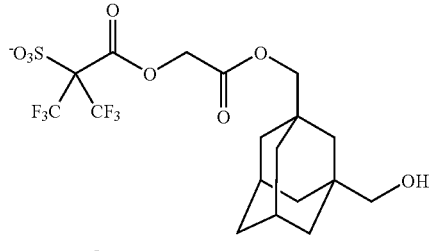
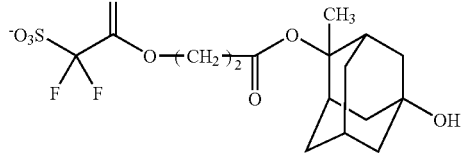
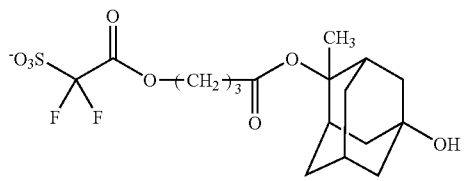
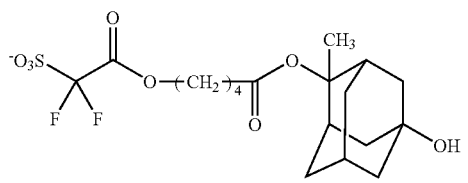
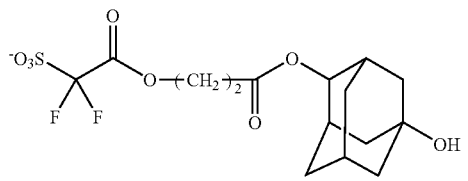
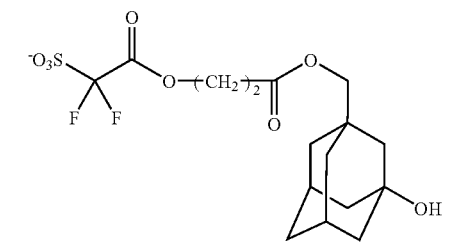
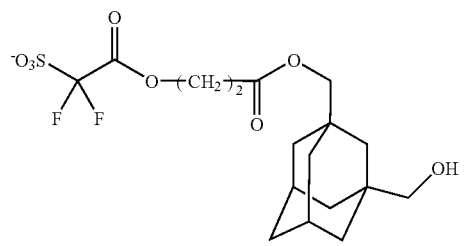

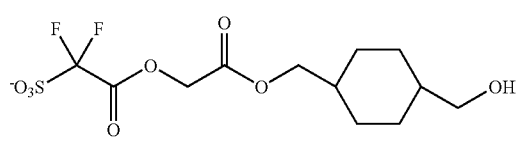
Examples of a sulfonate anion which contains the linking portion (b1-2) and a lactone ring are as follows:
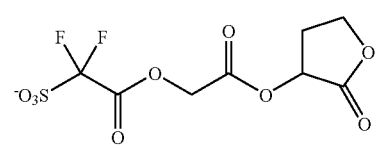
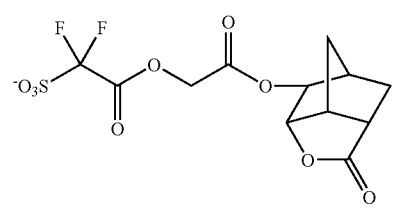
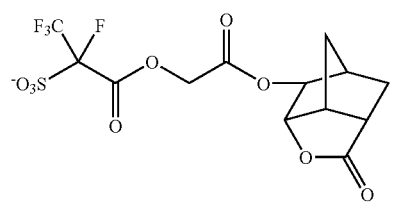
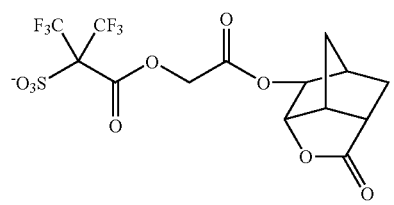
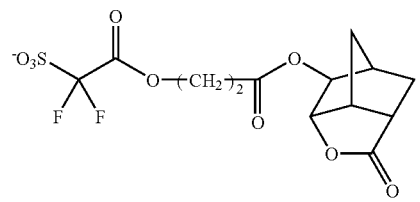
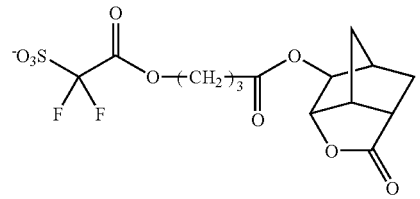
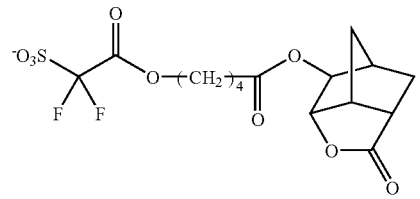
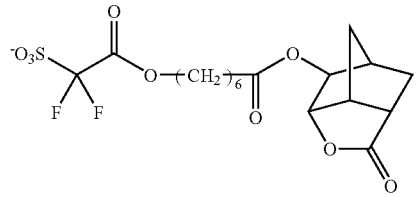
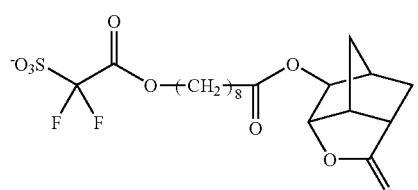
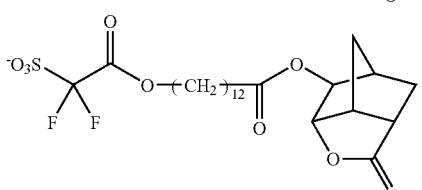
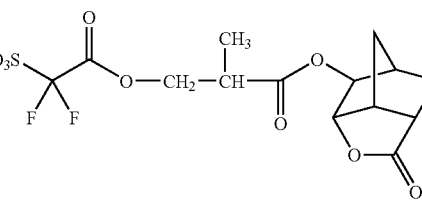
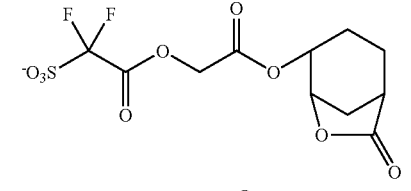
Examples of a sulfonate anion which contains the linking portion (b1-2) and an alicyclic hydrocarbon group having an oxo group are as follows:
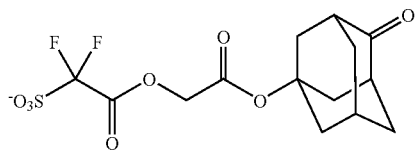

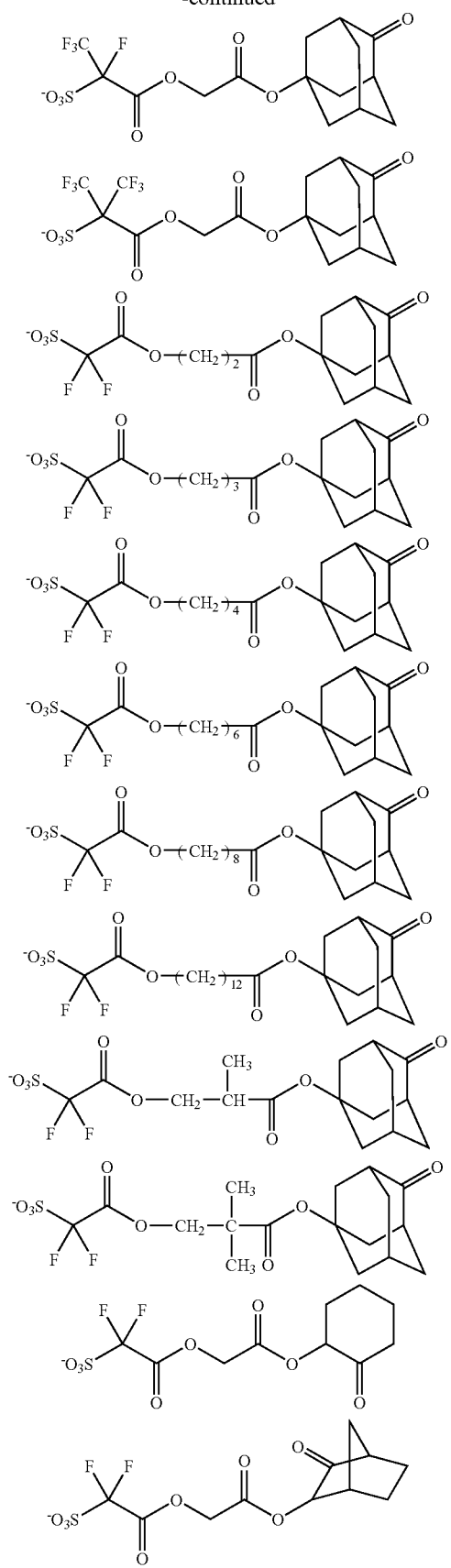

Examples of a sulfonate anion which contains the linking portion (b1-2) and an alicyclic hydrocarbon group having an aromatic hydrocarbon group as a substituent are as follows:

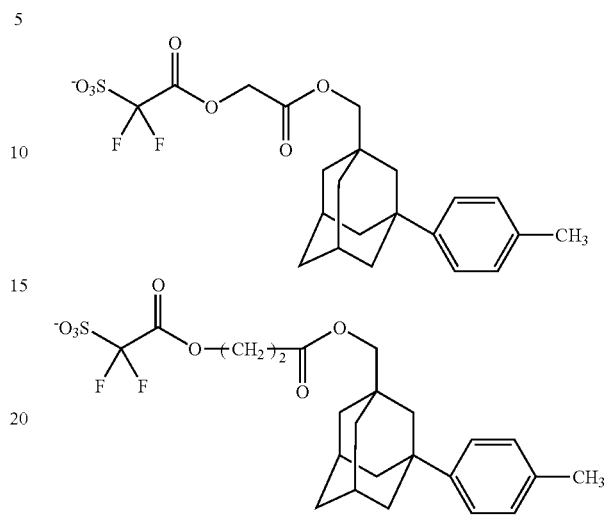

Examples of a sulfonate anion which contains the linking portion (b1-3) and an alicyclic hydrocarbon group having no substituent, and examples of a sulfonate anion which contains the linking portion (b1-3) and an alicyclic hydrocarbon group having an aliphatic hydrocarbon group as a substituent, are as follows:

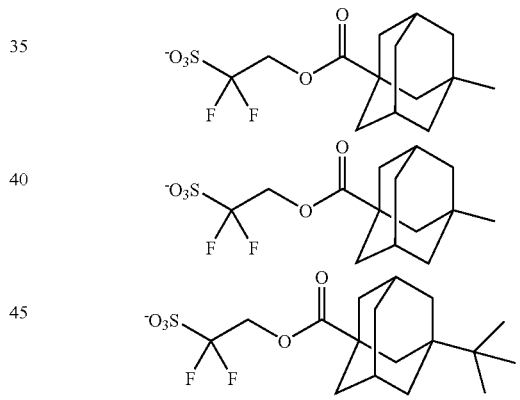

Examples of a sulfonate anion which contains the linking portion (b1-3) and an alicyclic hydrocarbon group having an alkoxy group as a substituent are as follows:

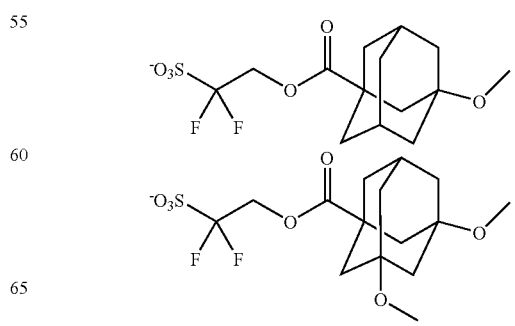

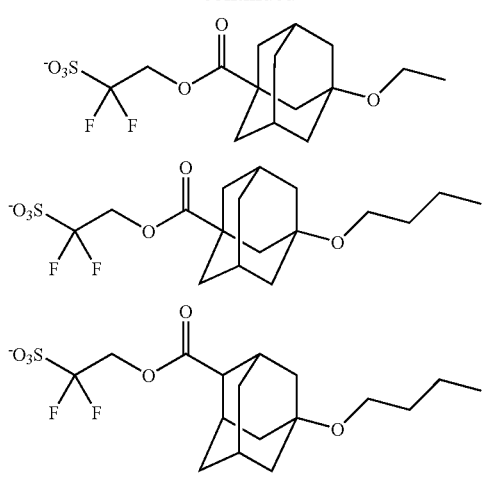

Examples of a sulfonate anion which contains the linking portion (b1-3) and an alicyclic hydrocarbon group having, as a substituent, a hydroxyl group or a hydroxyl group-containing aliphatic hydrocarbon group are as follows:

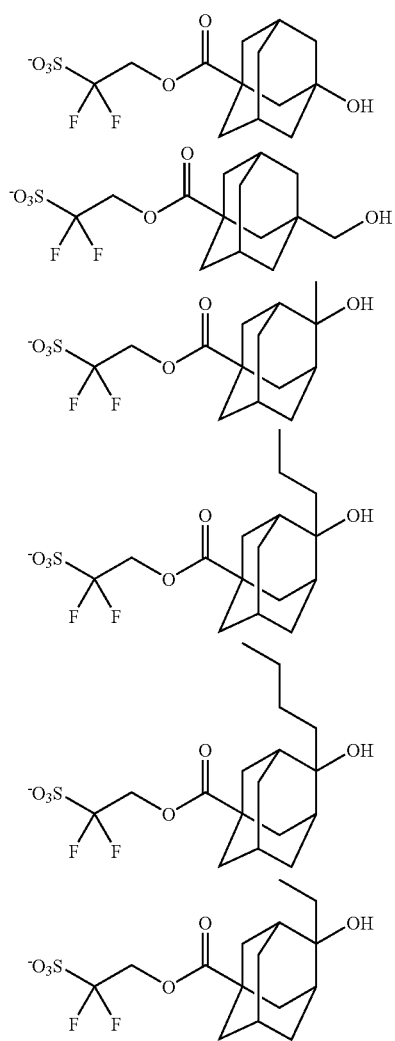

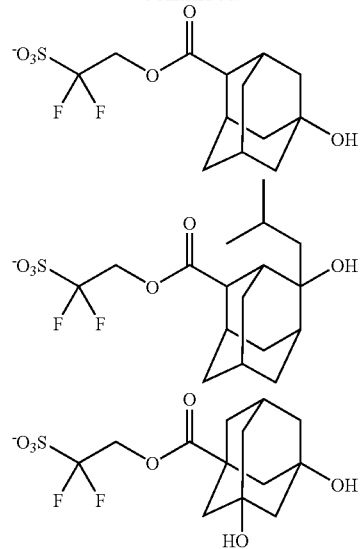

Examples of a sulfonate anion which contains the linking portion (b1-3) and an alicyclic hydrocarbon group having an oxo group are as follows:

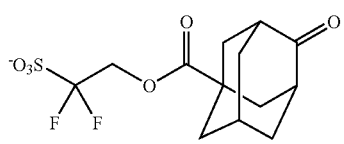

Examples of a sulfonate anion which contains the linking portion (b1-4) and an alicyclic hydrocarbon group having an aliphatic hydrocarbon group as a substituent are as follows:

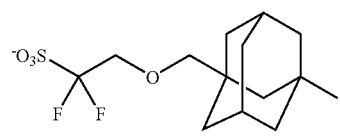

Examples of a sulfonate anion which contains the linking portion (b1-4) and an alicyclic hydrocarbon group having an alkoxy group as a substituent are as follows:

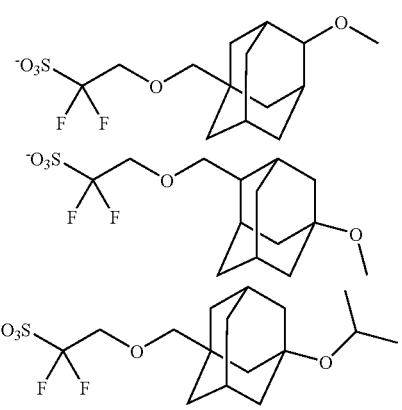

-continued

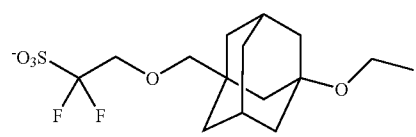

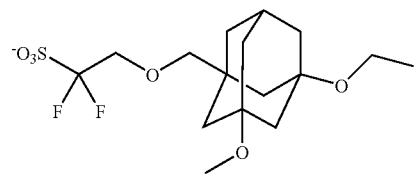

Examples of a sulfonate anion which contains the linking portion (b1-4) and an alicyclic hydrocarbon group having, as a substituent, a hydroxyl group or a hydroxyl group-containing aliphatic hydrocarbon group are as follows:

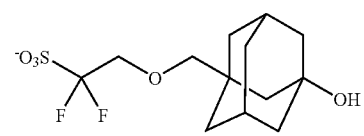

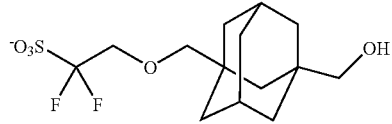

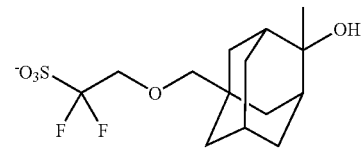

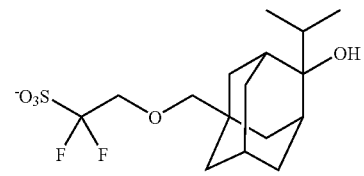

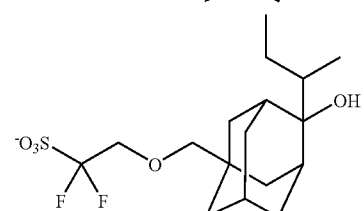

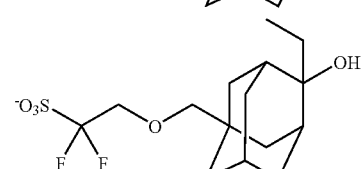

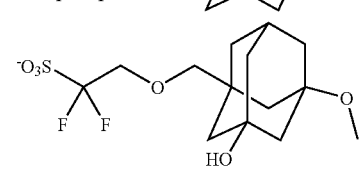

-continued

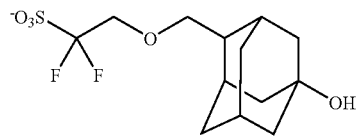

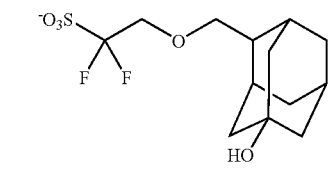

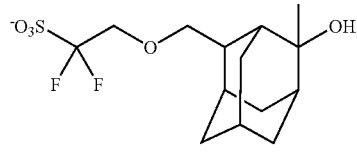

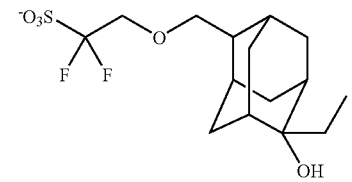

Examples of a sulfonate anion which contains the linking portion (b1-4) and an alicyclic hydrocarbon group having an oxo group are as follows:

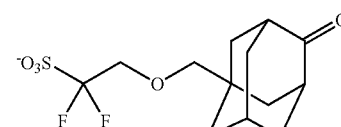

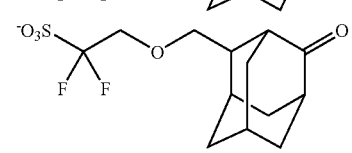

Among them, the preferable sulfonate anion which contains the linking portion (b1-1) includes the followings:

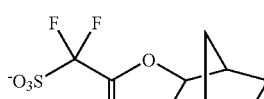
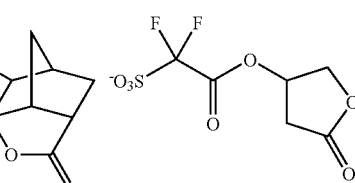

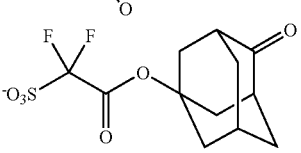

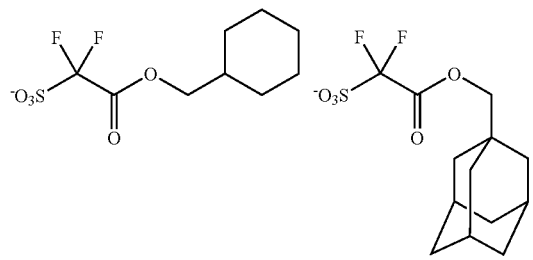
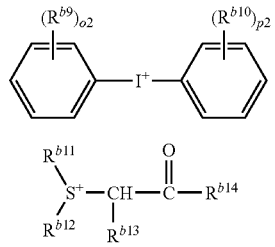
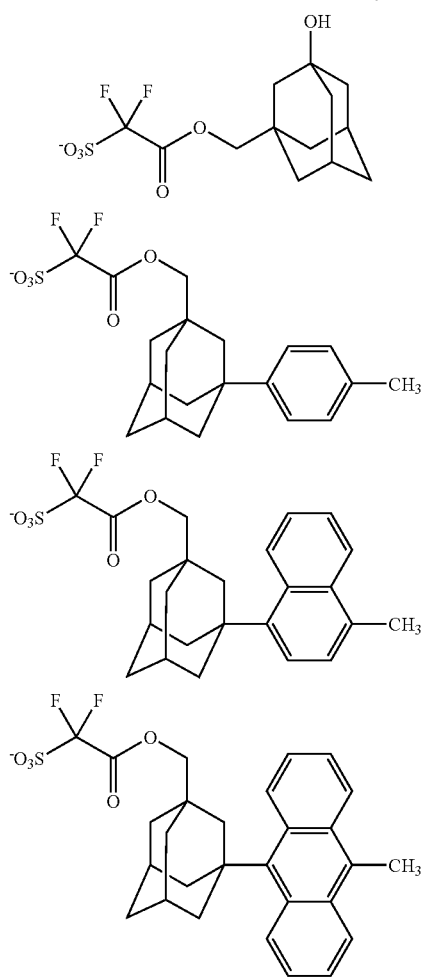
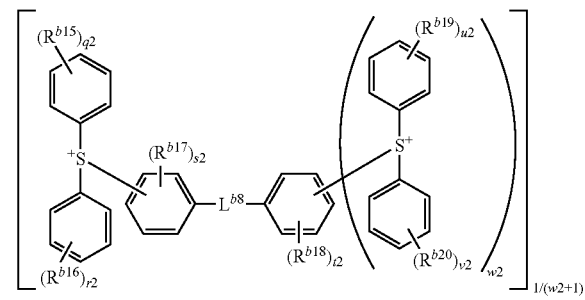

In formula (b2-1), $R^{b6}$ to $R^{b8}$ each independently represent a linear or branched $C_{1-30}$ aliphatic hydrocarbon group, a $C_{3-30}$ alicyclic hydrocarbon group, or a $C_{6-20}$ aromatic hydrocarbon group. The aliphatic hydrocarbon group or the aromatic hydrocarbon group may have a substituent such as a hydroxyl group, a linear or branched $C_{1-12}$ alkoxy group, or the like. Further, the aromatic hydrocarbon group may have a substituent such as a linear or branched $C_{1-12}$ aliphatic hydrocarbon group, a $C_{4-36}$ alicyclic hydrocarbon group, or the like.

In formula (b2-2), $R^{b9}$ and $R^{b10}$ each independently represent a hydroxyl group, a linear or branched $C_{1-12}$ aliphatic hydrocarbon group or a linear or branched $C_{1-12}$ alkoxy group. "o2" and "p2" each independently represent 0 or 1. When o2 is 0, it means that $R^{b9}$ is absent. When p2 is 0, it means that $R^{b10}$ is absent.

In formula (b2-3), $R^{b11}$ and $R^{b12}$ each independently represent a linear or branched $C_{1-12}$ aliphatic hydrocarbon group, or a $C_{3-36}$ (preferably, $C_{4-12}$) alicyclic hydrocarbon group. $R^{b13}$ represents a hydrogen atom, a linear or branched $C_{1-12}$ aliphatic hydrocarbon group, a $C_{4-36}$ alicyclic hydrocarbon group, or a $C_{6-20}$ aromatic hydrocarbon group, and preferably is a hydrogen atom. $R^{b14}$ represents a linear or branched $C_{1-12}$ aliphatic hydrocarbon group, a $C_{3-12}$ alicyclic hydrocarbon group, or a $C_{6-20}$ aromatic hydrocarbon group. The aromatic hydrocarbon group represented by $R^{b13}$ or $R^{b14}$ may have a substituent such as a linear or branched $C_{1-12}$ aliphatic hydrocarbon group, a $C_{3-12}$ alicyclic hydrocarbon group, a hydroxyl group, a linear or branched $C_{1-12}$ alkoxy group, or the like. Further, $R^{b11}$ and $R^{b12}$ may be bonded to each other and $R^{b13}$ and $R^{b14}$ may be bonded to each other such that three- to twelve-membered rings (preferably, three- to six-membered rings) are formed, and a methylene group in any of the rings may be substituted with an oxygen atom (—O—), a sulfur atom (—S—), or a carbonyl group (—CO—).

In formula (b2-4), $R^{b15}$ to $R^{b20}$ each independently represent a hydroxyl group, a linear or branched $C_{1-12}$ aliphatic hydrocarbon group, or a linear or branched $C_{1-12}$ alkoxy group. $L^{b8}$ represents a sulfur atom or an oxygen atom. "q2" to "v2" each independently represent an integer ranging from 0 to 2, and w2 represents 0 or 1. When any of q2 to w2 are 0, it means that the corresponding substituents are absent. When Next, a cation contained in the acid generator (B) will be described. Examples of the cation contained in the acid generator include onium cations such as a sulfonium cation, an iodonium cation, an ammonium cation, a benzothiazolium cation, and a phosphonium cation. Among them, a sulfonium cation and an iodonium cation are preferable, and an arylsulfonium cation is more preferable.

In formula (B1), $Z^+$ is preferably any one of cations represented by formulae (b2-1) to (b2-4):

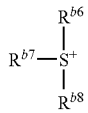

any of q2 to v2 are 2, a plurality of $R^{b15}$ to $R^{b20}$, respectively, may be the same or different from each other.

Next, the substituents contained in formulae (b2-1) to (b2-4) will be described. The aliphatic hydrocarbon group and aromatic hydrocarbon group are, for example, the same as described above. Preferable examples of the aliphatic hydrocarbon group include a methyl group, an ethyl group, an n-propyl group, an isopropyl group, an n-butyl group, a tert-butyl group, an n-heptyl group, an n-hexyl group, and an n-octyl group. Preferable examples of the aromatic hydrocarbon group include a phenyl group, a 4-methyl phenyl group, a 4-ethylphenyl group, a 4-tert-butylphenyl group, a 4-cyclohexylphenyl group, a 4-methoxy phenyl group, and a biphenylyl group. Examples of the alkoxy group include a methoxy group, an ethoxy group, a propoxy group, an isopropoxy group, a butoxy group, a sec-butoxy group, a tert-butoxy group, a pentyloxy group, a hexyloxy group, a heptoxy group, an octoxy group, a 2-ethylhexyloxy group, a nonyloxy group, a decyloxy group, an undecyloxy group, and a dodecyloxy group. Examples of the ring formed by $R^{b11}$ and $R^{b12}$ include a thiolane-1-ium ring (tetrahydrothiophenium ring), a thian-1-ium ring, and a 1,4-oxathian-4-ium ring. Examples of the ring formed by $R^{b13}$ and $R^{b14}$ include an oxocycloheptane ring, an oxocyclohexane ring, an oxonorbornane ring, and an oxoadamantane ring.

Among the cations (b2-1) to (b2-4), the cation (b2-1) is preferable, and the cation represented by the following formula (b2-1-1) is more preferable, and triphenylsulfonium cation (represented by formula (b2-1-1) in which x2=y2=z2=0 is satisfied) is even more preferable.

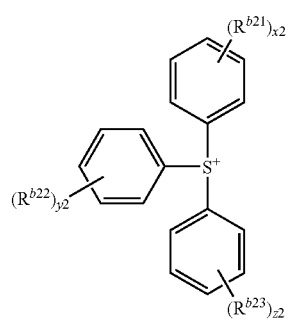

(b2-1-1)

In formula (b2-1-1), $R^{b21}$ to $R^{b23}$ each independently represent a hydroxyl group, a linear or branched $C_{1-12}$ aliphatic hydrocarbon group, or a linear or branched $C_{1-12}$ alkoxy group. "x2" to "z2" each independently represent 0 or 1. When any of x2 to z2 are 0, it means that the corresponding substituents are absent.

Further, in formula (b2-1-1), $R^{b21}$ to $R^{b23}$ may each independently represent a $C_{4-36}$ alicyclic hydrocarbon group. The alicyclic hydrocarbon group is preferably an adamantyl group or an isobornyl group. Further, at least one hydrogen atom on the alicyclic hydrocarbon group may be substituted with a halogen atom, a hydroxyl group, a linear or branched $C_{1-12}$ aliphatic hydrocarbon group, a linear or branched $C_{1-12}$ alkoxy group, a $C_{6-12}$ aryl group, a $C_{7-12}$ aralkyl group, a glycidoxy group, or a $C_{2-4}$ acyl group.

Next, specific examples of the cation contained in the acid generator (B) will be described. Firstly, specific examples of the cation (b2-1-1) are as follows:

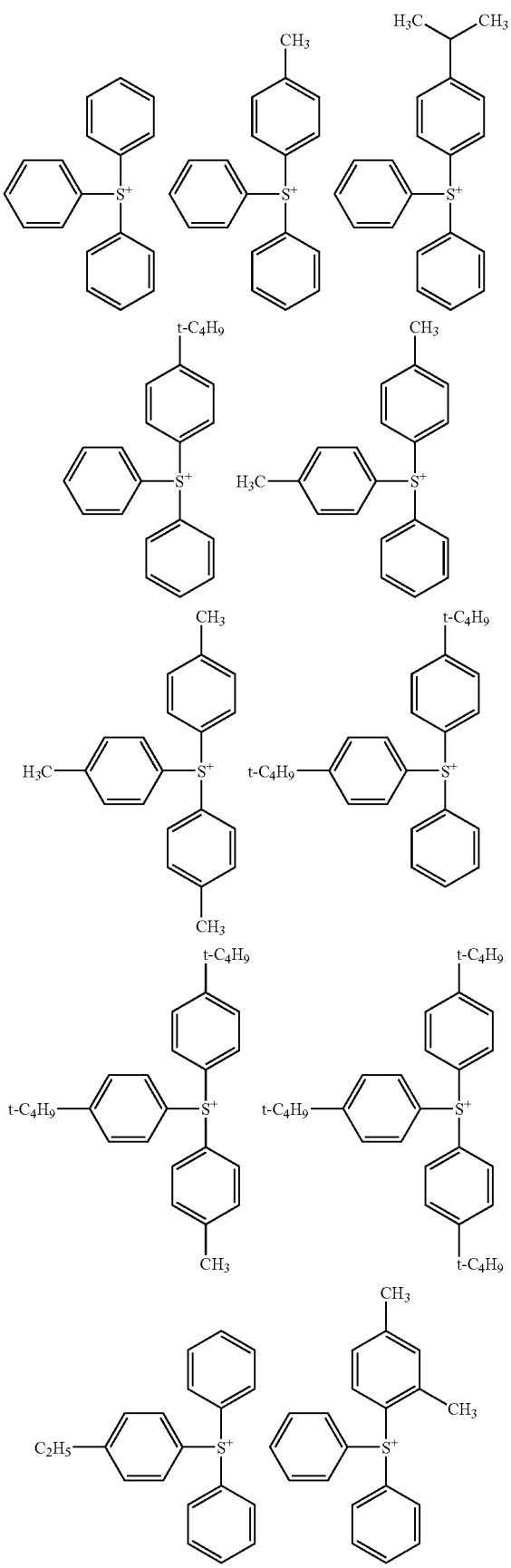

-continued
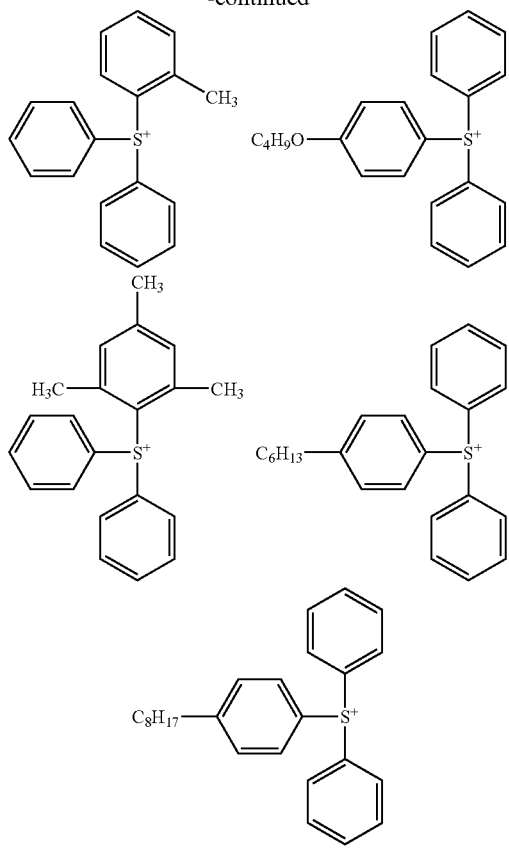
Specific examples of the cation (b2-2) are as follows:
Specific examples of the cation (b2-3) are as follows:
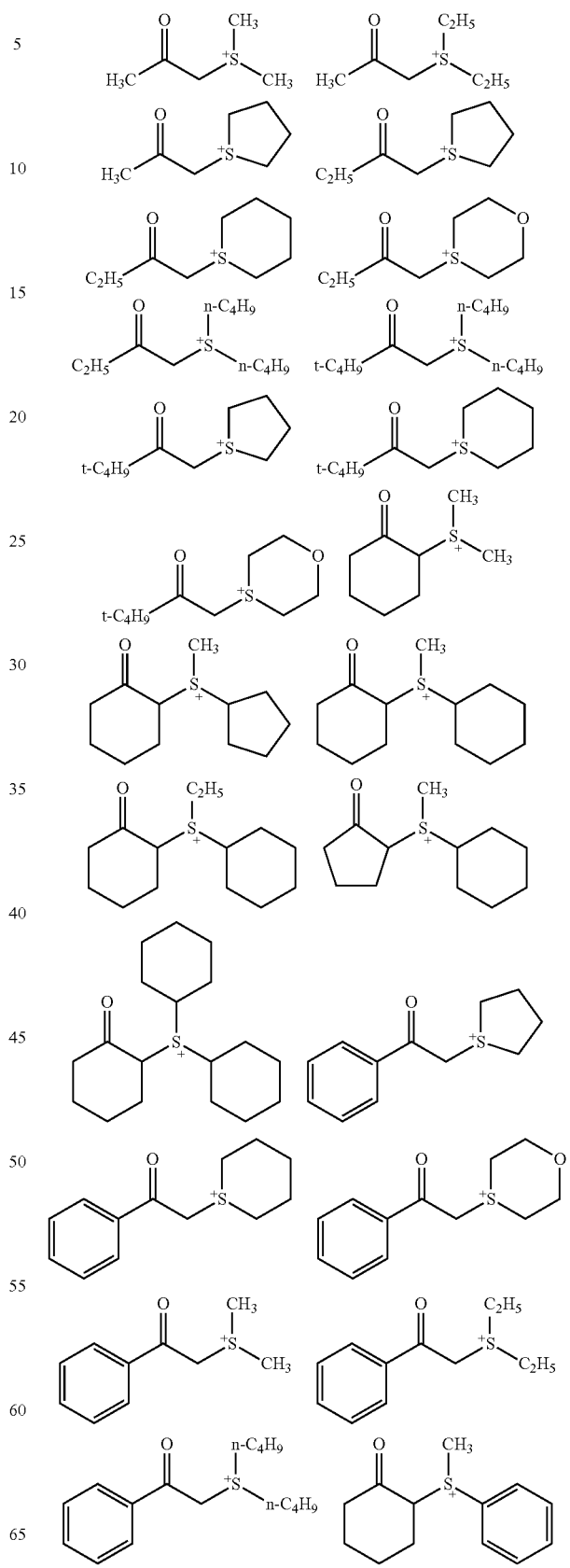

-continued
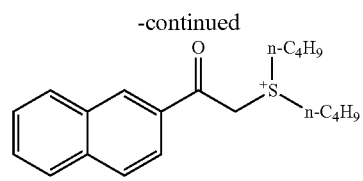
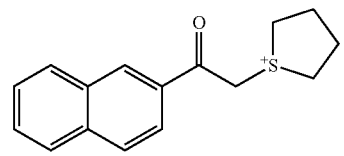
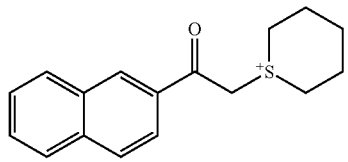
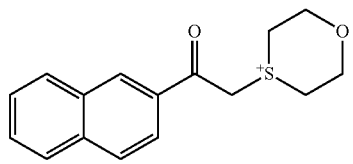
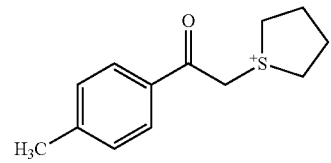
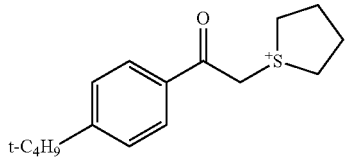
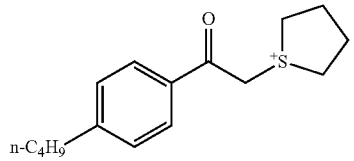
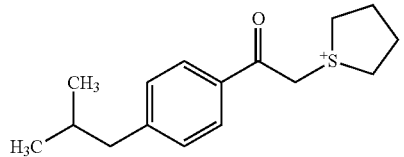
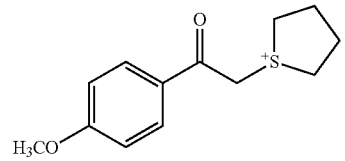
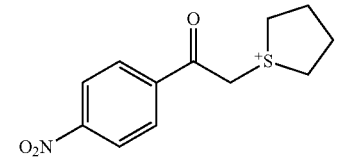
-continued
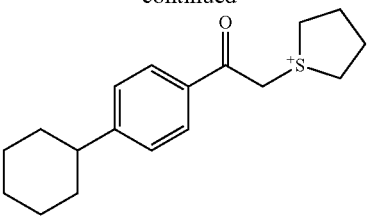
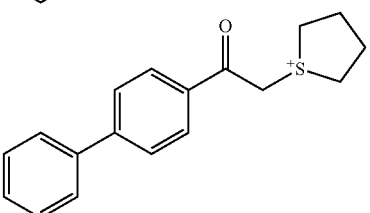
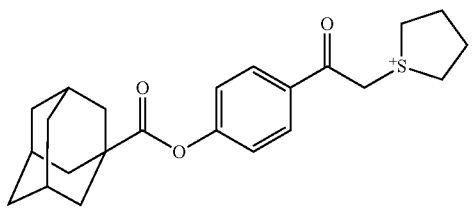
Specific examples of the cation (b2-4) are as follows:
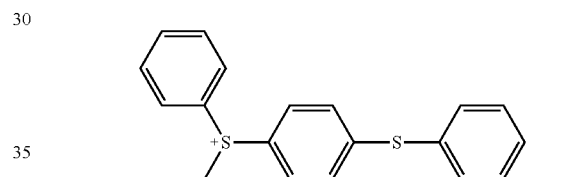
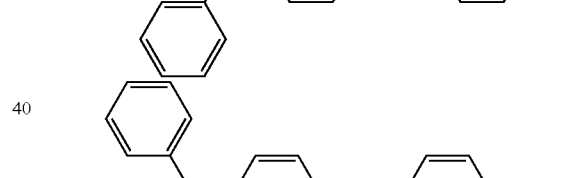
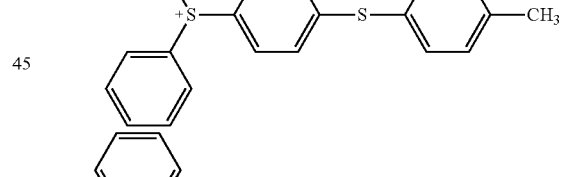
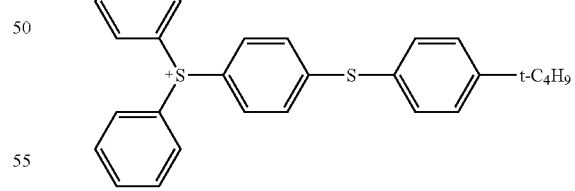
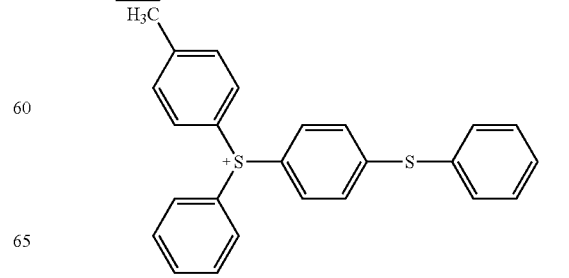

91
-continued
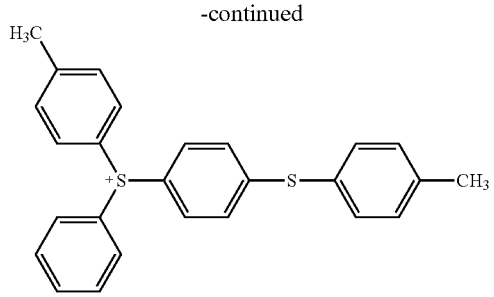
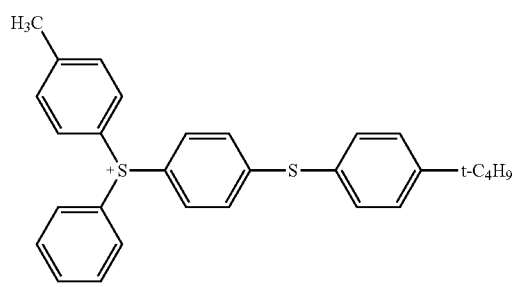
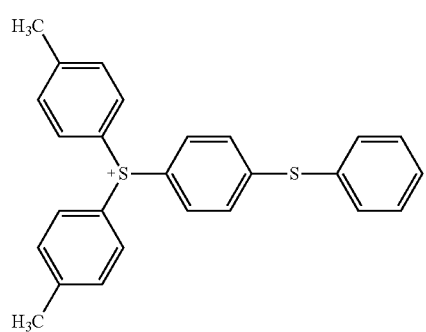
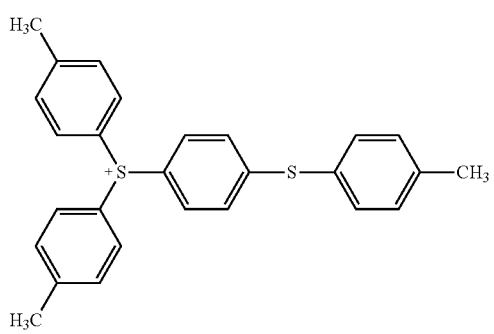
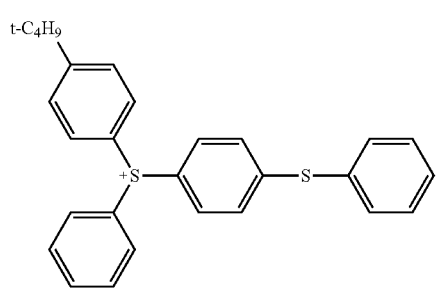
92
-continued
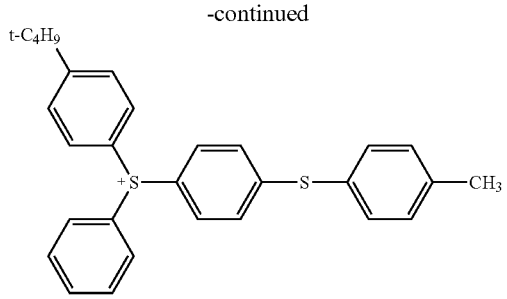
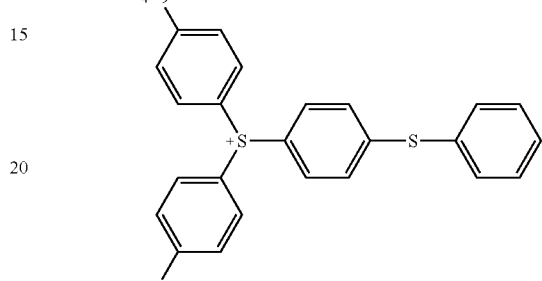
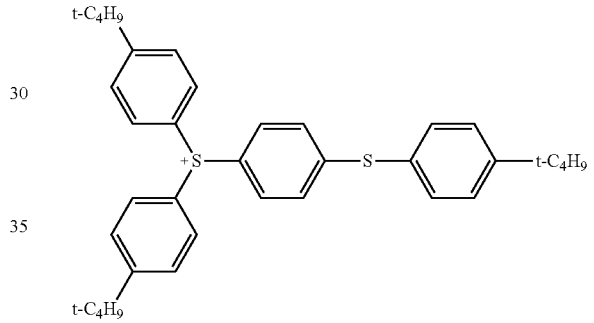
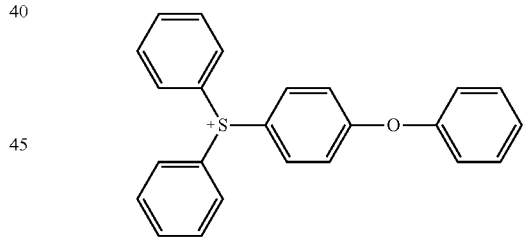
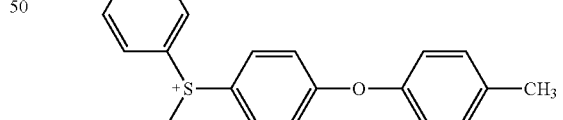
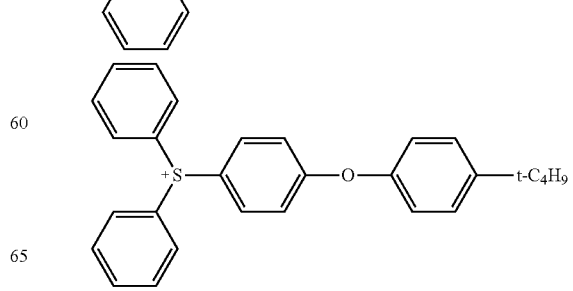

93
-continued
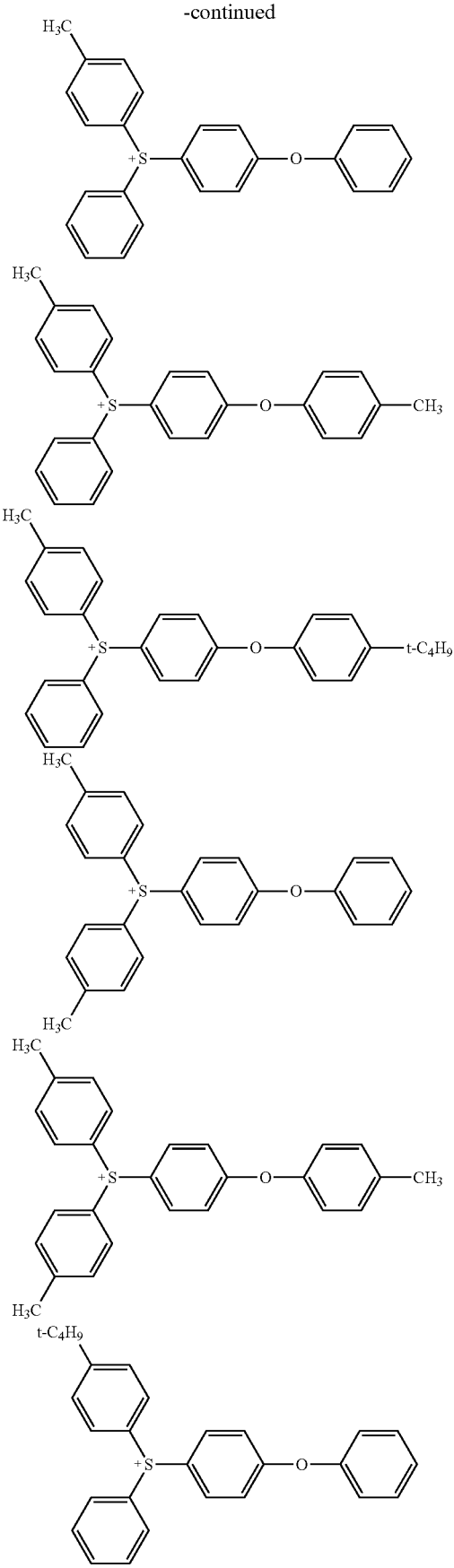
94
-continued
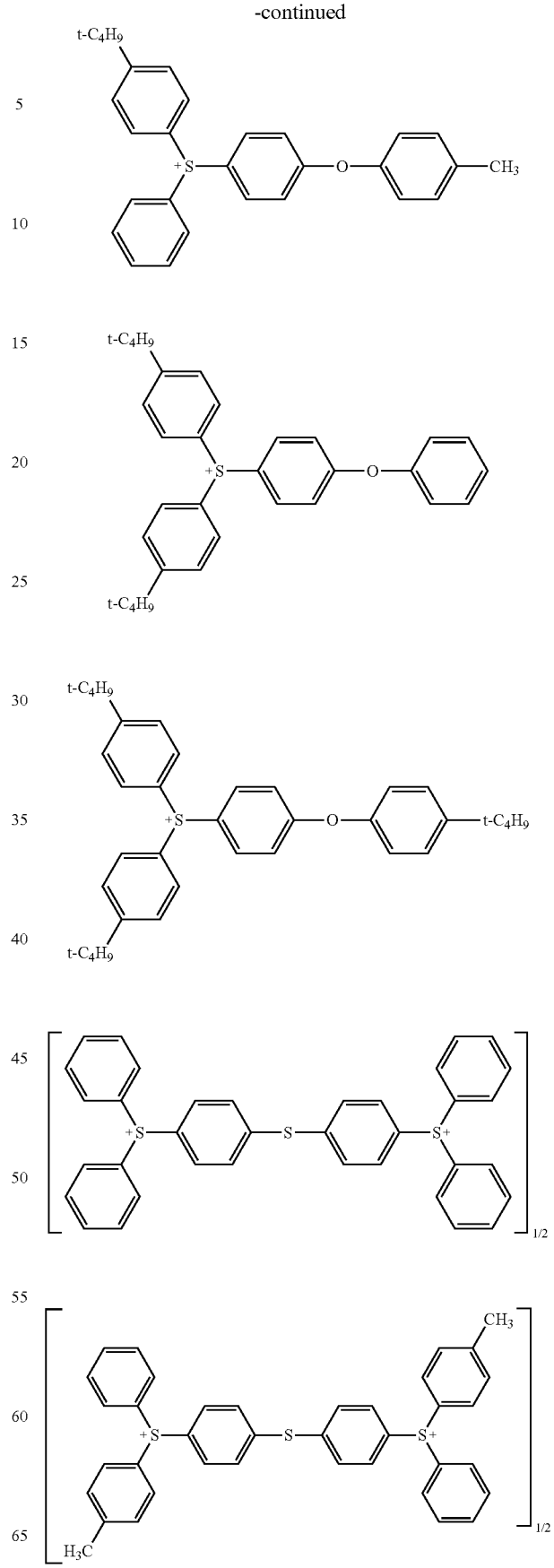

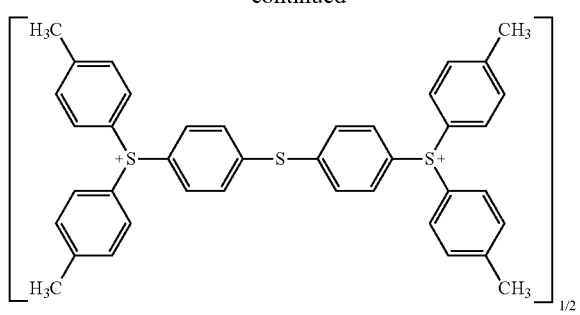

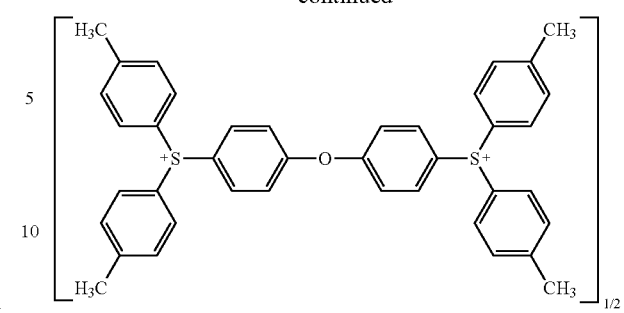

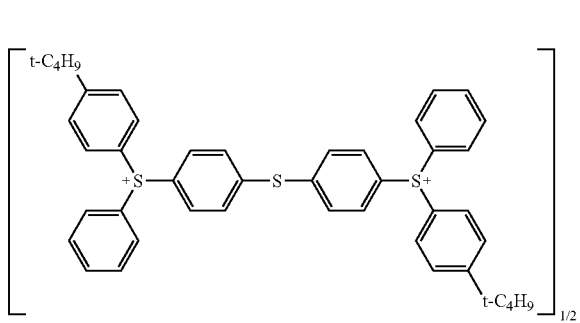

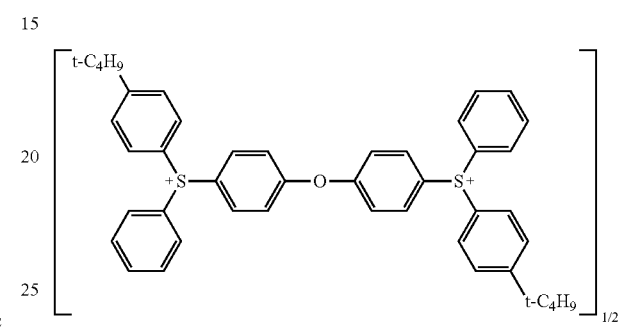

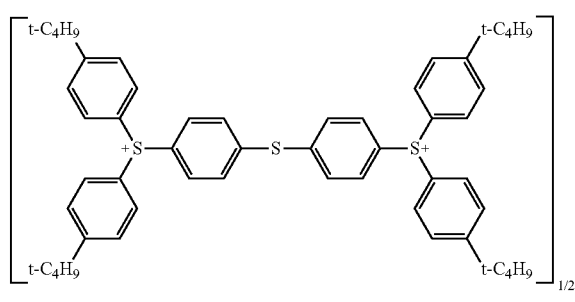

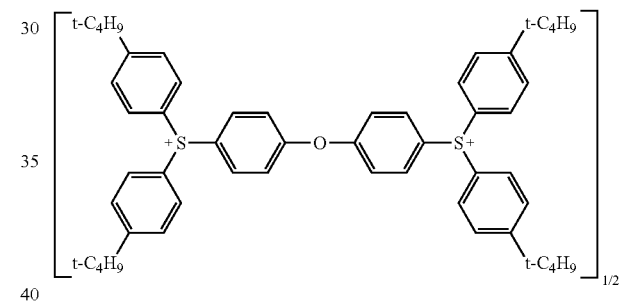

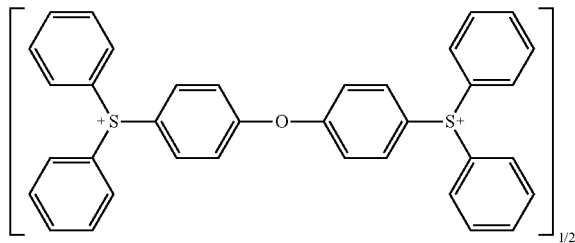

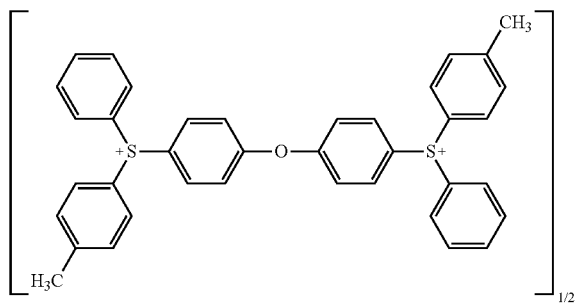

Examples of the acid generator (B1) include a combinations of the sulfonate anion and the organic cation as described above. Although any combination of the anion and the cation as described above may be employed, a combination of any one of the anions (b1-1-1) to (b1-1-9) and the cation (b2-1-1), and a combination of any one of the anions (b1-1-3) to (b1-1-5) and the cation (b2-3) are preferable.

The acid generator (B1) is preferably any one represented by formulae (B1-1) to (B1-16):

(B1-1)

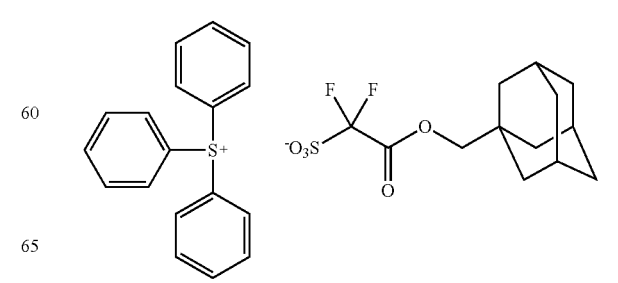

(B1-2)
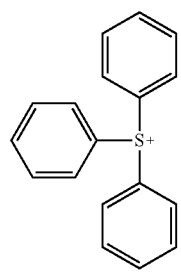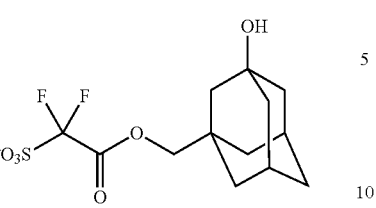
(B1-3)
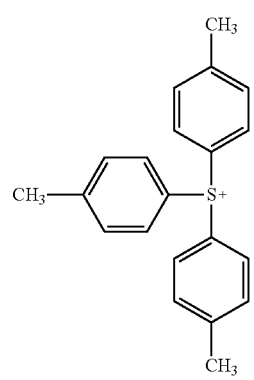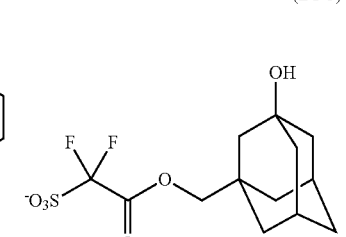
(B1-4)
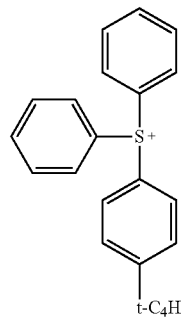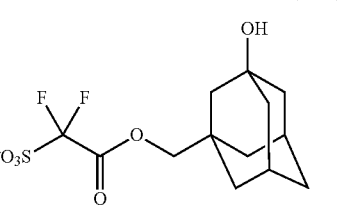
(B1-5)
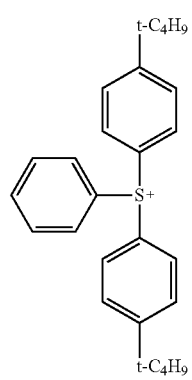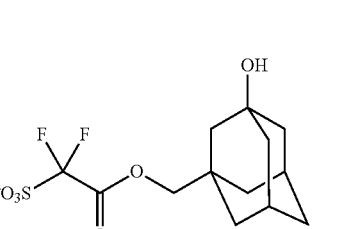
(B1-6)
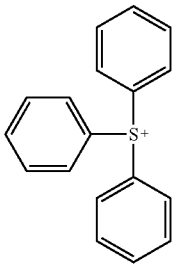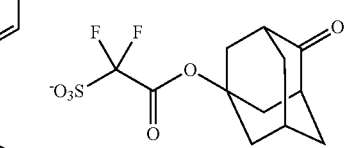
(B1-7)
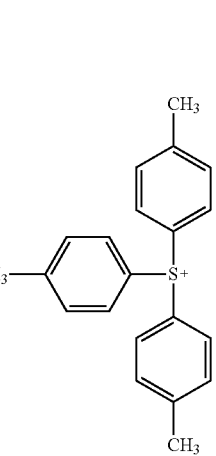
(B1-8)
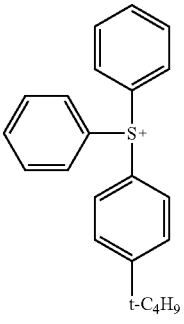
(B1-9)
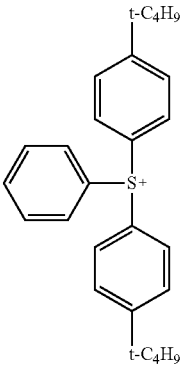

(B1-10)
(B1-11)
(B1-12)
(B1-13)
(B1-14)

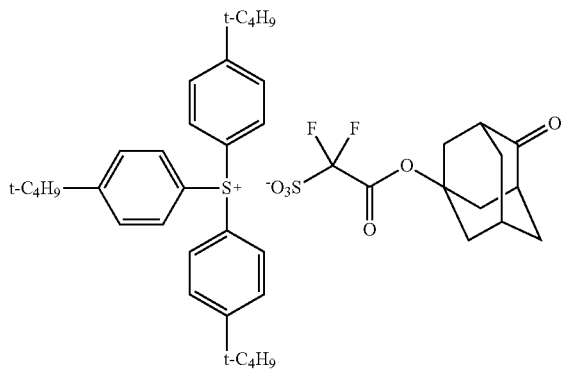

(B1-15)
(B1-16)

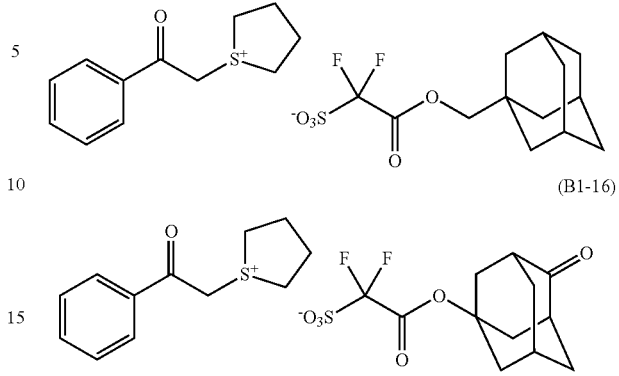

Among them, the acid generators (B1-1), (B1-2), (B1-6), (B1-11), (B1-12), (B1-13), and (B1-14) each of which contains triphenylsulfonium cation are more preferable.

The acid generator (B1) can be produced by, for example, exchanging a cation $M_a^+$ of a sulfonate (b3-1) with a cation $Z^+$ of a salt (b3-2) as represented in the following formula:

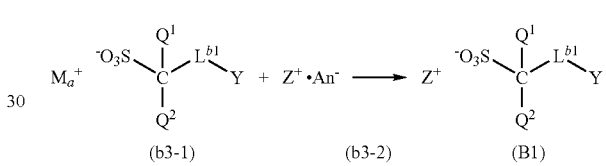

wherein $M_a^+$ denotes $Li^+$, $Na^+$, $K^+$, or $Ag^+$, and $An^-$ denotes $F^-$, $Cl^-$, $Br^-$, $I^-$, $BF_4^-$, $AsF_6^-$, $SbF_6^-$, $PF_6^-$, or $ClO_4^-$.

In general, the cation exchange reaction can be conducted in an inert solvent such as acetonitrile, water, methanol, chloroform, or methylene chloride at a temperature ranging from about 0° C. to about 150° C. (preferably, at about 0° C. to about 100° C.) The amount of the salt (b3-2) to be used is about 0.5 moles to 2 moles with respect to 1 mole of the salt (b3-1), in general. The acid generator (B1) obtained can be purified through water-washing, recrystallization, and the like.

The sulfonate (b3-1) which is a starting material for the cation exchange reaction can be produced through various reaction paths. For example, a sulfonate (b3-1-1) having the linking portion (b1-1) is produced through an esterification reaction between a sulfonate (b-4-1) having a carboxyl group and an alcohol (b-4-2) as indicated in the following formula:

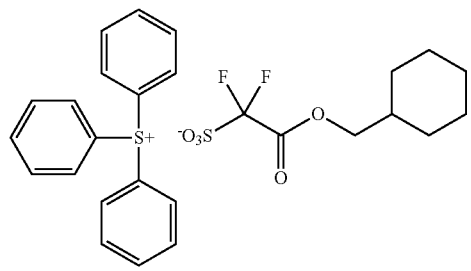

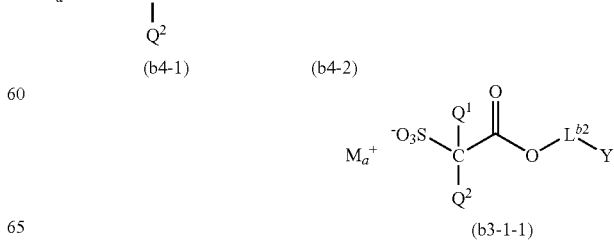

wherein, the same symbols as indicated above have the same corresponding meanings as indicated above.

Further, the sulfonate (b3-1-1) is also produced by hydrolyzing, with $M_bOH$, a sulfonyl fluoride obtained through an esterification reaction between a sulfonyl fluoride (b-4-3) having a carboxyl group and the alcohol (b-4-2), as represented in the following formula:

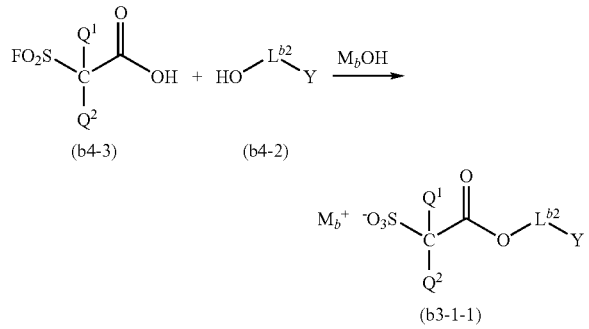

wherein, $M_b$ denotes an alkali metal such as Li, Na, and K, and $M_b$ preferably denotes Li or Na. The same symbols as indicated above have the same corresponding meanings as indicated above.

The amount of the sulfonate (b-4-1) or the sulfonyl fluoride (b-4-3) to be used is about 0.2 moles to 3 moles, and preferably about 0.5 moles to 2 moles, with respect to 1 mole of the alcohol (b-4-2), in general.

The esterification reaction can be conducted while stirring in an aprotic solvent such as dichloroethane, toluene, ethylbenzene, monochlorobenzene, acetonitrile, and N,N-dimethylformamide at a temperature ranging from about 20° C. to about 200° C. (preferably, about 50° C. to about 150° C.), in general.

For the esterification reaction, an acid catalyst may be employed. Examples of the acid catalyst include organic acids such as p-toluene sulfonic acid; and inorganic acids such as sulfuric acid. Although the acid catalyst may be excessively used, the amount of the acid catalyst to be used is preferably about 0.001 moles to 5 moles with respect to 1 mole of a compound having a carboxyl group (a carboxylic acid), in general.

A Dean-Stark apparatus or the like may be used to conduct the esterification reaction while dehydration is being performed, in order to shorten a reaction time. Further, a dehydrating agent may be used for the esterification reaction. Examples of the dehydrating agent include dicyclohexyl carbodiimide, 1-alkyl-2-halopyridinium salt, 1,1'-carbonyldiimidazole, bis(2-oxo-3-oxazolidinyl)phosphinic acid chloride, 1-ethyl-3-(3-dimethylaminopropyl)carbodiimide hydrochloride, di-2-pyridyl carbonate, di-2-pyridyl thionocarbonate, and 6-methyl-2-nitrobenzoic acid anhydride in the presence of 4-(dimethylamino)pyridine. Although the dehydrating agent may be excessively used, the amount of the dehydrator to be used is preferably about 0.5 moles to 5 moles, and preferably about 1 mole to 3 moles, with respect to 1 mole of a carboxylic acid, in general.

A sulfonate having the linking portion (b1-2) is produced in the same manner as that for the sulfonate (b3-1-1) having the linking portion (b1-1).

For example, a sulfonate (b3-1-3) having the linking portion (b1-3) is produced through an esterification reaction between a sulfonate (b-4-4) having a hydroxyl group and one of a carboxylic acid (b-4-5) or an acid halide (b-4-6) as represented in the following formula:

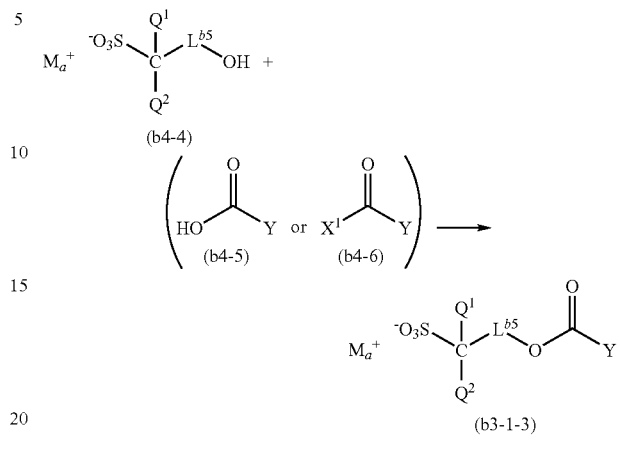

wherein $X^1$ denotes a halogen. The same symbols as indicated above have the same corresponding meanings as indicated above.

Further, the sulfonate (b3-1-3) is also produced by hydrolyzing, with $M_bOH$, a sulfonyl fluoride which is obtained through an esterification reaction between a sulfonyl fluoride (b-4-7) having a hydroxyl group and one of the carboxylic acid (b-4-5) or the acid halide (b-4-6) as represented in the following formula:

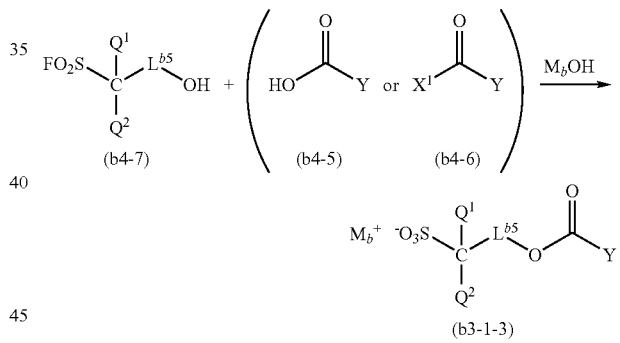

wherein the same symbols as indicated above have the same corresponding meanings as indicated above.

The amount of the sulfonate (b-4-4) or the sulfonyl fluoride (b-4-7) to be used is about 0.5 moles to 3 moles, and preferably about 1 mole to 2 moles, with respect to 1 mole of one of the carboxylic acid (b-4-5) or the acid halide (b-4-6), in general. The other conditions for the reaction are the same as those for the esterification reaction described above. In the esterification reaction in which the acid halide (b-4-6) is used, a deoxidizing agent may be used. Examples of the deoxidizing agent include organic bases such as triethylamine and pyridine; and inorganic bases such as sodium hydroxide and potassium carbonate. Although the deoxidizer may be excessively used, the amount of the deoxidizing agent to be used is about 0.001 moles to 5 moles, and preferably about 1 mole to 3 moles, with respect to 1 mole of the acid halide (b-4-6), in general.

The acid halide (b-4-6) is synthesized through a reaction between the carboxylic acid (b-4-5) and a compound such as thionyl chloride, thionyl bromide, phosphorus trichloride, phosphorus pentachloride, or phosphorus tribromide. The synthesis reaction for the acid halide is conducted while stirring in an aprotic solvent such as dichloroethane, toluene, ethylbenzene, monochlorobenzene, and N,N-dimethylformamide at a temperature ranging from about 20° C. to about 200° C. (preferably, about 50° C. to about 150° C.), in general. For the synthesis reaction of the acid halide, an amine compound may be used as a catalyst.

For example, a sulfonate (b3-1-4) having the linking portion (b1-4) may be produced through an etherification reaction between a sulfonate (b-4-8) having a hydroxyl group and one of an alcohol (b-4-9) or a compound (b-4-10) having a elimination group $X^2$ as represented in the following formula:

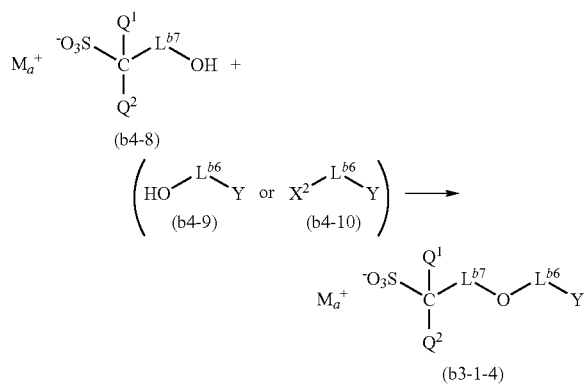

wherein $X^2$ denotes a chlorine atom, a bromine atom, an iodine atom, a mesyloxy group, a tosyloxy group, or a trifluoromethanesulfonyloxy group. The same symbols as indicated above have the same corresponding meanings as indicated above.

Further, the sulfonate (b3-1-4) may be also produced by hydrolyzing, with $M_bOH$, a sulfonyl fluoride obtained through an etherification reaction between a sulfonyl fluoride (b-4-11) having a hydroxyl group and one of the alcohol (b-4-9) or the elimination group-containing compound (b-4-10), as represented in the following formula:

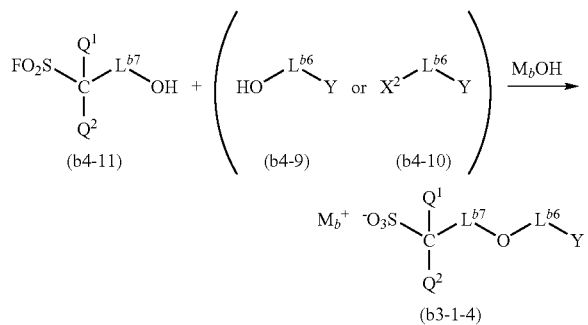

wherein the same symbols as indicated above have the same corresponding meanings as indicated above.

The amount of the sulfonate (b-4-8) or the sulfonyl fluoride (b-4-11) to be used is about 0.5 moles to 3 moles, and preferably about 1 mole to 2 moles, with respect to 1 mole of one of the alcohol (b-4-9) or the elimination group-containing compound (b-4-10), in general.

The etherification reaction is conducted while stirring in an aprotic solvent such as dichloroethane, toluene, ethylbenzene, monochlorobenzene, acetonitrile, and N,N-dimethylformamide at a temperature ranging from about 20° C. to about 200° C. (preferably, about 50° C. to about 150° C.), in general.

For the etherification reaction, an acid catalyst may be used. Example of the acid catalyst includes organic acids such as p-toluene sulfonic acid; and inorganic acids such as sulfuric acid. Although the acid catalyst may be excessively used, an amount of the acid catalyst to be used is about 0.001 moles to 5 moles with respect to 1 mole of one of the alcohol (b-4-9) or the elimination group-containing compound (b-4-10), in general.

A Dean-Stark apparatus or the like may be used to conduct the etherification reaction while dehydration is being performed, in order to shorten a reaction time. Further, a dehydrating agent may be used for the etherification reaction. Examples of the dehydrating agent include 1,1'-carbonyldiimidazole, and N,N'-dicyclohexyl carbodiimide. Although the dehydrator may be excessively used, the amount of the dehydrator to be used is about 0.5 moles to 5 moles, and preferably about 1 mole to 3 moles, with respect to 1 mole of one of the alcohol (b-4-9) or the elimination group-containing compound (b-4-10), in general.

For the etherification reaction in which the elimination group-containing compound (b-4-10) is used, a deoxidizing agent may be used. Examples of the deoxidizing agent include organic bases such as triethylamine and pyridine; and inorganic bases such as sodium hydroxide and potassium carbonate. Although the deoxidizing agent may be excessively used, the amount of the deoxidizing agent to be used is about 0.001 moles to 5 moles, and preferably about 1 mole to 3 moles, with respect to 1 mole of the elimination group-containing compound (b-4-10), in general.

The elimination group-containing compound (b-4-10) may be synthesized through a reaction between the alcohol (b-4-9) and thionyl chloride, thionyl bromide, phosphorus trichloride, phosphorus pentachloride, phosphorus tribromide, mesyl chloride, tosyl chloride, trifluoromethanesulfonic anhydride, or the like. The synthesis reaction may be conducted, while stirring, in an aprotic solvent such as dichloroethane, toluene, ethylbenzene, monochlorobenzene, and N,N-dimethylformamide at a temperature ranging from about −70° C. to about 200° C. (preferably, about −50° C. to about 150° C.), in general. For the synthesis reaction, a deoxidizing agent may be used. Examples of the deoxidizing agent include organic bases such as triethylamine and pyridine; and inorganic bases such as sodium hydroxide and potassium carbonate. Although the deoxidizing agent may be excessively used for the synthesis reaction, the amount of the deoxidizing agent to be used is about 0.001 moles to 5 moles, and preferably about 1 mole to 3 moles, with respect to 1 mole of the alcohol (b-4-9), in general.

<Nitrogen-Containing Basic Compound (C)>

A nitrogen-containing basic compound (C) may be added as a quencher to the photoresist composition of the present invention. For example, performance deterioration of a resist film caused by inactivation of acid which occurs due to post exposure delay can be diminished by the use of the nitrogen-containing basic compound (C). When the nitrogen-containing basic compound (C) is used, the amount of the nitrogen-containing basic compound (C) is preferably 0.01 parts mass or more (more preferably 0.05 parts by mass or more, and even more preferably 0.1 parts by mass or more), per 100 parts by mass of the resin (A), and is preferably 5 parts by mass or less (more preferably 3 parts by mass or less, and even more preferably 2 parts by mass or less), per 100 pasts by mass of the resin (A).

Examples of the nitrogen-containing basic compound (C) include an amine and an ammonium hydroxide. The amine may be an aliphatic amine or an aromatic amine. As the aliphatic amine, any one of a primary amine, secondary amine, or tertiary amine may be used. The aromatic amine may be either an amine, such as aniline, in which an amino group is bonded to an aromatic ring, or a heteroaromatic amine such as pyridine. The nitrogen-containing basic compound (C) is preferably an aromatic amine as indicated in the following formula (C1), and an aniline as indicated in formula (C1-1) is particularly preferable.

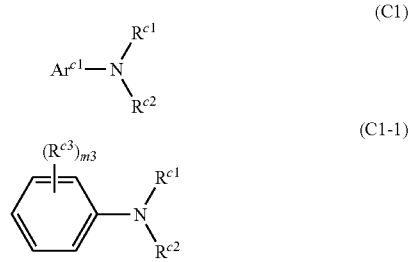

In formula (C1), $Ar^{c1}$ represents a $C_{6-20}$ aromatic hydrocarbon group. $R^{c1}$ and $R^{c2}$ each independently represent a hydrogen atom, a linear or branched $C_{1-6}$ aliphatic hydrocarbon group, a $C_{5-10}$ alicyclic hydrocarbon group, or a $C_{6-20}$ aromatic hydrocarbon group. The aliphatic hydrocarbon group and the aromatic hydrocarbon group may be each independently substituted with a hydroxyl group, an amino group, or a linear or branched $C_{1-6}$ alkoxy group. Further, the aliphatic hydrocarbon group may be substituted with a $C_{6-20}$ aromatic hydrocarbon group, and the aromatic hydrocarbon group may be substituted with a linear or branched $C_{1-6}$ aliphatic hydrocarbon group, or a $C_{5-10}$ alicyclic hydrocarbon group. Further, the alkoxy group may be substituted with a hydroxyl group, an amino group, or a linear or branched $C_{1-6}$ alkoxy group, and the amino group may be substituted with a $C_{1-4}$ aliphatic hydrocarbon group.

In formula (C1-1), $R^{c1}$ and $R^{c2}$ are the same as described above. $R^{c3}$ represents a linear or branched $C_{1-6}$ aliphatic hydrocarbon group, a $C_{5-10}$ alicyclic hydrocarbon group, a linear or branched $C_{1-6}$ alkoxy group, or a $C_{6-20}$ aromatic hydrocarbon group. The aliphatic hydrocarbon group, the alkoxy group, and the aromatic hydrocarbon group may each independently have a substituent as described for formula (C1). "m3" in the formula (C1-1) represents an integer ranging from 0 to 3. When m3 is 0, it means that $R^{c3}$ is absent. When "m3" is not less than 2, the plurality of $R^{c3}$ may be the same or different from each other.

Examples of the aromatic amine (C1) include 1-naphthylamine, and 2-naphthylamine Examples of the aniline (C1-1) include aniline, diisopropyl aniline, 2-,3- or 4-methylaniline, 4-nitroaniline, N-methylaniline, N,N-dimethylaniline, and diphenylamine. Among them, diisopropyl aniline (particularly, 2,6-diisopropyl aniline) is preferable.

A quaternary ammonium hydroxide as indicated in the following formula (C2) is also preferable as the nitrogen-containing basic compound (C).

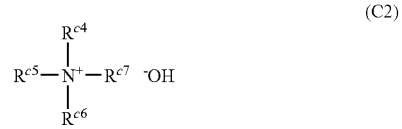

In formula (C2), $R^{c4}$ to $R^{c6}$ each independently represent a hydrogen atom, a linear or branched $C_{1-6}$ aliphatic hydrocarbon group, a $C_{5-10}$ alicyclic hydrocarbon group, or a $C_{6-20}$ aromatic hydrocarbon group.

$R^{c7}$ represents a linear or branched $C_{1-6}$ aliphatic hydrocarbon group, or a $C_{5-10}$ alicyclic hydrocarbon group. The aliphatic hydrocarbon group and the aromatic hydrocarbon group may each independently have a substituent as described for formula (C1).

Examples of the quaternary ammonium hydroxide (C2) include tetramethylammonium hydroxide, tetraisopropylammonium hydroxide, tetrabutylammonium hydroxide, tetrahexylammonium hydroxide (e.g., tetra-n-hexylammonium hydroxide), tetraoctylammonium hydroxide (e.g., tetra-n-octylammonium hydroxide), phenyltrimethylammonium hydroxide, 3-(trifluoromethyl)phenyltrimethylammonium hydroxide, and choline. Among them, tetramethylammonium hydroxide, tetrabutylammonium hydroxide, tetrahexylammonium hydroxide, tetraoctylammonium hydroxide, phenyltrimethylammonium hydroxide, and 3-(trifluoromethyl)phenyltrimethylammonium hydroxide are preferable.

Other examples of the nitrogen-containing basic compound (C) include compounds as indicated in formulae (C3) to (C11).

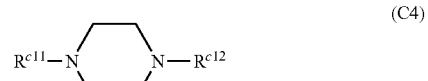

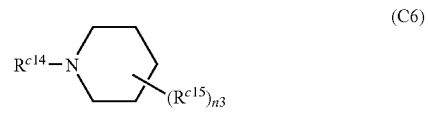

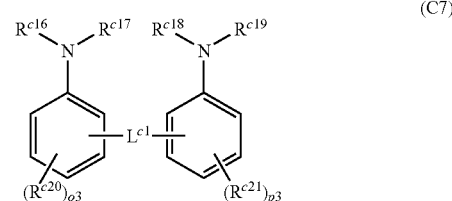

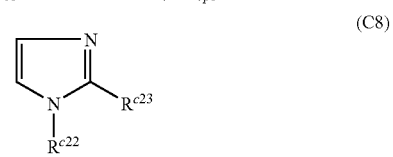

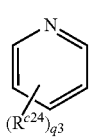
(C9)

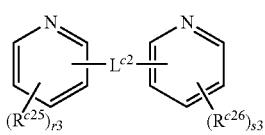
(C10)

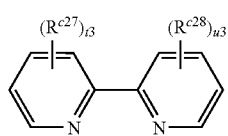
(C11)

In formula (C3), $R^{c8}$ represents a linear or branched $C_{1-6}$ aliphatic hydrocarbon group, or a $C_{5-10}$ alicyclic hydrocarbon group. $R^{c9}$ and $R^{c10}$ each independently represent a hydrogen atom, a linear or branched $C_{1-6}$ aliphatic hydrocarbon group, or a $C_{5-10}$ alicyclic hydrocarbon group. In formulae (C4) to (C8), $R^{c11}$ to $R^{c14}$, $R^{c16}$ to $R^{c19}$, and $R^{c22}$, each of which is bonded to a nitrogen atom, each independently represent a hydrogen atom, a linear or branched $C_{1-6}$ aliphatic hydrocarbon group, a $C_{5-10}$ alicyclic hydrocarbon group, or a $C_{6-20}$ aromatic hydrocarbon group. In formula (C6), $R^{c15}$ represents a linear or branched $C_{1-6}$ aliphatic hydrocarbon group, a $C_{3-6}$ alicyclic hydrocarbon group, or a $C_{2-6}$ alkanoyl group, and n3 represents an integer ranging from 0 to 8. When n3 is 0, it means that $R^{c15}$ is absent. When n3 is not less than 2, a plurality of $R^{c15}$ may be the same or different from each other. In formula (C8), $F^{c23}$, which is bonded to an aromatic carbon, represents a hydrogen atom, a linear or branched $C_{1-6}$ aliphatic hydrocarbon group, a $C_{5-10}$ alicyclic hydrocarbon group, a linear or branched $C_{1-6}$ alkoxy group, or a $C_{6-20}$ aromatic hydrocarbon group. In formula (C7), and formulae (C9) to (C11), $R^{c20}$, $R^{c21}$, and $R^{c24}$ to $R^{c28}$, each of which is bonded to an aromatic carbon, each independently represent a linear or branched $C_{1-6}$ aliphatic hydrocarbon group, a $C_{5-10}$ alicyclic hydrocarbon group, a linear or branched $C_{1-6}$ alkoxy group, or a $C_{6-20}$ aromatic hydrocarbon group, and o3 to u3 each independently represent an integer ranging from 0 to 3. When any of o3 to u3 are 0, it means that the corresponding substituents do not exist. When any of o3 to u3 are not less than 2, it means that a plurality of $R^{c20}$ to $R^{c28}$, respectively, may be the same or different from each other. In formulae (C7) and (C10), $L^{c1}$ and $L^{c2}$ each independently represent a $C_{2-6}$ alkylene group, a carbonyl group (—CO—), —N($R^{c29}$)—, a thio group (—S—), a dithio group (—S—S—), or a combination thereof. $R^{c29}$ represents a hydrogen atom, or a linear or branched $C_{1-6}$ aliphatic hydrocarbon group. Further, in formulae (C3) to (C11), the aliphatic hydrocarbon group, the alkoxy group, and the aromatic hydrocarbon group may each independently have a substituent as described for formula (C1).

Examples of the compound (C3) include hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, dicyclohexylmethylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane, and 4,4'-diamino-3,3'-diethyldiphenylmethane.

The compound (C4) is, for example, piperazine. The compound (C5) is, for example, morpholine. Examples of the compound (C6) include piperidine, and a hindered amine compound having a piperidine skeleton as disclosed in Japanese Laid-Open Patent Publication No. 11-52575. The compound (C7) is, for example, 2,2'-methylenebisaniline.

Examples of the compound (C8) include imidazole, and 4-methylimidazole. Examples of the compound (C9) include pyridine, and 4-methylpyridine and the like. Examples of the compound (C10) include 1,2-di(2-pyridyl)ethane, 1,2-di(4-pyridyl)ethane, 1,3-di(4-pyridyl)propane, 1,2-di(4-pyridyloxy)ethane, di(2-pyridyl)ketone, 4,4'-dipyridyl sulfide, 4,4'-dipyridyl disulfide, 2,2'-dipyridylamine, and 2,2'-dipicolylamine. The compound (C11) is, for example, bipyridine.

<Solvent (D)>

Examples of the solvent (D) include, for examples, glycol ether esters such as ethyl cellosolve acetate, methyl cellosolve acetate, and propylene glycol monomethyl ether acetate; esters such as ethyl lactate, butyl acetate, amyl acetate, and ethyl pyruvate; and ketones such as acetone, methylisobutylketone, 2-heptanone, and cyclohexanone; cyclic esters such as γ-butyrolactone; and propylene glycol monomethyl ether.

The content of the solvent (D) in the entire resist composition is 50% by mass or more (preferably 70% by mass or more, and more preferably 90% by mass or more), and is 99% by mass or less (and preferably 97% by mass or less), in general.

<Optionally Selected Component (E)>

The photoresist composition may contain any optionally selected component (E) as necessary. The optionally selected component (E) is not limited to any specific component. An additive such as a sensitizer, a dissolution inhibitor, a surfactant, a stabilizer, and a dye, which is known in this technical field, may be used.

<Method for Producing Photoresist Pattern>

The producing method according to the present invention includes a coating step 1, a pre-baking step 2, an exposure step 3, a post-exposure-baking step 4, and a development step 5. Hereinafter, the steps will be described in order, respectively.

<Coating Step 1>

Prior to coating of the photoresist composition on a substrate, it is desirable that each component of the photoresist composition is previously blended with each other in a solvent, and is then filtered through a filter having a pore size of about 0.2 μm or less. This filtration improves a uniformity of a coated film (resist film).

A substrate to which the photoresist composition is coated may be selected in accordance with a usage as necessary. For example, a silicon wafer and a quartz wafer having a sensor, a circuit, a transistor, and the like formed thereon are exemplified as the substrate.

A method for applying the photoresist composition to form a coating film on the substrate is not limited to any specific method. A standard coating method such as a spin coating method can be employed as necessary.

<Pre-Baking Step 2>

Through pre-baking, a mechanical strength of a resist film can be enhanced, and a diffusion degree of active species (for example, H⁺) in an exposed resist film can be adjusted. The pre-baking temperature $T_{PB}$ is, for example, about 50° C. to about 200° C.

<Exposure Step 3>

The pre-baked resist film is exposed by use of a mask corresponding to an intended pattern (for example, contact holes). The exposure may be either a dry exposure or an immersion exposure. As an exposure apparatus, for example, a reduction projection exposure apparatus is used. Various light sources can be used as an exposure light source, and examples of the exposure light source include: light sources, such as a KrF excimer laser (wavelength 248 nm), an ArF excimer laser (wavelength 193 nm), and an $F_2$ laser (wavelength 157 nm), for emitting ultraviolet laser light; and light sources for emitting harmonic far-ultraviolet laser light or harmonic vacuum ultraviolet laser light which is wavelength-converted from a solid-state laser light source (such as a YAG or semiconductor laser). The exposure amount may be determined as necessary in accordance with kinds and the contents of the components of the photoresist composition to be used.

<Post-Exposure-Baking Step 4>

The post-exposure-baking is conducted in order to promote diffusion of active species (for example, H⁺) and a reaction of the active species in the exposed resist film. The post-exposure-baking temperature $T_{PEB}$ is about 50° C. to about 200° C., and is preferably about 70° C. to about 150° C., in general.

<Development Step 5>

The development is conducted by means of a development apparatus by contacting the substrate having the resist film formed thereon with a usual liquid developer. Examples of the liquid developer include basic aqueous solutions (specifically, an aqueous solution of tetramethylammonium hydroxide, an aqueous solution of (2-hydroxyethyl)trimethylammonium hydroxide (generally referred to as choline), or the like). A surfactant may be added to the liquid developer as necessary. It is preferable that the resist pattern is formed by draining off the liquid developer, water-washing, and removing the water.

EXAMPLES

Hereinafter, the present invention will be described more specifically by way of examples, which are not construed to limit the scope of the present invention, and various modifications can be made within the range of the gist described above and below, which modifications are encompassed in the technical scope of the present invention.

The "%" and "part(s)" used to represent the content and the amount of any component in the following descriptions are on a mass basis unless otherwise specifically noted.

The Mw (molecular weight) is a value found by gel permeation chromatography (HLC-8120GPC Type, Column (Three Columns): TSKgel Multipore $H_{XL}$-M, manufactured by TOSOH CORPORATION, Eluant: Tetrahydrofuran) using polystyrene as a standard reference material. Detailed conditions are as follows.

Column: "TSKgel Multipore $H_{XL}$-M" three columns and guardcolumn (manufactured by TOSOH CORPORATION)

Eluant: tetrahydrofuran
Flow rate: 1.0 mL/min.
Detector: RI detector
Column temperature: 40° C.
Injection rate: 100 µL Molecular weight standard: standard polystyrene (manufactured by TOSOH CORPORATION)

Structures of compounds were determined by NMR (GX-270 Type or EX-270 Type, manufactured by JEOL Ltd.) and mass spectrometry (LC: 1100 Type, manufactured by AGILENT TECHNOLOGIES LTD., MASS: LC/MSD Type or LC/MSD TOF Type, manufactured by AGILENT TECHNOLOGIES LTD.).

1. Resin (A)

The resins A-1 to A-7 were each synthesized by using monomers as indicated below, and were used for examples, Comparative Example, and Reference Examples. Table 1 indicates Mws of the resins A-1 to A-7, respectively, and a molar ratio among monomers for each of the resins A-1 to A-7.

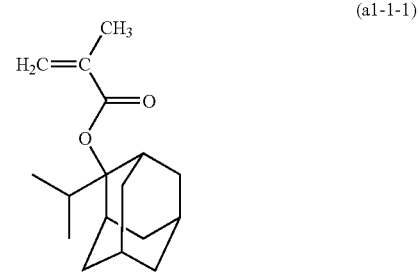

(a1-1-1)

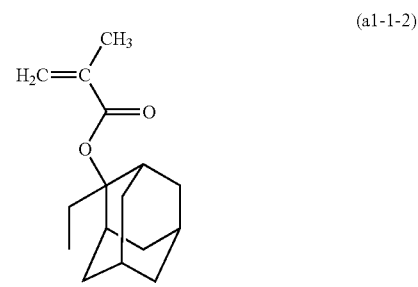

(a1-1-2)

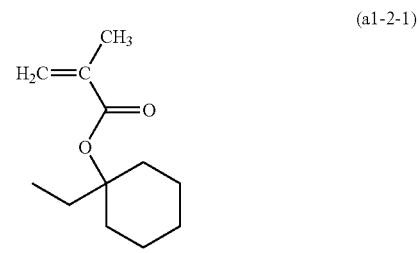

(a1-2-1)

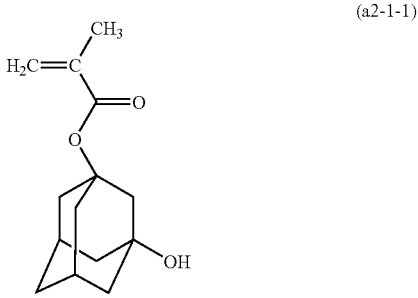

(a2-1-1)

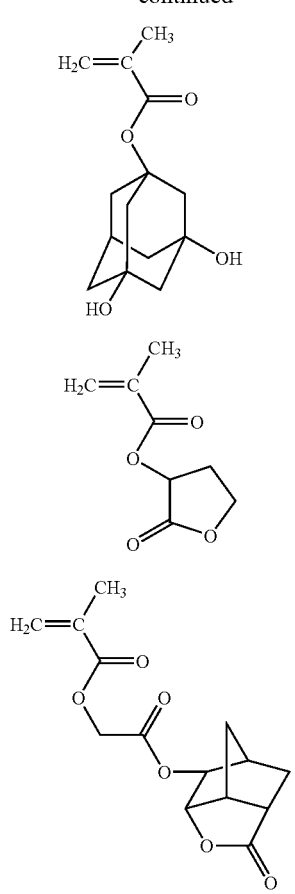

(2) Synthesis of the Resin A-2

The monomer (a1-1-1), the monomer (a1-2-1), the monomer (a2-1-1), and the monomer (a3-2-1) were blended at a molar ratio of 40:10:20:30. Dioxane whose weight was 1.2 times the total weight of all the monomers was added thereto to obtain a monomer solution. Azobisisobutyronitrile and azobis(2,4-dimethylvaleronitrile), as an initiator, were added, at 2 mol % and 6 mol %, respectively, with respect to the total amount of all the monomers, to the solution, and the resultant mixture was heated at 73° C. for about five hours. Thereafter, purification was performed by pouring the reaction solution into a large amount of mixture of water and methanol to cause precipitation three times. Consequently, a copolymer having an Mw of 4884 was obtained in a yield of 72%. The copolymer had structural units corresponding to the respective monomers, and was used as the resin A-2.

(3) Synthesis of the Resin A-3

The monomer (a1-1-1), the monomer (a1-2-1), the monomer (a2-1-1), and the monomer (a3-2-1) were blended at a molar ratio of 40:10:20:30. Dioxane whose weight was 1.2 times the total weight of all the monomers was added thereto to obtain a monomer solution. Azobisisobutyronitrile and azobis(2,4-dimethylvaleronitrile), as an initiator, were added, at 1 mol % and 3 mol %, respectively, with respect to the total amount of all the monomers, to the solution, and the resultant mixture was heated at 73° C. for about five hours. Thereafter, purification was performed by pouring the reaction solution into a large amount of methanol to cause precipitation three times. Consequently, a copolymer having an Mw of 8355 was obtained in a yield of 74%. The copolymer had structural units corresponding to the respective monomers, and was used as the resin A-3.

(4) Synthesis of the Resin A-4

The monomer (a1-1-1), the monomer (a1-2-1), the monomer (a2-1-1), and the monomer (a3-2-1) were blended at a molar ratio of 40:10:20:30. Dioxane whose weight was 1.2

TABLE 1

| | | | Copolymer | | | | | | |
|---|---|---|---|---|---|---|---|---|---|
| | | | A-1 | A-2 | A-3 | A-4 | A-5 | A-6 | A-7 |
| Molar ratio of monomer | Monomer (a1) | (a1-1-1) | 40 | 40 | 40 | 40 | 40 | — | — |
| | | (a1-1-2) | — | — | — | — | — | 50 | 40 |
| | | (a1-2-1) | 10 | 10 | 10 | 10 | 10 | — | — |
| | Monomer (a2) | (a2-1-1) | 20 | 20 | 20 | 20 | — | 25 | 10 |
| | | (a2-1-2) | — | — | — | — | 10 | — | — |
| | Monomer (a3) | (a3-1-1) | — | — | — | — | — | 25 | 20 |
| | | (a3-2-1) | 30 | 30 | 30 | 30 | 40 | — | 30 |
| | Mw | | 3182 | 4884 | 8355 | 10733 | 3891 | 9200 | 4180 |

(1) Synthesis of the Resin A-1

The monomer (a1-1-1), the monomer (a1-2-1), the monomer (a2-1-1), and the monomer (a3-2-1) were blended at a molar ratio of 40:10:20:30. Dioxane whose weight was 1.2 times the total weight of all the monomers was added thereto to obtain a monomer solution. Azobisisobutyronitrile and azobis(2,4-dimethylvaleronitrile), as an initiator, were added, at 2.5 mol % and 7.5 mol %, respectively, with respect to the total amount of all the monomers, to the solution, and the resultant mixture was heated at 80° C. for about five hours. Thereafter, purification was performed by pouring the reaction solution into a large amount of mixture of water and methanol to cause precipitation three times. Consequently, a copolymer having an Mw of 3182 was obtained in a yield of 56%. The copolymer had structural units corresponding to the respective monomers, and was used as the resin A-1.

times the total weight of all the monomers was added thereto to obtain a monomer solution. Azobisisobutyronitrile and azobis(2,4-dimethylvaleronitrile), as an initiator, were added, at 0.7 mol % and 2.1 mol %, respectively, with respect to the total amount of all the monomers, to the solution, and the resultant mixture was heated at 73° C. for about five hours. Thereafter, purification was performed by pouring the reaction solution into a large amount of mixture of water and methanol to cause precipitation three times. Consequently, a copolymer having an Mw of 10733 was obtained in a yield of 74%. The copolymer had structural units corresponding to the respective monomers, and was used as the resin A-4.

(5) Synthesis of the Resin A-5

The monomer (a1-1-1), the monomer (a1-2-1), the monomer (a2-1-2), and the monomer (a3-2-1) were blended at a molar ratio of 40:10:10:40. Dioxane whose weight was 1.2 times the total weight of all the monomers was added thereto to obtain a monomer solution. Azobisisobutyronitrile and azobis(2,4-dimethylvaleronitrile), as an initiator, were added, at 2.5 mol % and 7.5 mol %, respectively, with respect to the total amount of all the monomers, to the solution, and the resultant mixture was heated at 77° C. for about five hours. Thereafter, purification was performed by pouring the reaction solution into a large amount of mixture of water and methanol to cause precipitation three times. Consequently, a copolymer having an Mw of 3891 was obtained in a yield of 59%. The copolymer had structural units corresponding to the respective monomers, and was used as the resin A-5.

(6) Synthesis of the Resin A-6

The monomer (a1-1-2), the monomer (a2-1-1) and the monomer (a3-1-1) were blended at a molar ratio of 50:25:25. Dioxane whose weight was 1.5 times the total weigh of all the monomers was added thereto to Obtain a monomer solution. Azobisisobutyronitrile and azobis(2,4-dimethylvaleronitrile), as an initiator, were added, at 1 mol % and 3 mol %, respectively, with respect to the total amount of all the monomers, to the solution, and the resultant mixture was heated at 80° C. for about eight hours. Thereafter, purification was performed by pouring the reaction solution into a large amount of mixture or water and methanol to cause precipitation three times. Consequently, a copolymer having an Mw of 9200 was obtained in a yield of 60%. The copolymer had structural units corresponding to the respective monomers, and was used as the resin A-6.

(7) Synthesis of the Resin A-7

The monomer (a1-1-2), the monomer (a2-1-1), the monomer (a3-1-1), and the monomer (a3-2-1) were blended at a molar ratio of 40:10:20:30. Dioxane whose weighs was 1.5 times the total weight of all the monomers was added thereto to obtain a monomer solution. Azobisisobutyronitrile and azobis(2,4-dimethylvaleronitrile), as an initiator, were added, at 2.2 mol % and 6.6 mol %, respectively, with respect to the total amount of all the monomers, to the solution, and were heated at 73° C. for about five hours. Thereafter, purification was performed by pouring the reaction solution into a large amount of mixture of water and methanol to cause precipitation three times. Consequently, a copolymer having an Mw of 4180 was obtained in a yield of 72%. The copolymer had structural units corresponding to the respective monomers, and was used as the resin A-7.

2. Synthesis of the Acid Generator (B1-2)

Under cooling with an ice bath, 230 parts of a 30 mass % aqueous sodium hydroxide solution was dripped into a mixture of 100 parts of methyl difluoro(fluorosulfonyl)acetate and 150 parts of ion-exchanged water. The resultant mixture was refluxed at 100° C. for three hours, was cooled, and was neutralized with 88 parts of concentrated hydrochloric acid. The obtained solution was concentrated to obtain 164.4 parts of sodium difluorosulfoacetate (which contains an inorganic salt, and the purity is 62.7%). To a mixture of 1.9 parts of the sodium difluorosulfoacetate (the purity is 62.7%) obtained and 9.5 parts of N,N-dimethylformamide, 1.0 part of 1,1'-carbonyldiimidazole was added, and the resultant mixture was stirred for two hours. The obtained solution was added to a solution which was obtained by adding 0.2 parts of sodium hydride to a mixture of 1.1 parts of 3-hydroxy-1-adamantylmethanol and 5.5 parts of N,N-dimethylformamide, and stirring the resultant mixture for two hours. The resultant solution was stirred for 15 hours to obtain sodium salt of 3-hydroxy-1-adamantylmethyl difluorosulfoacetate, which was used as it was for the subsequent reaction.

To a obtained solution of the sodium salt of 3-hydroxy-1-adamantylmethyl difluorosulfoacetate, 17.2 parts of chloroform, and 2.9 parts of a 14.8 mass % aqueous triphenyl sulfonium chloride solution were added, and the mixture was stirred for 15 hours, and then an organic layer was separated from the resultant solution, and an aqueous layer was subjected to extraction with 6.5 parts of chloroform. Organic layers were combined and washed with an ion-exchanged water, and the obtained organic layer was concentrated. To the concentrated solution, 5.0 parts of tert-butyl methyl ether was added, and the resultant mixture was stirred and filtered to obtain, as a white solid, 0.2 parts of triphenylsulfonium 1-((3-hydroxy-1-adamantyl)methoxycarbonyl)difluoromethane sulfonate (B1-2).

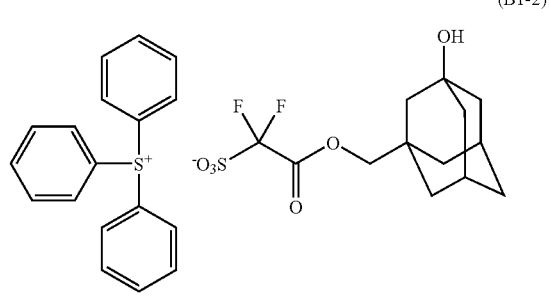

(B1-2)

3. Examples and Comparative Example

Each component indicated in Table 2 was mixed, dissolved, and filtered through a fluorine resin filter having a pore diameter of 0.2 μm, to prepare a liquid resist composition.

TABLE 2

| | Formulation | | | | | | | | |
|---|---|---|---|---|---|---|---|---|---|
| | Resin (A) | | | | Acid-generator (B) | | Nitrogen-containing basic compound (C) | | |
| | Copolymer (A1) | | Copolymer (A2) | | | | | | |
| | Kind | Amount | Kind | Amount | Kind | Amount | Kind | Amount | $T_{PB}$ | $T_{PEB}$ |
| Reference Example 1 | A-1 | 10 parts | | | B1 | 0.50 parts | C1 | 0.07 parts | 95° C. | 85° C. |
| Reference Example 2 | A-2 | 10 parts | | | B1 | 0.50 parts | C1 | 0.07 parts | 95° C. | 85° C. |
| Reference Example 3 | A-5 | 10 parts | | | B1 | 0.50 parts | C1 | 0.07 parts | 95° C. | 85° C. |

TABLE 2-continued

| | Formulation | | | | | | | | | |
|---|---|---|---|---|---|---|---|---|---|---|
| | Resin (A) | | | | Acid-generator (B) | | Nitrogen-containing basic compound (C) | | | |
| | Copolymer (A1) | | Copolymer (A2) | | | | | | | |
| | Kind | Amount | Kind | Amount | Kind | Amount | Kind | Amount | $T_{PB}$ | $T_{PEB}$ |
| Example 4 | A-1 | 7 parts | A-3 | 3 parts | B1 | 0.50 parts | C1 | 0.07 parts | 95° C. | 85° C. |
| Example 5 | A-1 | 8 parts | A-4 | 2 parts | B1 | 0.50 parts | C1 | 0.07 parts | 95° C. | 85° C. |
| Reference Example 6 | A-7 | 10 parts | | | B1 | 0.50 parts | C1 | 0.07 parts | 115° C. | 105° C. |
| Reference Example 7 | A-7 | 10 parts | | | B2 | 0.50 parts | C1 | 0.07 parts | 105° C. | 95° C. |
| Reference Example 8 | A-7 | 10 parts | | | B1/B2 | 0.30/0.20 parts | C1 | 0.07 parts | 105° C. | 95° C. |
| Comparative Example 1 | | | A-6 | 10 parts | B1 | 0.50 parts | C1 | 0.07 parts | 115° C. | 105° C. |

(Note)
Acid generator (B) = B1: Acid generator (B1-2) B2: Triphenylsulfonium nonafluorobutanesulfonate
Nitrogen-containing basic compound (C) = C1: 2,6-diisopropylaniline Solvent (D):
(Detail) Propylene glycol monomethyl ether acetate: 265 parts
2-Heptanone: 20.0 parts
Propylene glycol monomethylether: 20.0 parts
γ-Butyrolactone: 3.5 parts Silicon wafers were each coated with an organic anti-reflective coating composition (ARC-29; manufactured by Nissan Chemical Industries, Ltd.), and were baked under the conditions of 205° C. for 60 seconds, to form an organic anti-reflective coating having a thickness of 780 Å. Subsequently, the photoresist composition was spin-coated over the organic anti-reflective coating such that a dried film had a thickness of 85 nm. The silicon wafers each coated with the photoresist composition were prebaked on a direct hot plate at a temperature shown in a column of $T_{PB}$ in Table 2 for 60 seconds, to form a resist film. Exposure was performed for the silicon wafers each having the resist film formed thereon, by using a mask for forming a contact hole pattern (the hole pitch: 100 nm/the hole diameter: 72 nm), by employing an ArF excimer stepper for immersion exposure (XT:1900Gi manufactured by ASML, NA=1.35), with the exposure amount being varied stepwise.

After the exposure, each silicon wafer was subjected to post-exposure-baking on a hotplate at a temperature shown in a column of $T_{PEB}$ in Table 2, for 60 seconds. Subsequently, each silicon wafer was subjected to puddle development for 60 seconds by using a 2.38 mass % aqueous tetramethylammonium hydroxide solution.

The contact hole patterns formed on the silicon wafers through the development were observed by using a scanning electron microscope, to evaluate the CD uniformity and focus margin under the conditions described below. The results are indicated in Table 3. In each resist film, the exposure amount for forming holes having a diameter of 55 nm on a pattern was regarded as an effective sensitivity in a case where the pattern was formed by using a mask having 70 nm hole diameters. The effective sensitivities are also indicated in Table 3.

(1) CD Uniformity (CDU)

A hole diameter of a hole on the pattern which was formed by using a mask having 70 nm hole diameters at the exposure amount of the effective sensitivity was measured 24 times per one hole, and the average was regarded as an average hole diameter of the one hole. The average hole diameter on the pattern which was formed by using the mask having 70 nm hole diameters was measured at 400 positions on the same wafer, and the 400 average hole diameters were used as a population to obtain a standard deviation. The standard deviation ranging from 1.80 nm to 2.00 nm was regarded as a standard (indicated as "S"). When the standard deviation was 1.70 nm or less, the CDU was evaluated as being excellent (indicated as "E"), the standard deviation was greater than 1.70 nm and less than 1.80 nm, the CDU was evaluated as being good (indicated as "G"), and when the standard deviation was greater than 2.00 nm, the CDU was evaluated as being poor (indicated as "P").

(2) Focus margin (DOF)

The focus range in which the hole diameter ranging from 52.2 nm to 57.7 nm was maintained at the exposure amount of the effective sensitivity was regarded as the DOF. The DOF ranging from 0.16 μm to 0.20 μm was evaluated as a standard (indicated as "S"), and the DOF which was 0.24 μm or more was evaluated as being excellent (indicated as "E"), the DOF which was greater than 0.20 μm and less than 0.24 was evaluated as being good (indicated as "G"), and the DOF which was less than 0.16 μm was evaluated as being poor (indicated as "P").

TABLE 3

| | Effective Sensitivity (mJ/cm$^2$) | CDU | DOF |
|---|---|---|---|
| Reference Example 1 | 30 | E (1.62 nm) | G (0.22 um) |
| Reference Example 2 | 36 | E (1.65 nm) | E (0.24 um) |
| Reference Example 3 | 25 | E (1.68 nm) | G (0.22 um) |
| Example 4 | 33 | G (1.72 nm) | E (0.27 um) |
| Example 5 | 33 | G (1.76 nm) | E (0.27 um) |
| Reference Example 6 | 35 | E (1.55 nm) | E (0.24 um) |
| Reference Example 7 | 30 | S (1.89 nm) | S (0.19 um) |
| Reference Example 8 | 33 | S (1.80 nm) | S (0.20 um) |
| Comparative Example 1 | 40 | P (2.65 nm) | P (0.12 um) |

Based on the results as indicated in Tables 2 and 3, the CDU and DOF were evaluated as being excellent, in Examples 1 to 8 in which a copolymer having a Mw ranging from 2500 to 5000 was used.

The photoresist composition according to the present invention provides a resist pattern having an enhanced CD uniformity (CDU) and an increased focus margin (DOF), and is industrially useful. The photoresist composition according to the present invention is applicable to various lithographies (for example, ArF and KrF excimer laser lithographies, an ArF immersion exposure lithography, and an EUV exposure lithography) in which a dry exposure, an immersion exposure, a double imaging and/or the like are used.

This application is based on Japanese Patent application serial no 2009-150360 filed in Japan Patent Office on Jun. 24, in 2009, the contents of which are hereby incorporated by reference.

What is claimed is:

1. A chemically amplified photoresist composition comprising;
   a resin (A), and an acid generator (B), wherein
   the resin (A) contains a copolymer (A1) and an another polymer (A2),
   the copolymer (A1) is obtained by polymerizing at least:
   a (meth)acrylic monomer (a1) having a $C_{5-20}$ alicyclic hydrocarbon group, which becomes soluble in an aqueous alkali solution by the action of an acid;
   a (meth)acrylic monomer (a2) having a hydroxyl group-containing adamantyl group; and
   a (meth)acrylic monomer (a3) having a lactone ring,
   the copolymer (A1) has a weight-average molecular weight of 2,500 or more and 5,000 or less,
   a content of the copolymer (A1) is not less than 50 parts by mass with respect to 100 parts by mass of the resin (A) provided that the content of the copolymer (A1) is less than 100 parts by mass with respect to 100 parts by mass of the resin (A),
   said another polymer (A2) has a weight-average molecular weight of more than 5,000 and 20,000 or less, and
   the acid generator (B) is a salt represented by formula (B1):

[Chemical Formula 3]

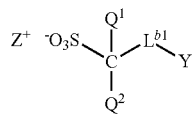

(B1)

wherein $Q^1$ and $Q^2$ each independently represent a fluorine atom or a $C_{1-6}$ perfluoroalkyl group,
$L^{b1}$ represents a single bond, an oxygen atom (—O—), a carbonyl group (—CO—), a linear or branched $C_{1-17}$ alkanediyl group, or a combination of at least two selected from the group consisting of an oxygen atom, a carbonyl group, and a linear or branched $C_{1-17}$ alkanediyl group,
Y is an adamantyl group having a substituent or not, or an oxoadamantyl group having a substituent or not, and
$Z^+$ represents an organic cation.

2. The chemically amplified photoresist composition according to claim 1, wherein the (meth)acrylic monomer (a1) is at least one selected from the group consisting of compounds represented by formulae (a1-1) and (a1-2):

[Chemical Formula 1]

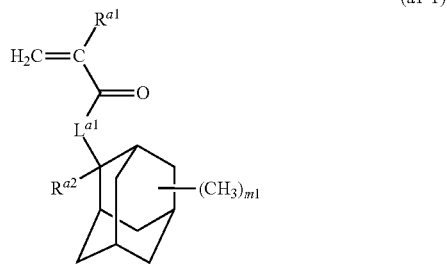

(a1-1)

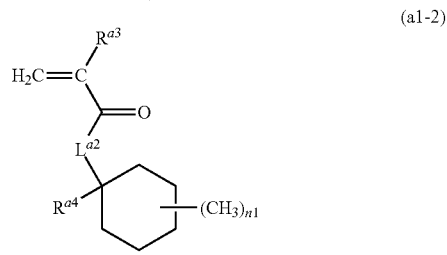

(a1-2)

wherein $L^{a1}$ and $L^{a2}$ each independently represent an oxygen atom (—O—), a carbonyl group (—CO—), a linear or branched $C_{1-17}$ alkanediyl group, or a combination thereof, $R^{a1}$ and $R^{a3}$ each independently represent a hydrogen atom or a methyl group, $R^{a2}$ and $R^{a4}$ each independently represent a linear or branched $C_{1-8}$ aliphatic hydrocarbon group, and a $C_{3-10}$ alicyclic hydrocarbon group, m1 represents an integer ranging from 0 to 14, n1 represents an integer ranging from 0 to 10, and when m1 represents 0, it means that a corresponding methyl group is absent, and when n1 represents 0, it means that a corresponding methyl group is absent.

3. The chemically amplified photoresist composition according to claim 2, wherein the (meth)acrylic monomer (a1) is at least one selected from the group consisting of 2-methyl-2-adamantyl acrylate, 2-methyl-2-adamantyl methacrylate, 2-ethyl-2-adamantyl acrylate, 2-ethyl-2-adamantyl methacrylate, 2-isopropyl-2-adamantyl acrylate, 2-isopropyl-2-adamantyl methacrylate, 1-ethyl-1-cyclohexyl acrylate, and 1-ethyl-1-cyclohexyl methacrylate.

4. The chemically amplified photoresist composition according to claim 1, wherein the (meth)acrylic monomer (a2) is at least one selected from the group consisting of 3-hydroxy-1-adamantyl acrylate, 3-hydroxy-1-adamantyl methacrylate, 3,5-dihydroxy-1-adamantyl acrylate, and 3,5-dihydroxy-1-adamantyl methacrylate.

5. The chemically amplified photoresist composition according to claim 1, wherein the (meth)acrylic monomer (a3) is at least one selected from the group consisting of compounds represented by formulae (a3-1) and (a3-2):

[Chemical Formula 2]

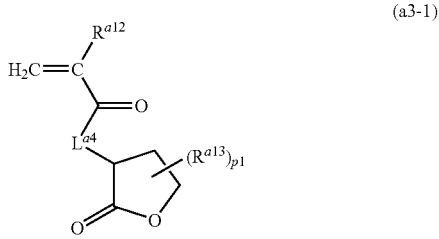

(a3-1)

-continued

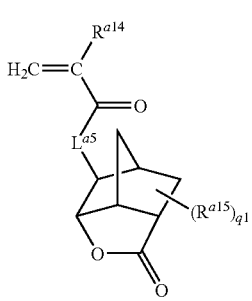

(a3-2)

wherein $L^{a4}$ and $L^{a5}$ each independently represent an oxygen atom (—O—), a carbonyl group (—CO—), a linear or branched $C_{1-17}$ alkanediyl group, or a combination thereof, $R^{a12}$ and $R^{a14}$ each independently represent a hydrogen atom or a methyl group, $R^{a13}$ each independently represents a $C_{1-4}$ aliphatic hydrocarbon group, p1 represents an integer ranging from 0 to 5, $R^{a15}$ each independently represents a carboxyl group, a cyano group, or a $C_{1-4}$ aliphatic hydrocarbon group, q1 represents an integer ranging from 0 to 3, and when p1 represents 0, it means that $R^{a13}$ is absent, and when q1 represents 0, it means that $R^{a15}$ is absent, and when p1 is 2 or more, a plurality of $R^{a13}$ is the same or different from each other, and when q1 is 2 or more, a plurality of $R^{a15}$ is the same or different from each other.

6. The chemically amplified photoresist composition according to claim 1, wherein $Z^+$ is an arylsulfonium cation.

7. The chemically amplified photoresist composition according to claim 1, wherein a content of the acid generator (B) is 1 to 20 parts by mass with respect to 100 parts by mass of the resin (A).

8. The chemically amplified photoresist composition according to claim 1, further comprising a nitrogen-containing basic compound (C).

9. The chemically amplified photoresist composition according to claim 8, wherein the nitrogen-containing basic compound (C) is diisopropylaniline.

10. A method for producing a resist pattern, comprising:
    forming a resist film by applying the chemically amplified photoresist composition according to claim 1 to a substrate;
    pre-baking the resist film;
    exposing the pre-baked resist film;
    subjecting the exposed resist film to a post-exposure-baking; and
    developing the resist film having been subjected to the post-exposure-baking to form a resist pattern, by using an alkaline developer.

11. The method for forming the resist pattern according to claim 10, wherein the exposure is performed through a mask for forming a contact hole.

* * * * *